United States Patent
Kang et al.

(10) Patent No.: US 12,295,253 B2
(45) Date of Patent: May 6, 2025

(54) LIGHT-EMITTING DEVICE AND ELECTRONIC APPARATUS INCLUDING SAME

(71) Applicant: Samsung Display Co., Ltd., Yongin-si (KR)

(72) Inventors: Namsu Kang, Yongin-si (KR); Minho Park, Yongin-si (KR); Dongkyu Lee, Yongin-si (KR); Jongwon Lee, Yongin-si (KR); Hyunshik Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 905 days.

(21) Appl. No.: 17/351,073

(22) Filed: Jun. 17, 2021

(65) Prior Publication Data
US 2021/0408387 A1    Dec. 30, 2021

(30) Foreign Application Priority Data

Jun. 23, 2020    (KR) ......................... 10-2020-0076759

(51) Int. Cl.
*H10K 85/60*    (2023.01)
*H10K 50/11*    (2023.01)
(Continued)

(52) U.S. Cl.
CPC ......... *H10K 85/626* (2023.02); *H10K 85/624* (2023.02); *H10K 85/654* (2023.02);
(Continued)

(58) Field of Classification Search
CPC .. H10K 85/626; H10K 85/633; H10K 85/111; H10K 2101/10; H10K 2101/40;
(Continued)

(56) References Cited

U.S. PATENT DOCUMENTS 7,273,663 B2    9/2007    Liao et al.
7,297,417 B2    11/2007    Kim et al.
(Continued)

FOREIGN PATENT DOCUMENTS

KR    10-2008-0090988 A    10/2008
KR    10-2009-0092112 A    8/2009
(Continued)

OTHER PUBLICATIONS

Gantenbein, Marcus et al., (2015), "New 4,4'-Bis(9-carbazolyl)-Biphenyl Derivatives with Locked Carbazole-Biphenyl Junctions" High-Triplet State Energy Materials, Chemistry of Materials, .27(5), 1772-1779, XP055191916, ISSN:0897-4756, DOI:10.1021/cm5045754 (33 pages).

(Continued)

*Primary Examiner* — Shane Fang
(74) *Attorney, Agent, or Firm* — Womble Bond Dickinson (US) LLP

(57) ABSTRACT

A light-emitting device includes: a first electrode; a second electrode; m emission units between the first electrode and the second electrode; and m−1 charge generation layer(s), each located between two adjacent emission units, and including m−1 n-type charge generation layer(s) and m−1 p-type charge generation layer(s). The m emission units each include a hole transport region, an emission layer, and an electron transport region. A first hole transport region in a first emission unit closest to the first electrode may include a hole transfer layer and a hole injection layer and/or a hole transport layer. The hole transfer layer may be a single layer consisting of an electron-transporting compound including a phosphine oxide group (P=O), a phosphine sulfide group (P=S), a π electron-deficient nitrogen-containing $C_1$-$C_{60}$ cyclic group, or any combination thereof. A highest occu- (Continued)

pied molecular orbital (HOMO) energy level of the hole transfer layer may be about −6.0 eV to about −5.3 eV.

20 Claims, 3 Drawing Sheets

(51) Int. Cl.
  *H10K 50/15* (2023.01)
  *H10K 50/16* (2023.01)
  *H10K 50/17* (2023.01)
  *H10K 50/18* (2023.01)
  *H10K 50/19* (2023.01)
  *H10K 101/10* (2023.01)
  *H10K 101/30* (2023.01)

(52) U.S. Cl.
  CPC ......... *H10K 85/6572* (2023.02); *H10K 50/11* (2023.02); *H10K 50/15* (2023.02); *H10K 50/16* (2023.02); *H10K 50/17* (2023.02); *H10K 50/18* (2023.02); *H10K 50/19* (2023.02); *H10K 2101/10* (2023.02); *H10K 2101/30* (2023.02)

(58) Field of Classification Search
  CPC .. H10K 2101/13; H10K 50/115; H10K 50/16; H10K 50/18; H10K 50/11; H10K 50/171; H10K 50/15; H10K 50/17; H01L 51/0054; H01L 51/0052; H01L 51/0073; H01L 51/0074; H01L 51/5284; H01L 51/42; H01L 51/50; H01L 51/5012; H01L 51/5056; H01L 51/5072; C07C 49/788; C07C 15/24; C07C 15/38
  See application file for complete search history.

(56) References Cited

U.S. PATENT DOCUMENTS

| | | | |
|---|---|---|---|
| 10,096,782 B2 | 10/2018 | Yoo et al. | |
| 10,256,439 B2 | 4/2019 | Lee et al. | |
| 2008/0246395 A1 | 10/2008 | Nakai et al. | |
| 2009/0212688 A1 | 8/2009 | Song et al. | |
| 2015/0357593 A1 | 12/2015 | Gunji et al. | |
| 2017/0263876 A1 | 9/2017 | Kim et al. | |
| 2017/0294587 A1 | 10/2017 | Kim et al. | |
| 2018/0301629 A1* | 10/2018 | Hatakeyama | ........ H10K 85/322 |

FOREIGN PATENT DOCUMENTS

| | | |
|---|---|---|
| KR | 10-1134412 B1 | 4/2012 |
| KR | 10-2013-0023741 A | 3/2013 |
| KR | 10-2016-0018332 A | 2/2016 |
| KR | 10-2017-0106564 A | 9/2017 |
| KR | 10-2017-0116301 A | 10/2017 |
| WO | WO 2016/111535 A1 | 7/2016 |

OTHER PUBLICATIONS

Kroger, M et al., (2009), "P-type doping of organic wide band gap materials by transition metal oxides: A case-study on Molybdenum trioxide", Organic Electronics, Elsevier, Amsterdam, NL, 10(5), 932-938, XP026235906: ISSN:1566-1199, DOI:10.1016/J.ORGEL. 2009.05.007 (7 pages).

Namdas, Ebinazar et al., (2005), "Simple color tuning of phosphorescent dendrimer light emitting diodes", Applied Physics Letters, AIP Publishing LLC, US, 86(16), 161104-161104, XP012065079, ISSN:0003-6951, DOI:10.1063/1.1899256 (4 pages).

Park, Jung-Hwan et al., (2011), "New Bipolar Green Host Materials Containing Benzimidazloe-Carbazole Moiety in Phosphorescent OLEDs", Bulletin of the Korean Chemical Society, 32(3), 841-846, XP055191890, ISSN:0253-2964, DOI:10.5012/bkcs. 2011.32.3. 841 (6 pages).

Zhang, Ting et al., (2013), "A CBP derivative as bipolar host for performance enhancement in phosphorescent organic light-emitting diodes", Journal of Materials Cheminstry C, 1(4), 757-764, XP055191881, ISSN:2050-7526, DOI: 10.1039/C2TC00305H (8 pages).

* cited by examiner

LIGHT-EMITTING DEVICE AND ELECTRONIC APPARATUS INCLUDING SAME

CROSS-REFERENCE TO RELATED APPLICATION

This application claims priority to and the benefit of Korean Patent Application No. 10-2020-0076759, filed on Jun. 23, 2020, in the Korean Intellectual Property Office, the entire content of which is incorporated herein by reference.

BACKGROUND

1. Field

One or more aspects of embodiments of the present disclosure relate to a light-emitting device and an electronic apparatus including the light-emitting device.

2. Description of Related Art

Light-emitting devices (LEDs) are self-emissive devices, which may have wide viewing angles, high contrast ratios, short response times, and/or excellent brightness, driving voltage, and/or response speed characteristics, and may produce full-color images.

An example light-emitting devices includes a first electrode on a substrate, and a hole transport region, an emission layer, an electron transport region, and a second electrode sequentially stacked on the first electrode. Holes provided from the first electrode may move toward the emission layer through the hole transport region, and electrons provided from the second electrode may move toward the emission layer through the electron transport region. Carriers (such as the holes and the electrons) may recombine in the emission layer to produce excitons. These excitons may transition from an excited state to the ground state to thereby generate light.

SUMMARY

One or more aspects of embodiments of the present disclosure are directed toward a light-emitting device having high efficiency, with improved hole injectability (e.g., injection characteristics) from a hole transport region to an emission layer.

Additional aspects will be set forth in part in the description that follows and, in part, will be apparent from the description, or may be learned by practice of the presented embodiments of the disclosure.

One or more example embodiments of the present disclosure provide a light-emitting device including a first electrode;
  a second electrode facing the first electrode;
  m emission units located between the first electrode and the second electrode; and
  m−1 charge generation layer(s), each located between two adjacent emission units among (e.g., selected from) the m emission units, and including m−1 n-type charge generation layer(s) and m−1 p-type charge generation layer(s),
  wherein m may be an integer of 2 or greater,
  the m emission units may each include a hole transport region, an emission layer, and an electron transport region, which are sequentially arranged,
  a first hole transport region, which is in a first emission unit closest among the m emission units to the first electrode, may include a hole transfer layer and at least one of a hole injection layer or a hole transport layer, which are sequentially arranged between the first electrode and a first emission layer in the first emission unit,
  the hole transfer layer may be a single layer including (e.g., consisting of) an electron-transporting compound,
  the electron-transporting compound may include a phosphine oxide group (P=O), a phosphine sulfide group (P=S), a $\pi$ electron-deficient nitrogen-containing $C_1$-$C_{60}$ cyclic group, or any combination thereof, and
  a highest occupied molecular orbital (HOMO) energy level of the hole transfer layer may be about −6.0 electron volts (eV) to about −5.3 eV.

One or more example embodiments of the present disclosure provide an electronic apparatus including the light-emitting device.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
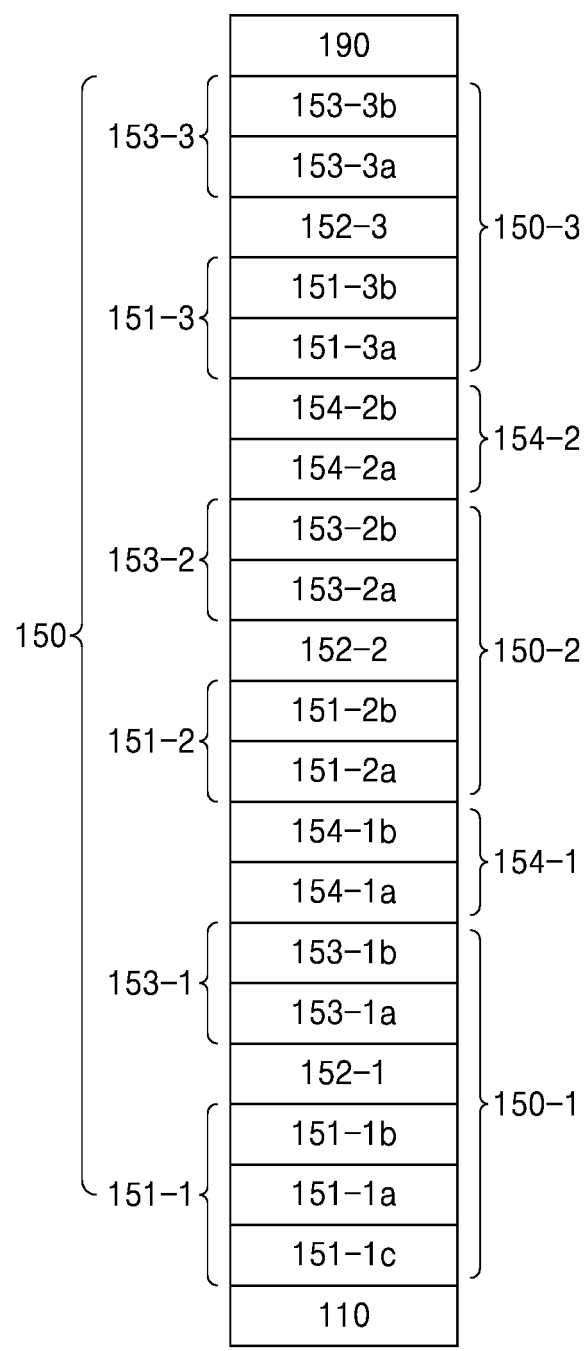
FIG. 1 is a schematic cross-sectional view of a light-emitting device according to an embodiment.

Reference will now be made in detail to embodiments, examples of which are illustrated in the accompanying drawings, wherein like reference numerals refer to like elements throughout, and duplicative descriptions thereof may not be provided. In this regard, the present embodiments may have different forms and should not be construed as being limited to the descriptions set forth herein. Accordingly, the embodiments are merely described below, by referring to the drawings, to explain aspects of the present description. As used herein, the term "and/or" includes any and all combinations of one or more of the associated listed items. Throughout the disclosure, the expression "at least one of a, b or c" may indicate only a, only b, only c, both a and b, both a and c, both b and c, all of a, b, and c, or variations thereof.

As used herein, the singular forms "a," "an," and "the" are intended to include the plural forms as well, unless the context clearly indicates otherwise. It will be further understood that the terms "includes," "including," "comprises," and/or "comprising," when used in this specification, specify the presence of stated features, steps, operations, elements, and/or components, but do not preclude the presence or addition of one or more other features, steps, operations, elements, components, and/or groups thereof. Further, the use of "may" when describing embodiments of the present disclosure refers to "one or more embodiments of the present disclosure".

According to one or more embodiments, a light-emitting device may include: a first electrode; a second electrode facing the first electrode; m emission units located between the first electrode and the second electrode; and m−1 charge generation layer(s), each located between two adjacent emission units among (e.g., selected from) the m emission units (e.g., interpolated between the m emission units), and (collectively) including m−1 n-type charge generation layer(s) and m−1 p-type charge generation layer(s), where m may be an integer of 2 or greater; the m emission units may each include a hole transport region, an emission layer, and an electron transport region, which are sequentially arranged; a first hole transport region included in a first emission unit closest among the m emission units to the first electrode may include a hole transfer layer and a hole injection layer or a hole transport layer, which are sequentially arranged between the first electrode and a first emission layer in the first emission unit; the hole transfer layer may be a single layer including (e.g., consisting of) an electron-transporting compound; the electron-transporting compound may include a phosphine oxide group (P=O), a phosphine sulfide group (P=S), a π electron-deficient nitrogen-containing $C_1$-$C_{60}$ cyclic group, or any combination thereof, and a highest occupied molecular orbital (HOMO) energy level of the hole transfer layer may be about −6.0 electron volts (eV) to about −5.3 eV.

In the present specification, the lowest unoccupied molecular orbital (LUMO) energy level, the highest occupied molecular orbital (HOMO) energy level, triplet energy level, and work function may each be measured as described herein, but embodiments are not limited thereto.

The LUMO energy level, the highest occupied molecular orbital (HOMO) energy level, triplet energy level, work function may be measured using cyclic voltammetry (CV), and an example cyclic voltammetry apparatus (e.g., potentiostat) is ZIVE SP2 available from Wonatech. The sample solutions and electrolyte solutions used in the measurements are as follows; ferrocene is used as a reference material, and $(Bu)_4NPF_6$ is used as an electrolyte:

The sample solution of a compound to be measured: $5×10^{−3}$ M in dichloromethane solution.

The ferrocene sample solution: $5×10^{−3}$ M in dichloromethane solution.

The $(Bu)_4NPF_6$ electrolyte solution: 0.1 M acetonitrile solution.

In order to measure and calculate the HOMO of each compound, a $E_{we}$-I relationship graph (voltammogram) of the compound is plotted and compared to that for the reference material(e.g., ferrocene). A tangent line is drawn at a point where the current rapidly increases in the graph, and the voltage at the point where each tangent line meets (intersects or crosses) the x-axis is recorded as the unreferenced HOMO. The HOMO energy level of ferrocene is set as −4.8 eV, and the HOMO energy level of the compound is calculated with respect to the ferrocene reference.

In some embodiments, m may be 3 or greater.

FIG. 1 is a schematic view of a light-emitting device 10 according to an embodiment. As shown in FIG. 1, a light-emitting device 10 according to an embodiment may include a first electrode 110; a second electrode 190 facing the first electrode 110; m emission units 150-1, 150-2, and 150-3 (collectively 150) stacked between the first electrode 110 and the second electrode 190; and m−1 charge generation layer(s) 154-1 and 154-2 located between two adjacent emission units among the m emission units 150-1, 150-2, and 150-3 and including n-type charge generation layer(s) 154-1a and 154-2a and p-type charge generation layer(s) 154-1b and 154-2b.

The "emission unit" is not particularly limited, as long as the emission unit is capable of emission. In some embodiments, the emission unit may include at least one emission layer. In some embodiments, the emission unit may further include an organic layer in addition to an emission layer.

As shown in the example of FIG. 1, the light-emitting device 10 may include m emission units 150-1, 150-2, and 150-3, and m may be an integer of 2 or greater, for example, 3 or greater. m, which denotes the number of the emission units, may be selected as desired, and the upper limit of the number of the emission units is not particularly limited. In some embodiments, the light-emitting device may include 2, 3, 4, 5, or 6 emission units.

The light-emitting device 10 may include the charge generation layer(s) 154-1 and 154-2 located between two adjacent emission units among the m emission units 150-1, 150-2, and 150-3. Here, the term "adjacent" refers to an arrangement (e.g., spatial) relationship of layers located to be closest to each other among the layers. In some embodiments, the term "two adjacent emission units" refers to the two emission units disposed (arranged) to be closest to each other from among a plurality of emission units. The term "adjacent" may in some embodiments refer to two layers that physically contact each other in some cases, or in some embodiments another layer may be located between the two layers. In some embodiments, an emission unit adjacent to a second electrode may refer to an emission unit closest to the second electrode from among a plurality of emission units. In addition, the second electrode may physically contact the (adjacent) emission unit, or additional layers (e.g., other than emission units) may be disposed between the second electrode and the emission unit. In some embodiments, an electron transport layer may be located between the second electrode and the (adjacent) emission unit. In contrast, a charge generation layer may be located between two adjacent emission units.

The charge generation layer may serve as a cathode for an emission unit of two adjacent emission units (e.g., one of the two adjacent emission units) by generating electrons, and as an anode for the rest emission unit (e.g., for the other of the two adjacent emission units) by generating holes. The charge generation layer may serve to separate adjacent emission units while not being directly connected to an electrode. A light-emitting device including m emission units may include m−1 charge generation layer(s).

The charge generation layer(s) 154-1 and 154-2 may each include the n-type charge generation layer(s) 154-1a and 154-2a and the p-type charge generation layer(s) 154-1b and 154-2b, respectively. Here, the n-type charge generation layer(s) 154-1a and 154-2a and the p-type charge generation layer(s) 154-1b and 154-2b may directly contact each other to form an pn junction. Due to the pn junction, electrons and holes may be simultaneously (e.g., concurrently) generated between the n-type charge generation layer(s) 154-1a and 154-2a and the p-type charge generation layer(s) 154-1b and 154-2b. The generated electrons may be transferred to one of two respective adjacent emission units through the n-type charge generation layer(s) 154-1a and 154-2a. The generated holes may be transferred the other of the two respective adjacent emission units through the p-type charge generation layer(s) 154-1b and 154-2b. In addition, the charge generation layer(s) 154-1 and 154-2 may each include one n-type charge generation layer 154-1a and 154-2a and one p-type charge generation layer(s) 154-1b and 154-2b, and the light-emitting device 10 including the m−1 charge generation layer(s) 154-1 and 154-2 may include the m−1 n-type charge generation layer(s) 154-1a and 154-2a and the m−1 p-type charge generation layer(s) 154-1b and 154-2b.

The term "n-type" refers to n-type semiconductor properties, e.g., properties capable of electron injection and/or transport. The term "p-type" refers to p-type semiconductor properties, e.g., properties capable of hole injection and/or transport.

The m emission units 150-1, 150-2, and 150-3 may each include a hole transport region 151-1, 151-2, and 151-3, an emission layer 152-1, 152-2, and 152-3, and an electron transport region 153-1, 153-2, and 153-3, respectively, in this stated order, and the m electron transport regions 153-1, 153-2, and 153-3 included in the m emission units 150-1, 150-2, and 150-3 may each include an electron-transporting material.

Here, the electron-transporting materials included in the m electron transport regions 153-1, 153-2, and 153-3 may be identical to or different from one another.

A first hole transport region 151-1 included in a first emission unit 150-1 that is closest among the m emission units 150-1, 150-2, and 150-3 to the first electrode 110 may include a hole transfer layer 151-1c and at least one of a hole injection layer 151-1a or a hole transport layer 151-1b, which may be sequentially arranged between the first electrode 110 and a first emission layer 152-1 in the first emission unit 150-1.

In some embodiments, the first hole transport region 151-1 may include the hole transfer layer 151-1c, the hole injection layer 151-1a, and the hole transport layer 151-1b, which may be sequentially arranged between the first electrode 110 and the first emission layer 152-1.

The hole transfer layer 151-1c may be a single layer including (e.g., consisting of) an electron-transporting compound, which may include a phosphine oxide group (P=O), a phosphine sulfide group (P=S), a π electron-deficient nitrogen-containing $C_1$-$C_{60}$ cyclic group, or any combination thereof, and a HOMO energy level of the hole transfer layer 151-1c may be about −6.0 eV to about −5.3 eV.

In some embodiments, the electron-transporting compound may be represented by Formula 1 or Formula 2:

  Formula 1

  Formula 2 wherein, in Formulae 1 and 2, $Ar_1$, $Ar_2$, $L_1$, and $L_2$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, a1 and a2 may each independently be 1, 2, or 3, b1 and b2 may each independently be 0, 1, 2, 3, 4, or 5, $R_1$ and $R_2$ may each independently be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, $-Si(Q_1)(Q_2)(Q_3)$, $-C(=O)(Q_1)$, $-S(=O)_2(Q_1)$, $-P(=O)(Q_1)(Q_2)$, or $-P(=S)(Q_1)(Q_2)$, wherein $Q_1$ to $Q_3$ may each independently be hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium —F, a cyano group, a $C_1$-$C_{60}$ alkyl group, a $C_1$-$C_{60}$ alkoxy group, a phenyl group, a biphenyl group, or any combination thereof, and c1 and c2 may each independently be 1, 2, 3, 4, or 5, at least one of $Ar_1$, $L_1$, or $R_1$ may each independently be a π electron-deficient nitrogen-containing $C_1$-$C_{60}$ cyclic group unsubstituted or substituted with at least one $R_{10a}$, and at least one $R_2$ group may be $-P(=O)(Q_1)(Q_2)$ or $-P(=S)(Q_1)(Q_2)$.

$R_{10a}$, a $C_3$-$C_{60}$ carbocyclic group, a $C_1$-$C_{60}$ heterocyclic group, and a π electron-deficient nitrogen-containing $C_1$-$C_{60}$ cyclic group may each be the same as described in the "General definitions of terms".

In some embodiments, at least one of $Ar_1$, $L_1$, or $R_1$ may each independently be selected from: a pyridine group, a pyrimidine group, a pyrazine group, a pyridazine group, and a triazine group; and a pyridine group, a pyrimidine group, a pyrazine group, a pyridazine group, and a triazine group, each substituted with at least one $R_{10a}$.

In some embodiments, at least one of $Ar_2$, $L_2$, or $R_2$ may each independently be a π electron-rich $C_3$-$C_{60}$ cyclic group unsubstituted or substituted with at least one $R_{10a}$.

The π electron-rich $C_3$-$C_{60}$ cyclic group may be the same as described in the "General definitions of terms".

In some embodiments, at least one of $Ar_2$, $L_2$, or $R_2$ may each independently be selected from: a benzene group, a naphthalene group, an anthracene group, a carbazole group, and a dibenzofuran group; and a benzene group, a naphthalene group, an anthracene group, a carbazole group, and a dibenzofuran group, each substituted with at least one $R_{10a}$.

The electron-transporting compound included in the hole transfer layer may be selected from Compounds 1 to 54:

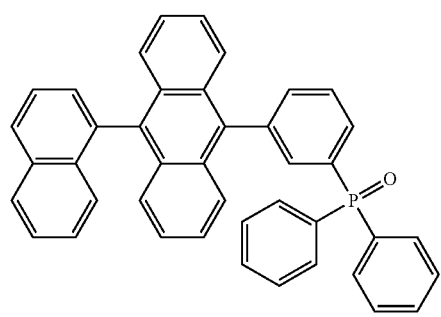

1

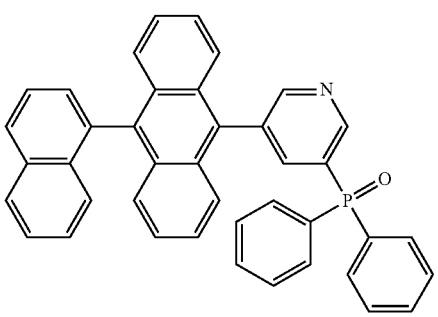

2

3
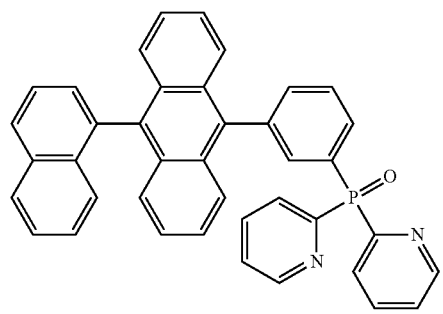
4
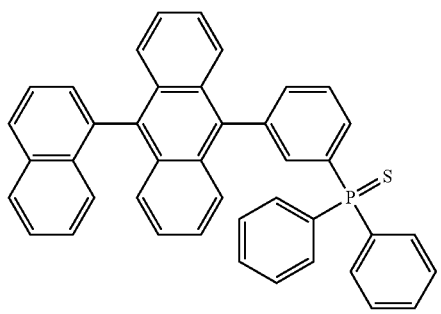
5
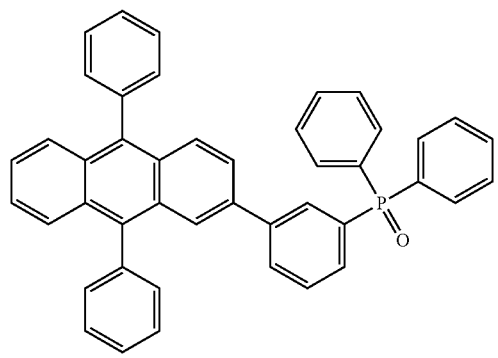
6
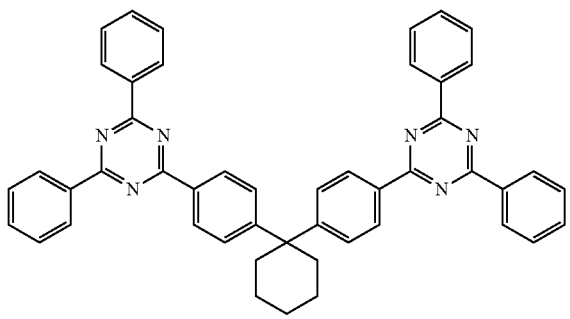
7
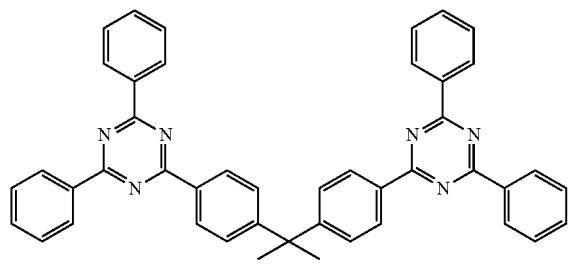
8
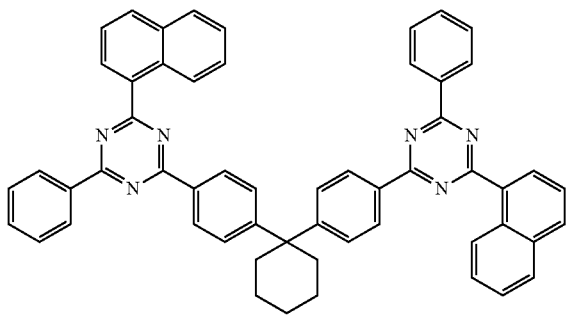
9
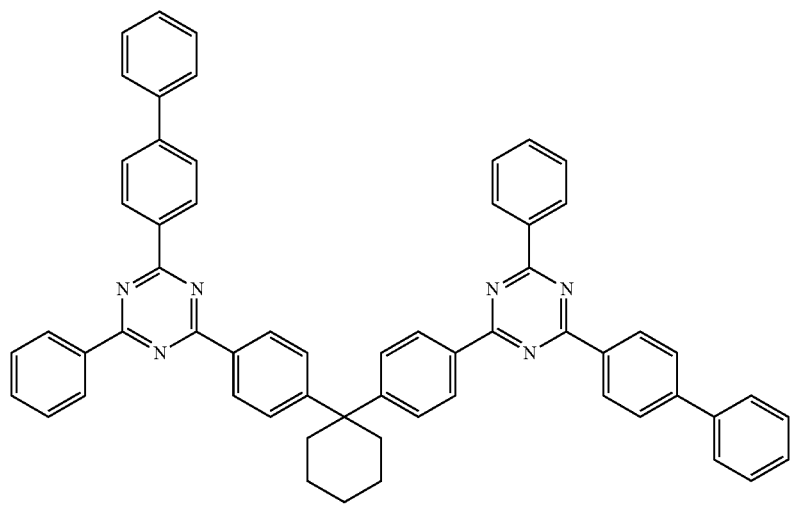

10
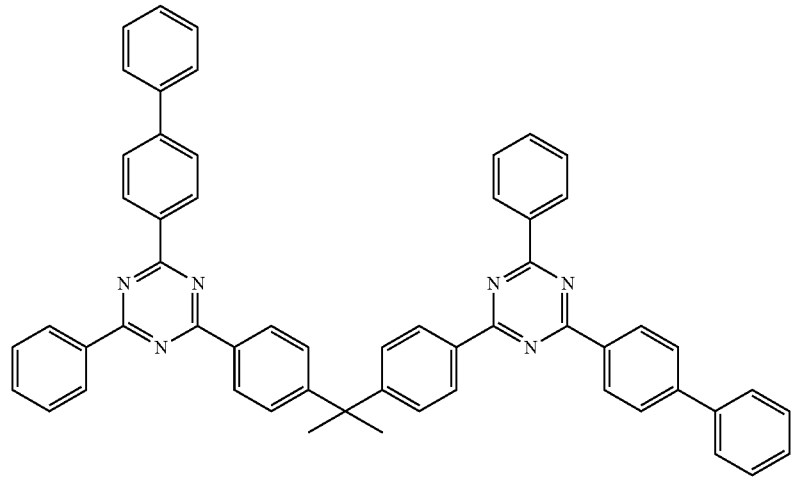
11
12
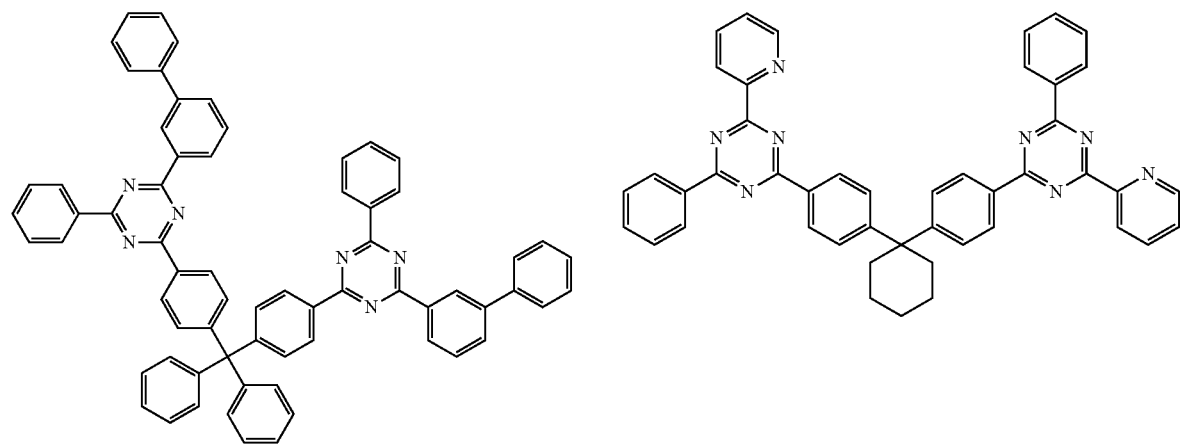
13
14
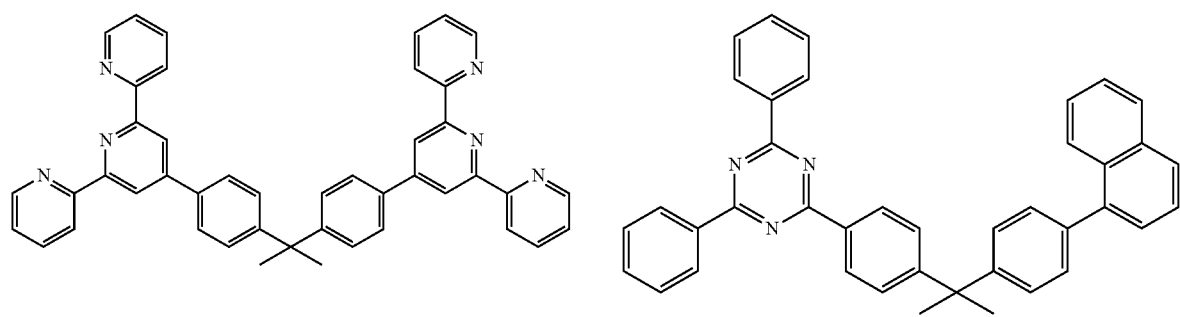
15
16
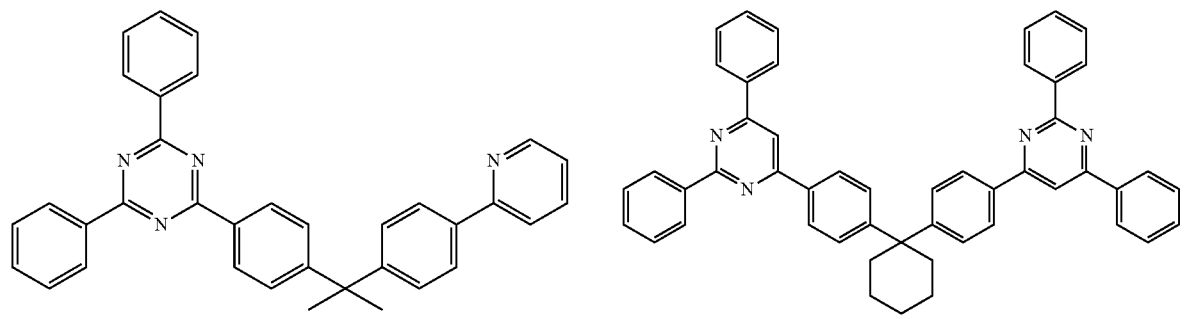

-continued
17
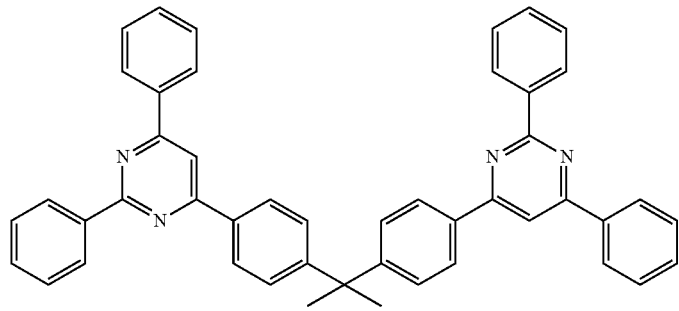
18
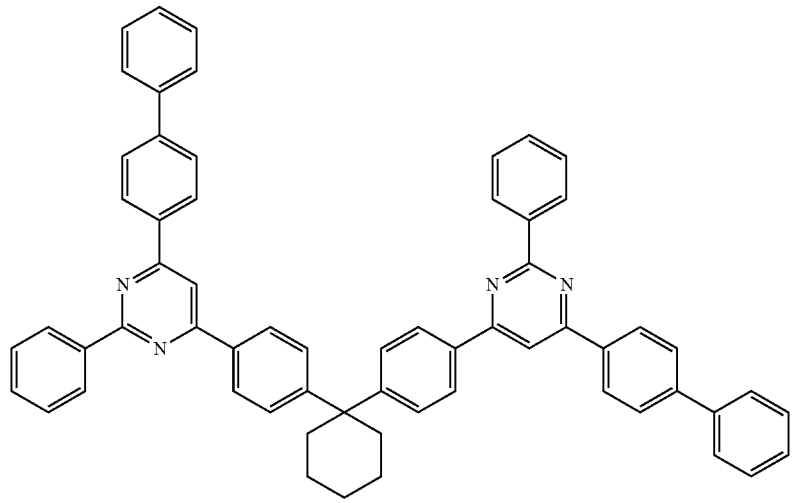
19
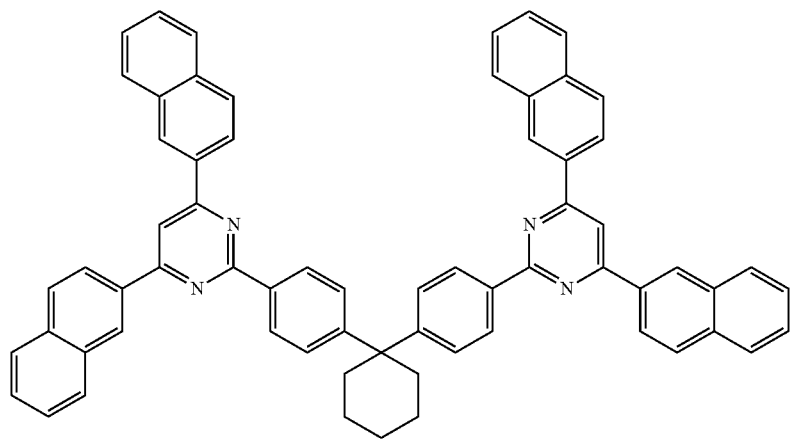
20 21
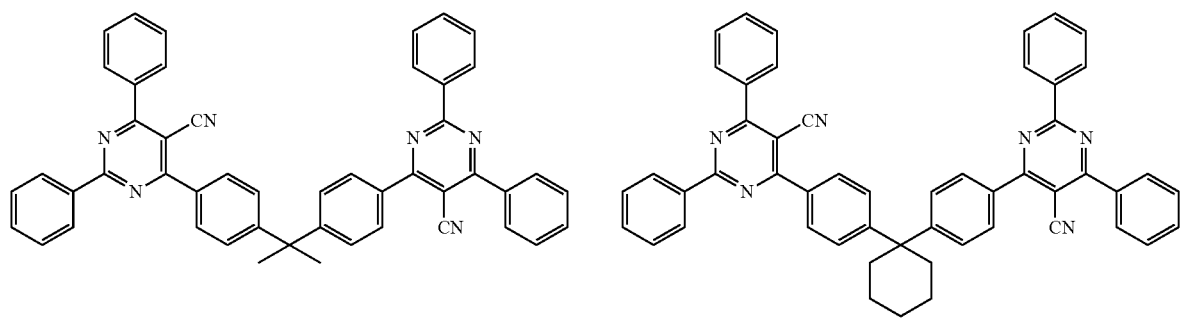

-continued
22
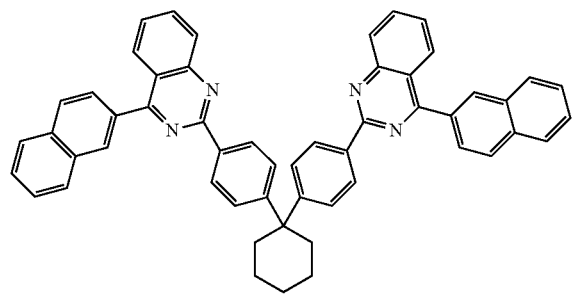
23
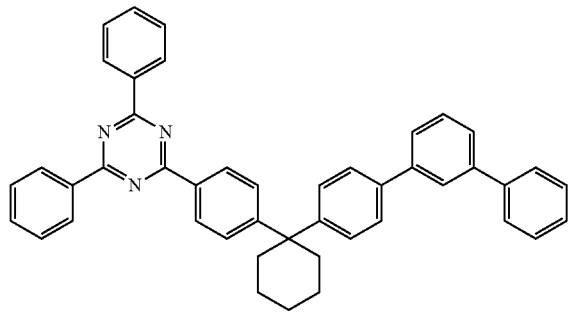
24
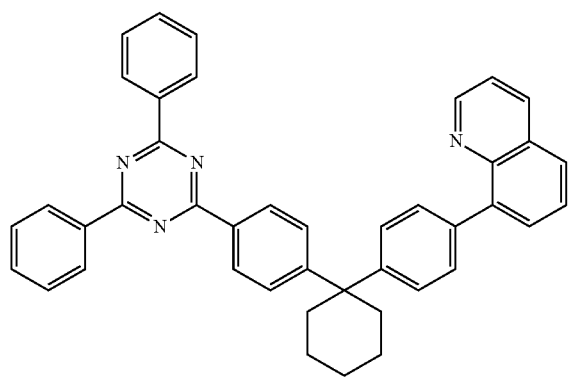
25
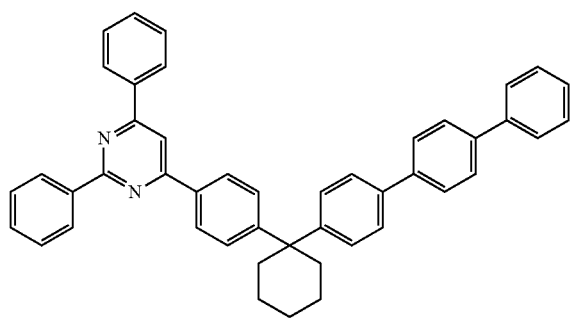
26
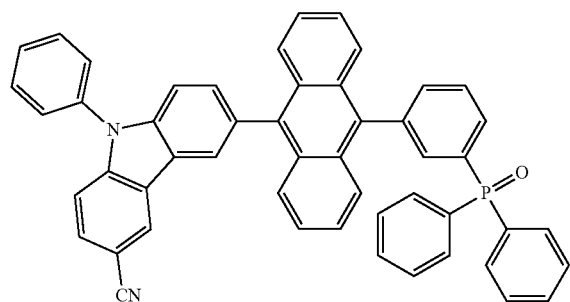
27
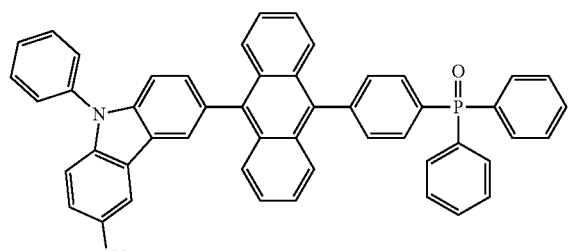
28
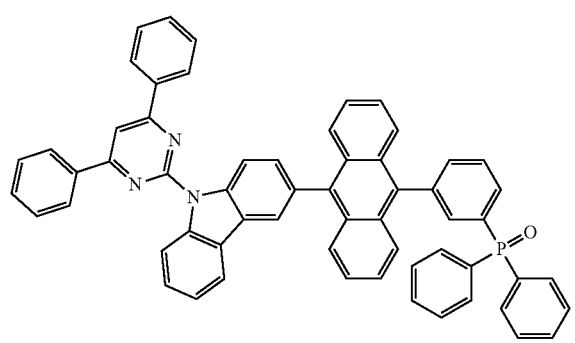
29
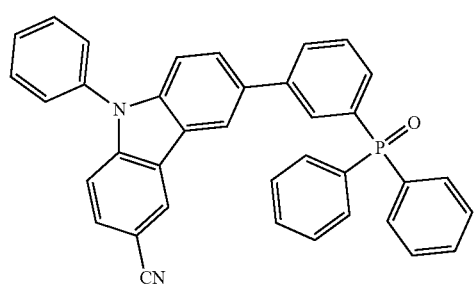

30 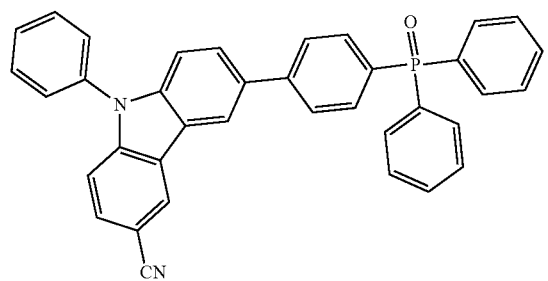
31 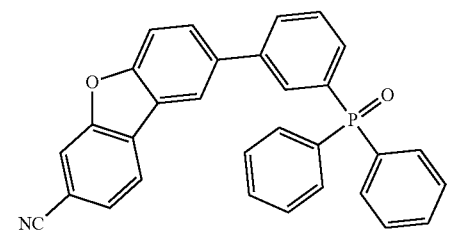
32 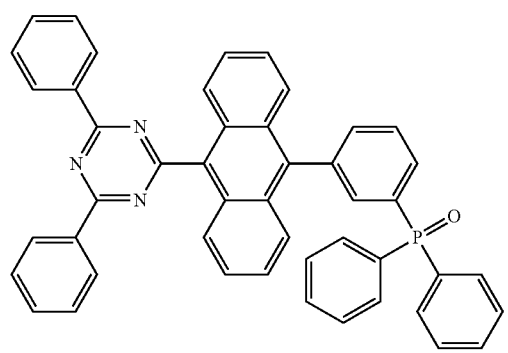
33 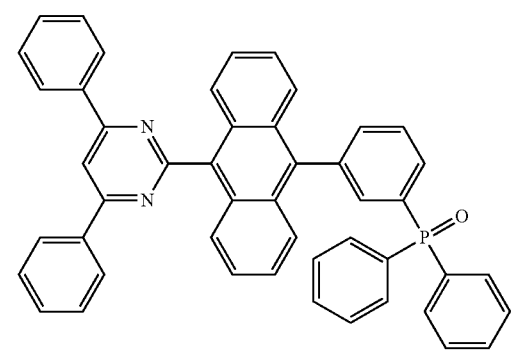
34 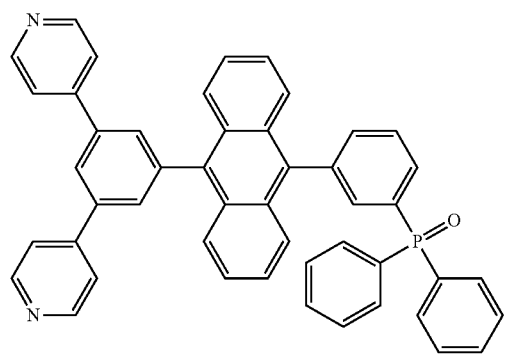
35 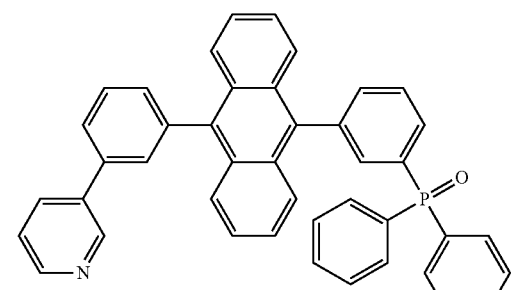
36 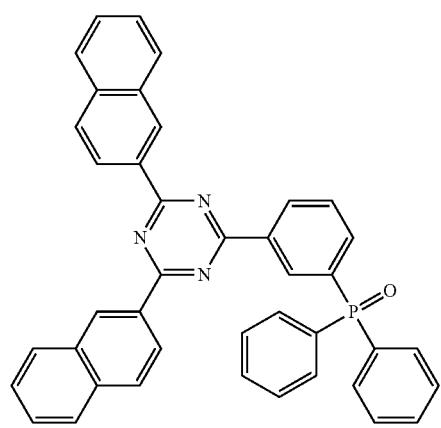
37 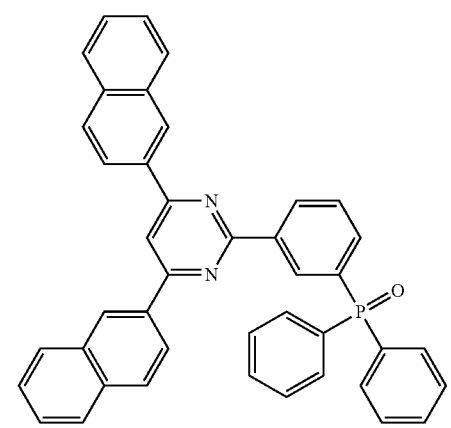

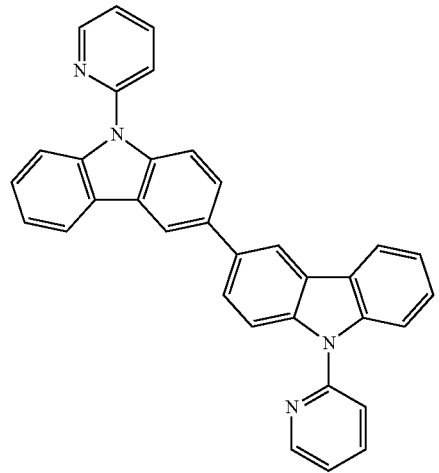
38
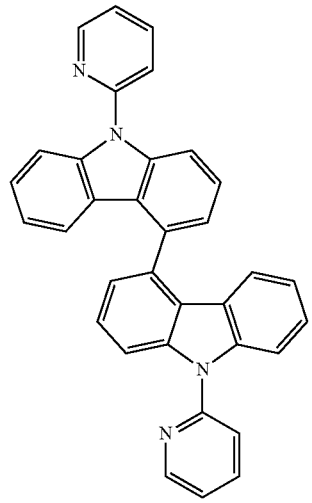
39
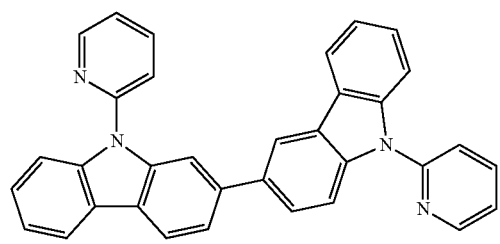
40
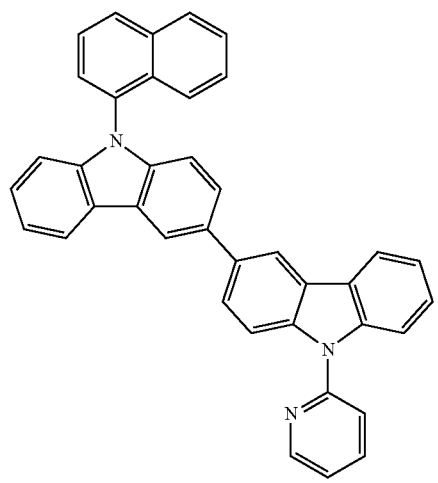
41

42
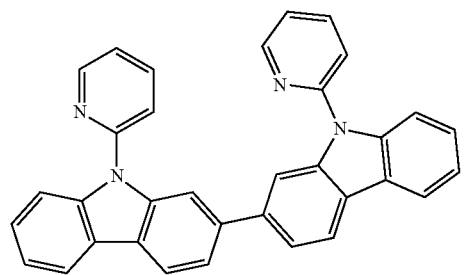
43
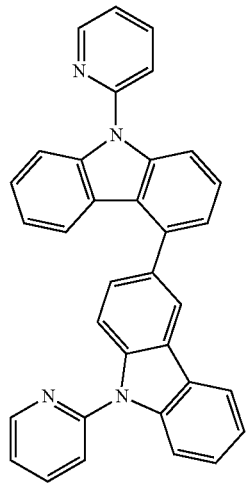
44
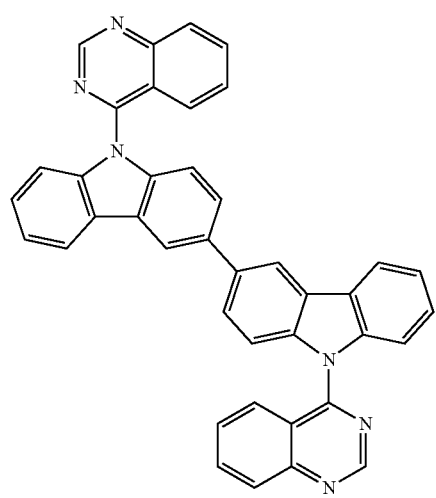
45
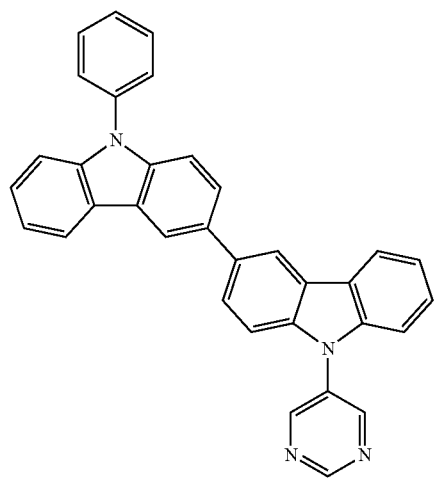

-continued
46
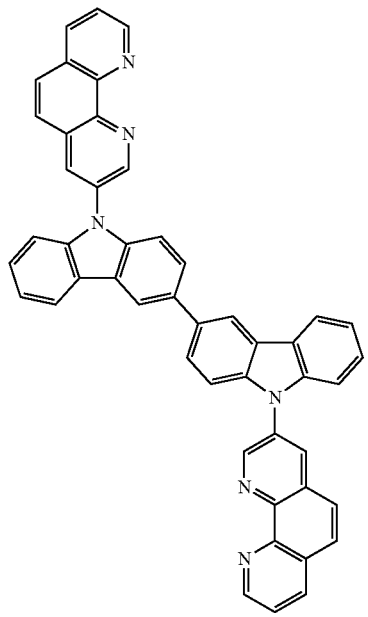
47
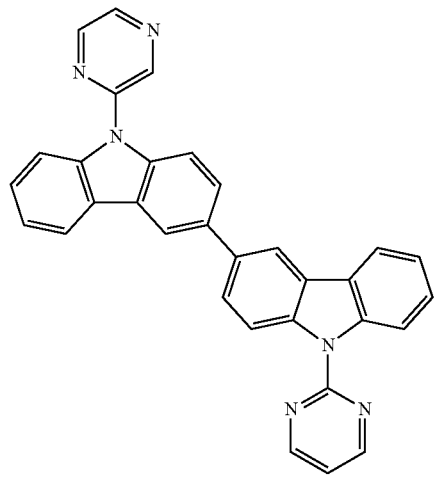
48
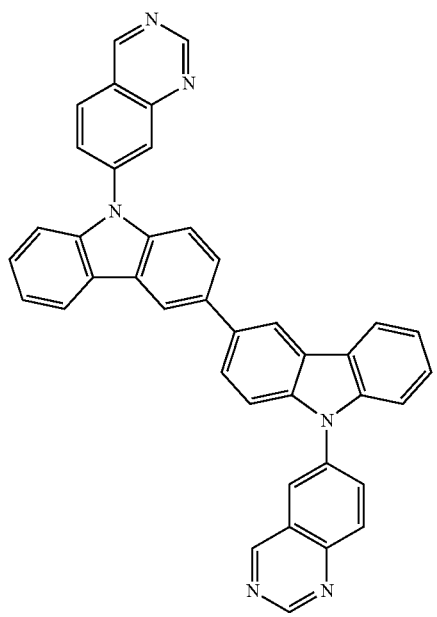
49
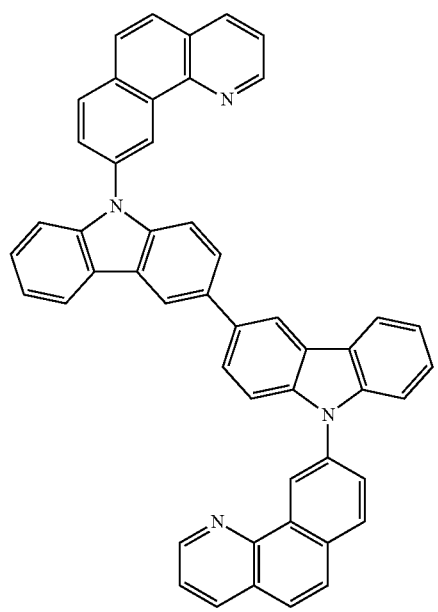

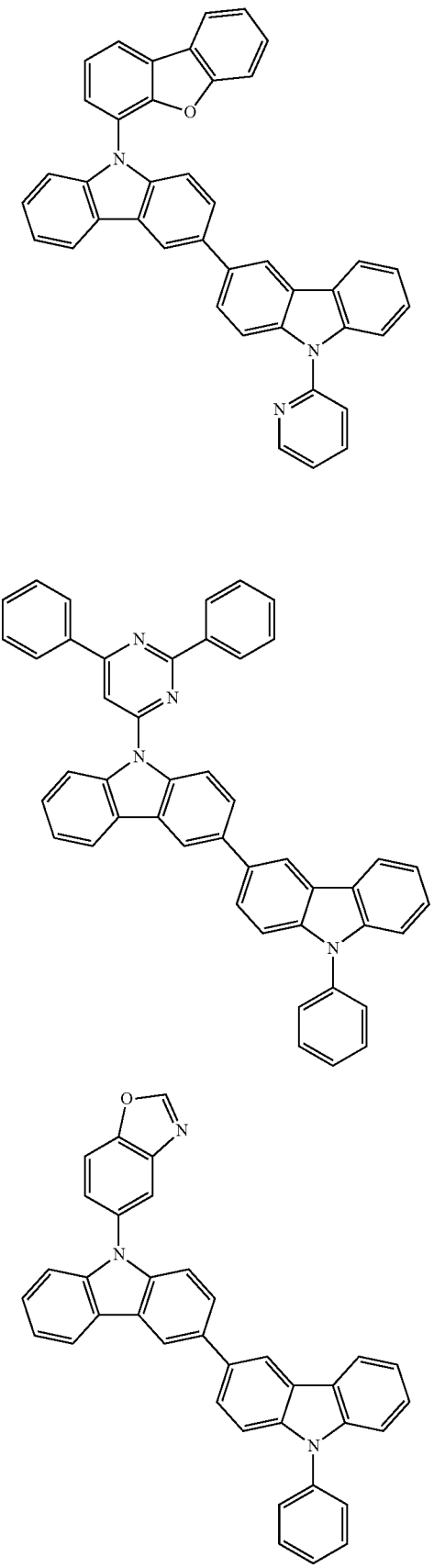
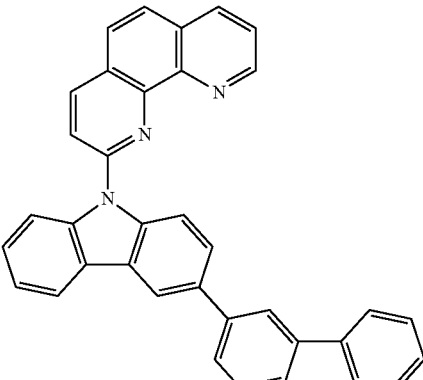
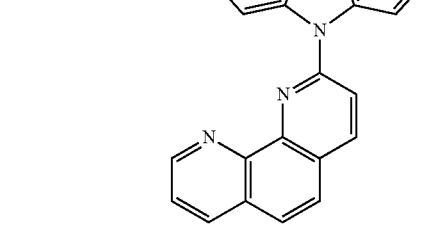
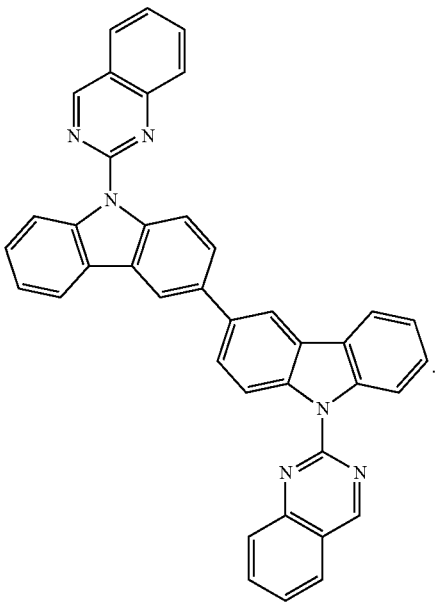

In some embodiments, a difference in the HOMO energy level between the hole transfer layer 151-1c and the hole injection layer 151-1a or the hole transport layer 151-1b adjacent to the hole transfer layer 151-1c, may be 0.15 eV or greater.

In some embodiments, the hole transfer layer 151-1c may be adjacent to the hole injection layer 151-1a, and a difference in the HOMO energy level between the hole transfer layer 151-1c and the hole injection layer 151-1a may be 0.15 eV or greater.

In some embodiments, the hole transfer layer 151-1c may be adjacent to the hole transport layer 151-1a, and a difference in the HOMO energy level between the hole transfer layer 151-1c and the hole transport layer 151-1a may be 0.15 eV or greater.

In some embodiments, the first emission layer 152-1 may include a compound represented by Formula 3:

$$[Ar_3]_{a3}\text{-}[(L_3)_{b3}\text{-}R_3]_{c3},\qquad\text{Formula 3}$$

wherein, in Formula 3, $Ar_3$ and $L_3$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, a3 may be 1, 2, or 3, b3 may be an integer from 0 to 5, $R_3$ may be hydrogen, deuterium, —F, —Cl, —Br, —I, a hydroxyl group, a cyano group, a nitro group, a $C_1$-$C_{50}$ alkyl group unsubstituted or substituted with at least one $R_{10A}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, $Si(Q_1)(Q_2)(Q_3)$, —$N(Q_1)(Q_2)$, —$B(Q_1)(Q_2)$, —$C(=O)_2(Q_1)$, —$S(=O)_2(Q_1)$, or —$P(=O)(Q_1)(Q_2)$, and c3 may be an integer from 1 to 5, wherein $Q_1$ to $Q_3$ may each independently be hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof, and at least one of $Ar_3$, $L_3$, or $R_3$ may independently be a $C_3$-$C_{60}$ carbocyclic group unsubstituted or substituted with at least one $R_{10a}$.

In some embodiments, the first emission layer 152-1 may include the compound represented by Formula 3 as a host.

In some embodiments, the electron-transporting compound and the compound represented by Formula 3 may be identical to or different from each other.

In some embodiments, the first emission unit 150-1 may further include an electron blocking layer located between the hole injection layer 151-1a or the hole transport layer 151-1b and the first emission layer 152-1.

In some embodiments, the electron blocking layer may include a material having a higher triplet energy level than a triplet energy level of a compound included in the first emission layer 152-1.

In some embodiments, the m−1 hole transport region(s) 151-2 and 151-3, excluding the first hole transport region 151-1, may not include the hole transfer layer 151-c.

In some embodiments, the m−1 hole transport region(s) 151-2 and 151-3 excluding the first hole transport region 151-1 may include hole transport layer(s) 151-2b, and 151-3b, hole injection layer(s) 151-2a, and 151-3a, and/or electron blocking layer(s), and the m electron transport regions 153-1, 153-2, and 153-3 may include a hole blocking layer, electron transport layer(s) 153-1a, 153-2a, and 153-3a, and/or electron injection layer (s) 153-1b, 153-2b, and 153-3b.

In the light-emitting device 10, m may be 3 or 4.

In some embodiments, the first electrode 110 may be an anode, and the second electrode 190 may be a cathode.

In some embodiments, maximum emission wavelengths of light emitted from the m emission units 150-1, 150-2, and 150-3 may be identical to one another.

In one or more embodiments, the m emission units 150-1, 150-2, and 150-3 may each be to emit blue light having a maximum emission wavelength of about 440 nm to about 510 nm, based on the front peak wavelength.

In some embodiments, a maximum emission wavelength of light emitted from at least one of the m emission units may differ from that of light emitted from at least one of the other emission units. In some embodiments, in a light-emitting device including a first emission unit and a second emission unit that are stacked, the maximum emission wavelength of light emitted from the first emission unit may differ from that of light emitted from the second emission unit. In this case, an emission layer of the fist emission unit and that of the second emission unit may each independently include i) a single-layered structure including (e.g., consisting of) a single material, ii) a single-layered structure including a plurality of different materials, or iii) a multi-layered structure having a plurality of layers that include a plurality of different materials. Accordingly, light emitted from the first emission unit or the second emission unit may be single color light or mixed color light. In some embodiments, in a light-emitting device including a first emission unit, a second emission unit, and a third emission unit that are stacked together, the maximum emission wavelength of light emitted from the first emission unit may be the same as that of light emitted from the second emission unit, and the maximum emission wavelength of light emitted from the first emission unit may differ from that of light emitted from the third emission unit. In some embodiments, the maximum emission wavelength of light emitted from the first emission unit, the maximum emission wavelength of light emitted from the second emission unit, and the maximum emission wavelength of light emitted from the third emission unit may differ from one another.

In some embodiments, the m emission layers 152-1, 152-2, and 152-3 respectively included in the m emission units 150-1, 150-2, and 150-3 may each independently include a phosphorescent dopant, a fluorescent dopant, a delayed fluorescence material, or any combination thereof.

In some embodiments, the m emission layers 152-1, 152-2, and 152-3 may each include a phosphorescent dopant, a fluorescent dopant, or a delayed fluorescence material.

In some embodiments, at least one of the m emission layers 152-1, 152-2, or 152-3 may include a phosphorescent dopant, and the other emission layer(s) may include a fluorescent dopant; at least one of the m emission layers 152-1, 152-2, or 152-3 may include a phosphorescent dopant, and the other emission layer(s) may include a delayed fluorescence material; or at least one of the m emission layers 152-1, 152-2, or 152-3 may include a fluorescent dopant, and the other emission layer(s) may include a delayed fluorescence material.

In some embodiments, at least one of the m emission layers 152-1, 152-2, or 152-3 may include a phosphorescent dopant, at least one of the m emission layers 152-1, 152-2, or 152-3 may include a fluorescent dopant, and the other (e.g., remaining) emission layer may include a delayed fluorescence material.

In some embodiments, a ratio of the delayed fluorescence component to the sum of a fluorescence component and a delayed fluorescence component (e.g., from among all luminescence components extracted from measurement of transient electroluminescence (EL)) of the light-emitting device 10 may be 30 percent (%) or higher.

Here, an apparatus for measuring the delayed fluorescence component is generally referred to as transient EL (hereinafter, "Tr. EL"), and Tr. EL may include an oscilloscope that converts optical or electrical signals, a pulse generator that applies square-wave pulses, a power supply that converts alternating current (AC) voltage to direct current (DC) voltage, a chamber that serves as a darkroom, and a photomultiplier tube (PMT) that detects emitted light.

In Tr. EL, the frequency and the pulse width of the devices are fixed for the measurement under the same condition, and a negative voltage is applied to exclude trapped charges present in the devices, in order to analyze pure delayed fluorescence components. The analyzed signals were collected by a computing device (PC), and damping behavior was modeled and applied. When the measured delayed fluorescence component is fitted to 1/sqrt, a linear decay phenomenon can be identified, and the delayed fluorescence ratio can be extracted from this corresponding fragment. In the case of OLED devices, when the applied pulse is turned off, residual trap charges may remain in the device and may be to emit light through recombination. Thus, the trap charges were excluded from the EL signals, and the remaining section was fitted to 1/sqrt to secure a linear decay time for clearer fitting.

In some embodiments, the first electrode 110 may have a work function of about −5.2 eV to about −4.8 eV.

In some embodiments, the light-emitting device 10 may further include a first capping layer located outside the first electrode 110 and/or a second capping layer located outside the second electrode 190, and
 at least one of the first capping layer or the second capping layer may include a material having a refractive index of 1.6 or higher at a wavelength of 589 nm.

In a device of the related art, a mixed film including a p-dopant and a hole transport material, or a single film including (e.g., consisting of) a p-dopant, may be used in the hole transport region to secure reliability and driving stability.

When holes are injected using the p-dopant, hole injection may be performed using a charge-transfer (C-T) complex effect. The amount of hole injection must be adjusted to increase the amount (e.g., concentration) of excitons generated inside the emission layer, but due to the p-dopant, it may be very difficult to control hole injection characteristics using the C-T complex effect.

In the related art, an excessively small amount (e.g., an insufficient concentration) of holes may be injected when a hole transport material is utilized without a p-dopant, causing the device to be electron-rich and resulting in excess electrons that do not contribute to light emission, which may (negatively) affect the inside of the emission layer and the hole injection layer. Thus, the long-term reliability and/or efficiency of the device may be decreased.

To solve this problem, the light-emitting device according to one or more embodiments of the present disclosure may include a hole transfer layer in the hole transport region in contact with an electrode, wherein the hole transfer layer satisfies conditions described herein and thereby provides improved driving voltage, efficiency, and/or lifespan characteristics.

In general, a material having hole transportability may be introduced into (utilized in) the hole transport region.

In some embodiments, a hole transfer layer including (e.g., consisting of) an electron-transporting compound may be introduced to a space between the first electrode and an adjacent hole injection layer (or an adjacent hole transport layer) in the light-emitting device according to one or more embodiments, thereby improving control of the hole injection field of the device through a tunneling phenomenon and improving control of the hole injection characteristics of the device.

Furthermore, in the light-emitting device according to one or more embodiments, the HOMO energy level of the hole transfer layer may be about −6.0 eV to about −5.3 eV, and the difference in HOMO energy level with respect to an adjacent layer (e.g., the directly adjacent layer) (the hole injection layer or the hole transport layer) may be 0.15 eV or greater. As a result, thermionic emission injection and C-T complex injection may be limited, and hole injection by tunneling may be effectively performed, thereby controlling hole injection characteristics.

In addition, the light-emitting device according to one or more embodiments may include a single hole transfer layer including (e.g., consisting of) the electron-transporting compound in the emission unit adjacent to the anode. Compared with a case where a hole transfer layer is included in an emission unit not adjacent to the anode, tunneling between the inorganic layer (the anode) and the organic layer (the single hole transfer layer) may be effectively generated, and thus, the hole injection characteristics may be controlled.

In addition, an anode of the light-emitting device according to one or more embodiments may include a material having a work function of about −5.2 eV to about −4.8 eV, thereby realizing a sufficient HOMO energy level difference compared to an electron-transporting compound in the adjacent single hole transfer layer. Accordingly, thermionic emission injection and C-T complex injection may be limited, and hole injection by tunneling may be effectively performed, thereby improving control of hole injection characteristics.

According to one or more embodiments, an electronic apparatus may include the light-emitting device.

In some embodiments, a color-coordinate measured at a front viewing angle of the electronic apparatus may be about 0.09 to about 0.15.

In some embodiments, when the front viewing angle of the electronic apparatus is 0 degrees, the color-coordinate measured at a side viewing angle of 30 degrees to 45 degrees from the front viewing angle may be about 0.45 to about 0.06.

In some embodiments, the electronic apparatus may further include: an encapsulation unit located on the light-emitting device; and
 a functional layer on the encapsulation unit, wherein the functional layer may include a touchscreen layer, a polarization layer, a color filter, a color-conversion layer, or any combination thereof.

In some embodiments, quantum dots or an optical member including the quantum dots may be located on at least one traveling direction of light emitted from the light-emitting device.

The term "interlayer" as used herein refers to a single layer and/or a plurality of layers located between a first electrode and a second electrode in a light-emitting device. A material included in the "interlayer" is not limited to being an organic material.

Hereinafter, the structure of the light-emitting device 10 according to an embodiment and a method of manufacturing the light-emitting device 10 according to an embodiment will be described in connection with FIG. 1.

First Electrode 110

In FIG. 1, a substrate may be additionally located under the first electrode 110 and/or above the second electrode 190. The substrate may be a glass substrate and/or a plastic substrate. The substrate may be a flexible substrate including plastic having excellent heat resistance and/or durability, for example, polyimide, polyethylene terephthalate (PET), polycarbonate, polyethylene naphthalate, polyarylate (PAR), polyetherimide, or any combination thereof.

The first electrode 110 may be formed by depositing or sputtering a material for forming the first electrode 110 on the substrate. When the first electrode 110 is an anode, a high work function material that may easily inject holes may be used as the material for the first electrode.

The first electrode 110 may be a reflective electrode, a semi-transmissive electrode, or a transmissive electrode. When the first electrode 110 is a transmissive electrode, the material for forming the first electrode 110 may be indium tin oxide (ITO), indium zinc oxide (IZO), tin oxide ($SnO_2$), zinc oxide (ZnO), or any combinations thereof. In some embodiments, when the first electrode 110 is a semi-transmissive electrode or a reflective electrode, magnesium (Mg), silver (Ag), aluminum (Al), aluminum-lithium (Al—Li), calcium (Ca), magnesium-indium (Mg—In), magnesium-silver (Mg—Ag), or any combination thereof may be used as the material for forming the first electrode 110.

The first electrode 110 may have a single-layered structure, or a multi-layered structure including two or more layers. In some embodiments, the first electrode 110 may have a triple-layered structure of ITO/Ag/ITO.

Interlayer 150

The interlayer 150 may be on the first electrode 110. The interlayer 150 may include an emission layer.

The interlayer 150 may further include a hole transport region between the first electrode 110 and the emission layer and an electron transport region between the emission layer and the second electrode 190.

The interlayer 150 may further include metal-containing compounds (such as organometallic compounds), inorganic materials (such as quantum dots), and/or the like, in addition to various organic materials.

As described above, the interlayer 150 may include: i) at least two emitting units sequentially stacked between the first electrode 110 and the second electrode 190; and ii) a charge-generation layer located between the at least two emitting units. When the interlayer 150 includes the at least two emitting units and the charge generation layer, the light-emitting device 10 may be a tandem light-emitting device.

Hole Transport Regions 151-1, 151-2, and 151-3 in Interlayer 150

The hole transport regions 151-1, 151-2, and 151-3 may each have i) a single-layered structure including (e.g., consisting of) a single material, ii) a single-layered structure including a plurality of different materials, or iii) a multi-layered structure having a plurality of layers including a plurality of different materials.

In some embodiments, the first hole transport region 151-1 may have the above-described layered structure (e.g., including the single hole transfer layer including or consisting of the electron-transporting compound).

The hole transport regions 151-2 and 151-3 excluding the first hole transport region 151-1 may include a hole injection layer 151-2b and 151-3b, respectively, a hole transport layer 151-2a and 151-3a, respectively, an emission auxiliary layer, and/or an electron blocking layer.

For example, the first hole transport region 151-1 may have a multi-layered structure, e.g., a hole transfer layer/hole injection layer/hole transport layer structure, a hole transfer layer/hole injection layer/hole transport layer/emission auxiliary layer structure, a hole transfer layer/hole injection layer/emission auxiliary layer structure, a hole transfer layer/hole transport layer/emission auxiliary layer structure, or a hole transfer layer/hole injection layer/hole transport layer/electron blocking layer structure, wherein layers of each structure are sequentially stacked on the first electrode 110 in each stated order.

For example, the hole transport regions 151-2 and 151-3 may each have a multi-layered structure, e.g., a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein layers of each structure are sequentially stacked in each stated order.

The hole transport regions 151-1, 151-2, and 151-3 may each independently include a compound represented by Formula 201, a compound represented by Formula 202, or any combination thereof:

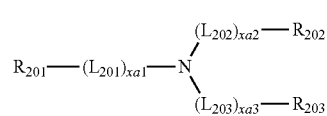

Formula 201

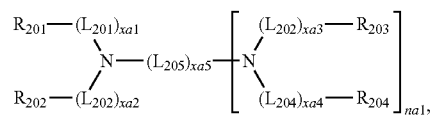

Formula 202 wherein, in Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be bound to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$ to form a $C_8$-$C_{60}$ polycyclic group (e.g., a carbazole group and/or the like) unsubstituted or substituted with at least one $R_{10a}$ (e.g., Compound HT16 described herein), $R_{203}$ and $R_{204}$ may optionally be bound to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$ to form a $C_8$-$C_{60}$ polycyclic group unsubstituted or substituted with at least one $R_{10a}$, and na1 may be an integer from 1 to 4.

In some embodiments, Formulae 201 and 202 may each include at least one group represented by Formulae CY201 to CY217:

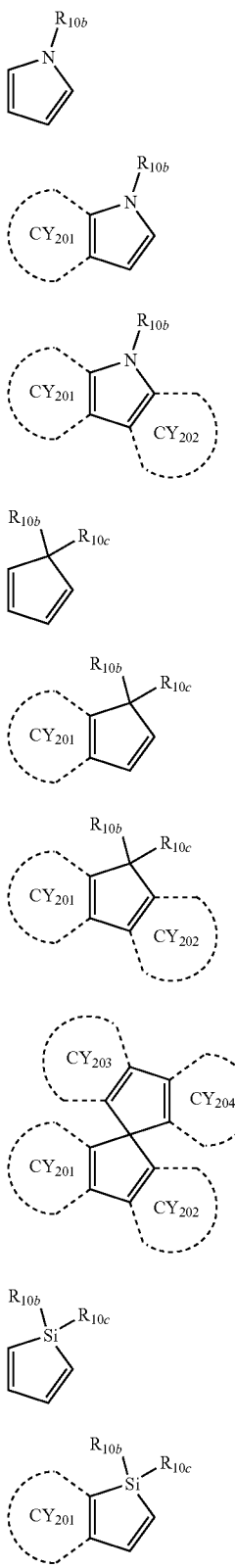
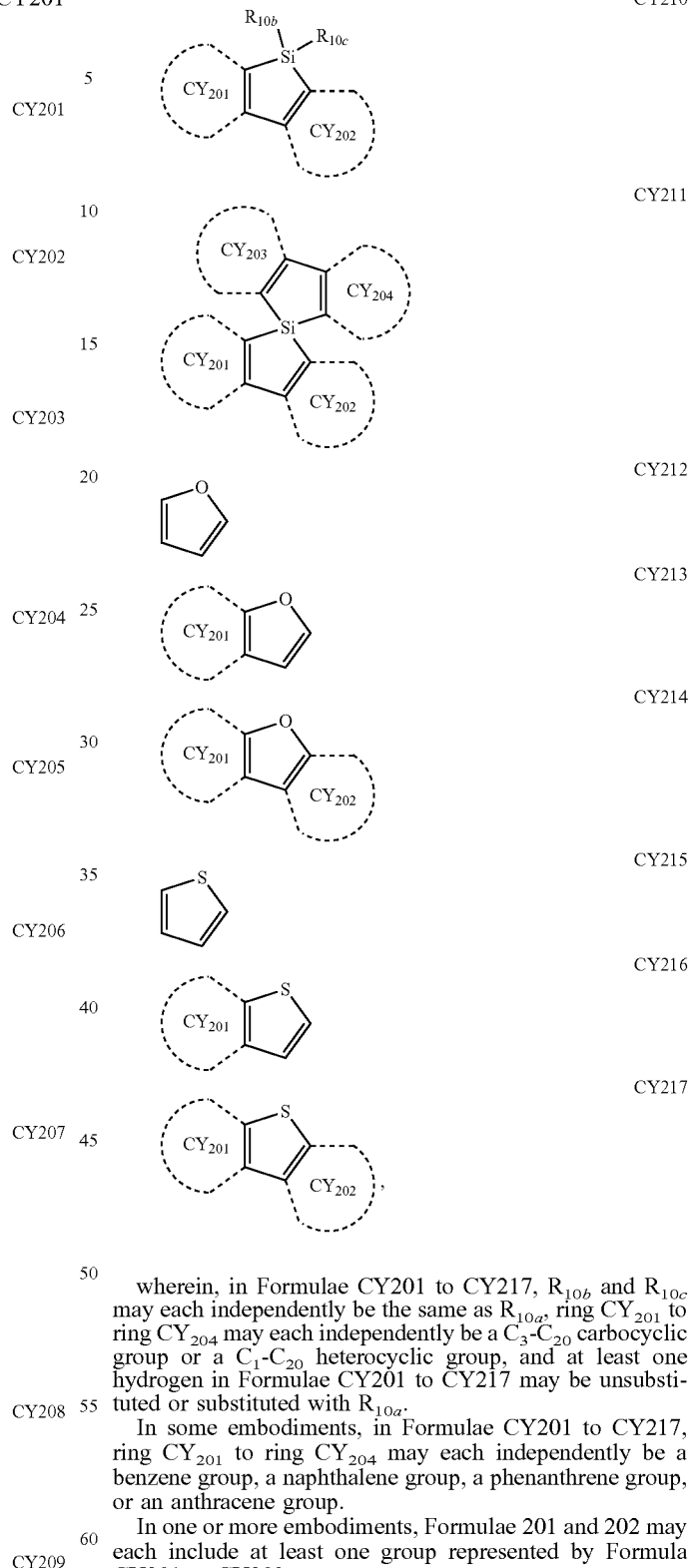

wherein, in Formulae CY201 to CY217, $R_{10b}$ and $R_{10c}$ may each independently be the same as $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$.

In some embodiments, in Formulae CY201 to CY217, ring $CY_{201}$ to ring $CY_{204}$ may each independently be a benzene group, a naphthalene group, a phenanthrene group, or an anthracene group.

In one or more embodiments, Formulae 201 and 202 may each include at least one group represented by Formula CY201 to CY203.

In one or more embodiments, Formula 201 may include at least one group represented by Formulae CY201 to CY203, and at least one group represented by Formulae CY204 to CY217.

In one or more embodiments, in Formula 201, xa1 may be 1, $R_{201}$ may be a group represented by any one of Formulae CY201 to CY203, xa2 may be 0, and $R_{202}$ may be a group represented by any one of Formulae CY204 to CY207.

In one or more embodiments, Formula 201 and 202 may each not include (e.g., may exclude) groups represented by Formulae CY201 to CY203.

In one or more embodiments, Formula 201 and 202 may each not include groups represented by Formulae CY201 to CY203, and may include at least one group represented by Formulae CY204 to CY217.

In one or more embodiments, Formula 201 and 202 may each not include groups represented by Formulae CY201 to CY217.

In some embodiments, the hole transport regions 151-1, 151-2, and 151-3 may each include one of Compounds HT1 to HT44, m-MTDATA, TDATA, 2-TNATA, NPB (NPD), β-NPB, TPD, spiro-TPD, spiro-NPB, methylated-NPB, TAPC, HMTPD, 4,4',4"-tris(N-carbazolyl)triphenylamine (TCTA), polyaniline/dodecylbenzene sulfonic acid (PANI/DBSA), poly(3,4-ethylene dioxythiophene)/poly(4-styrene sulfonate) (PEDOT/PSS), polyaniline/camphor sulfonic acid (PANI/CSA), polyaniline/poly(4-styrene sulfonate) (PANI/PSS), or any combination thereof:

HT1

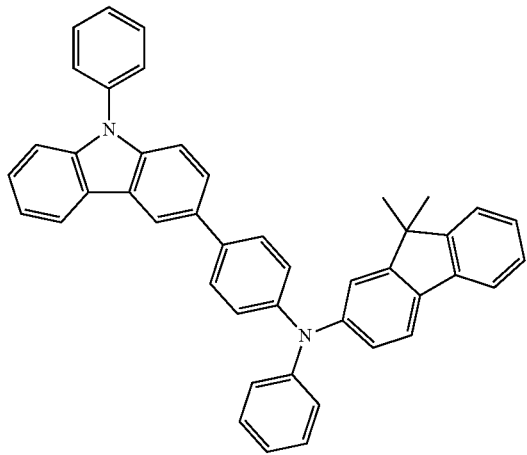

HT2

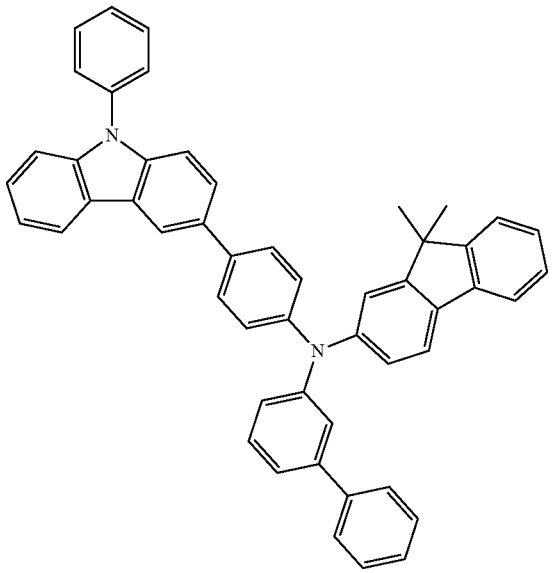

HT3

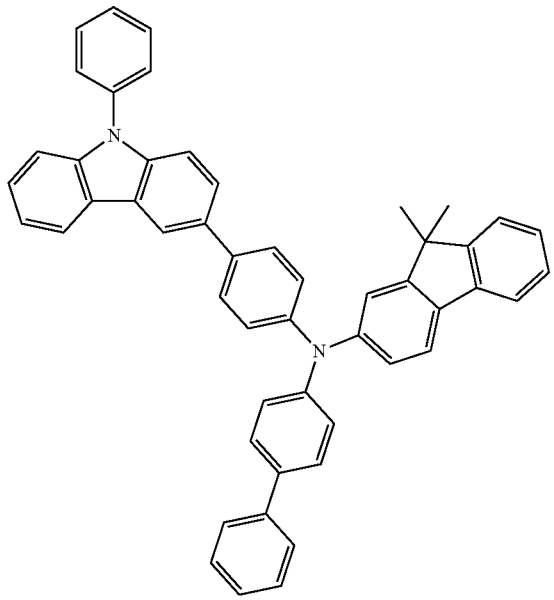

HT4

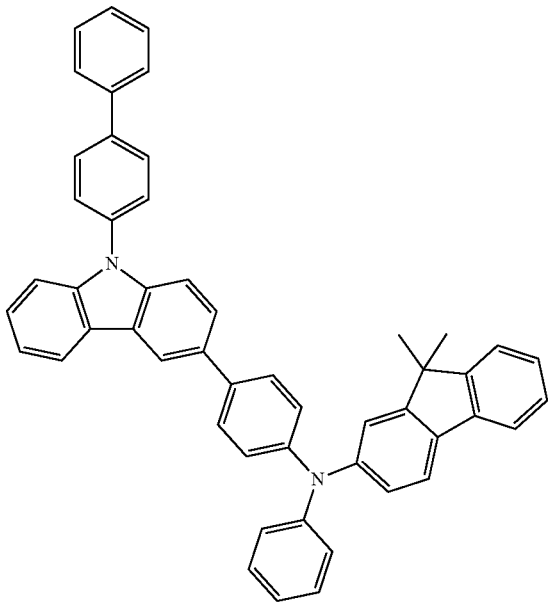

-continued
HT5
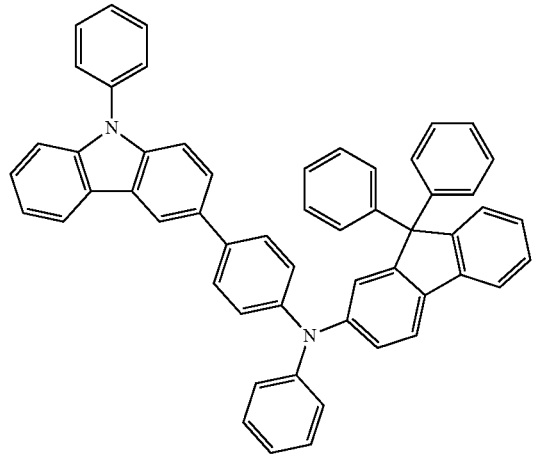
HT6
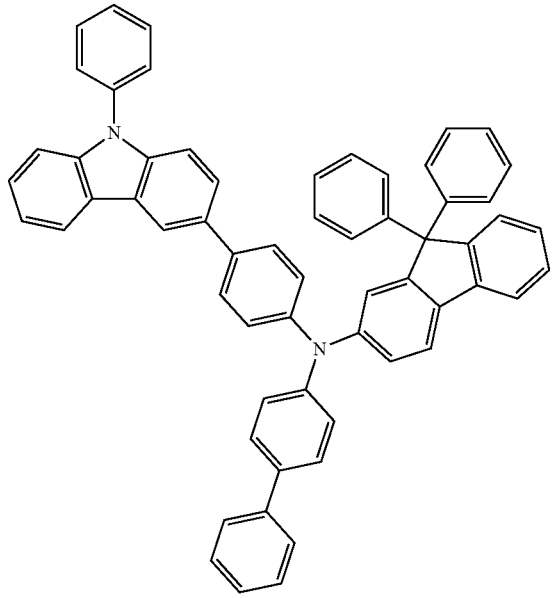
HT7
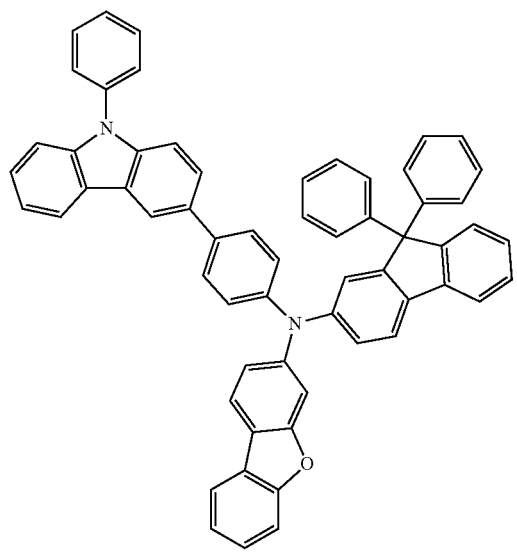
HT8
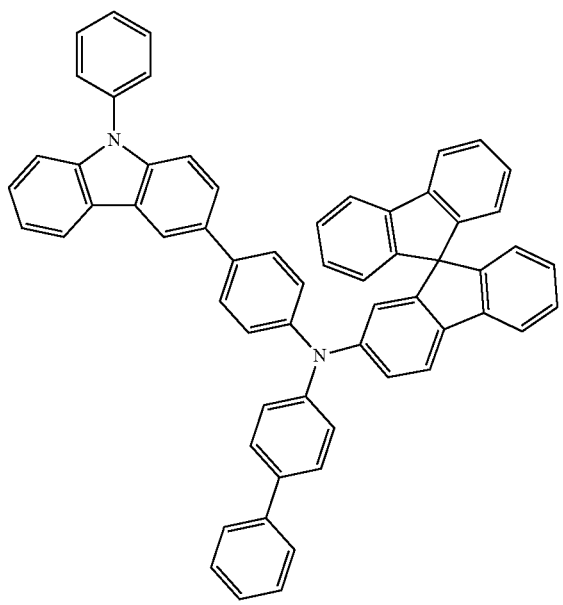

HT9
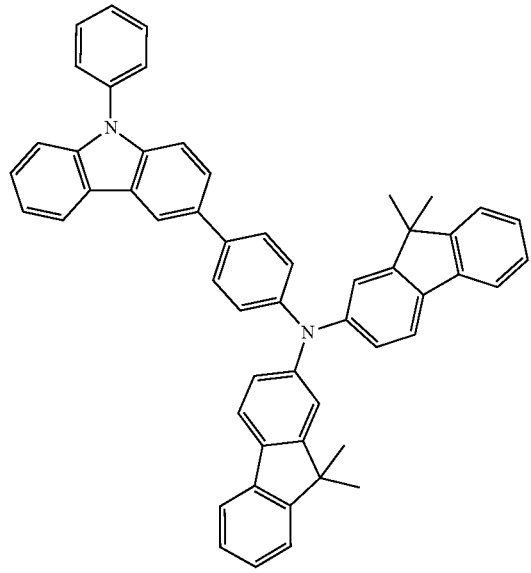
HT10
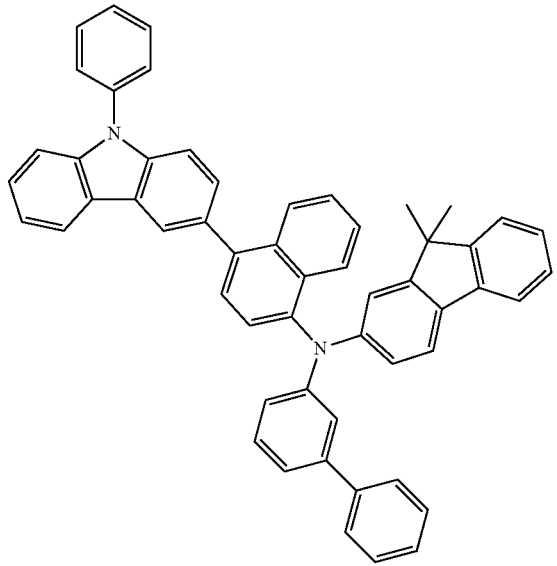
HT11
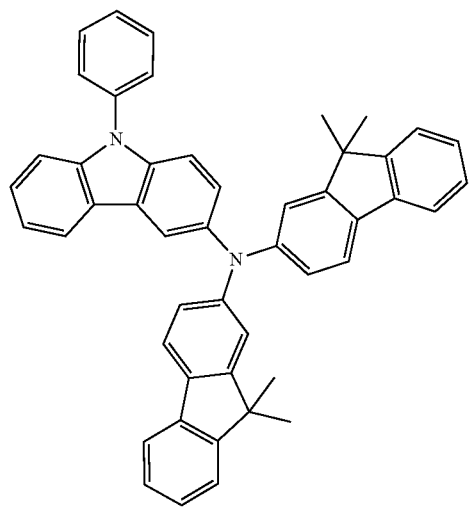
HT12
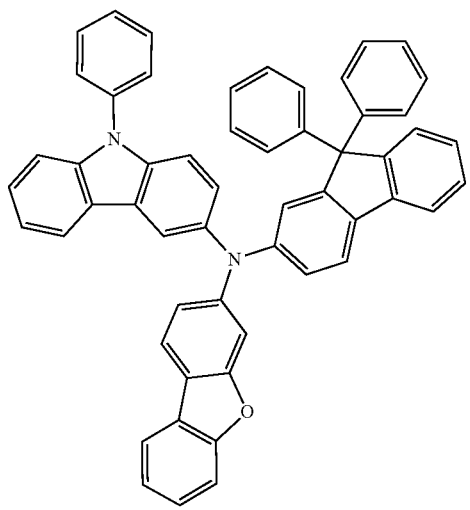

-continued
HT13
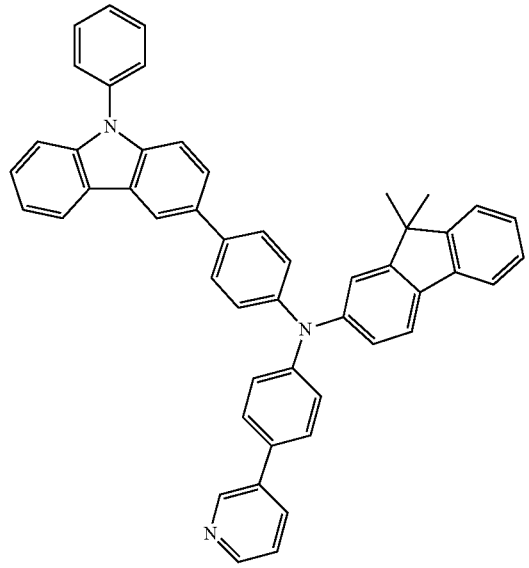
HT14
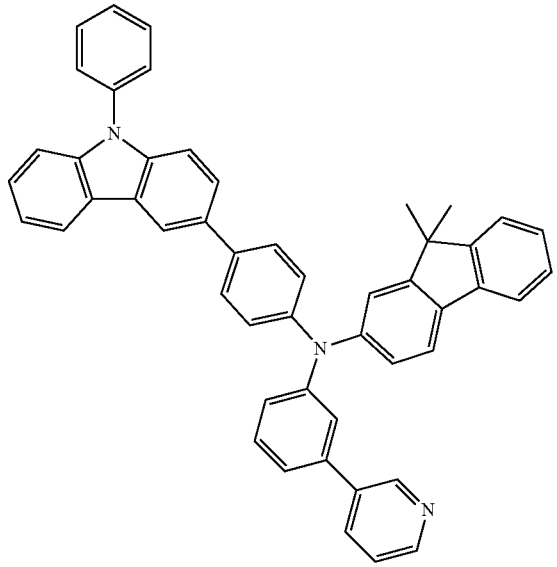
HT15
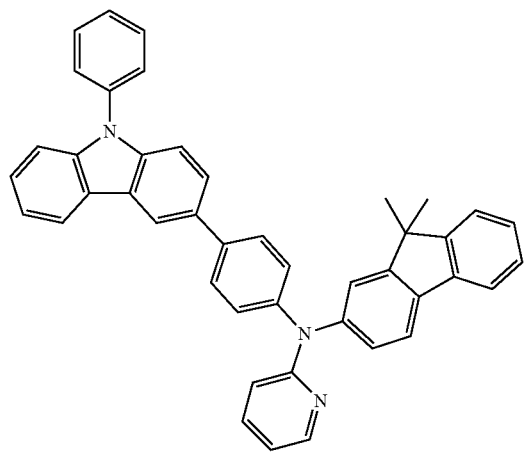
HT16
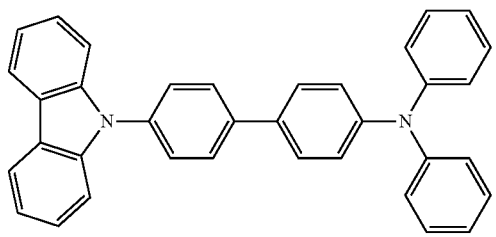
HT17
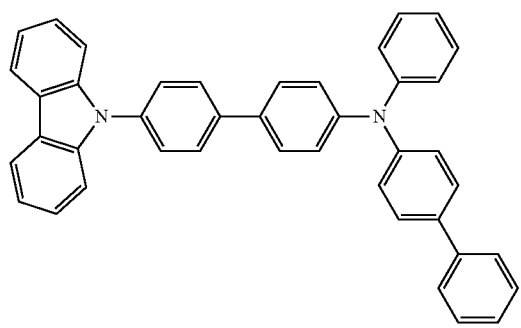
HT18
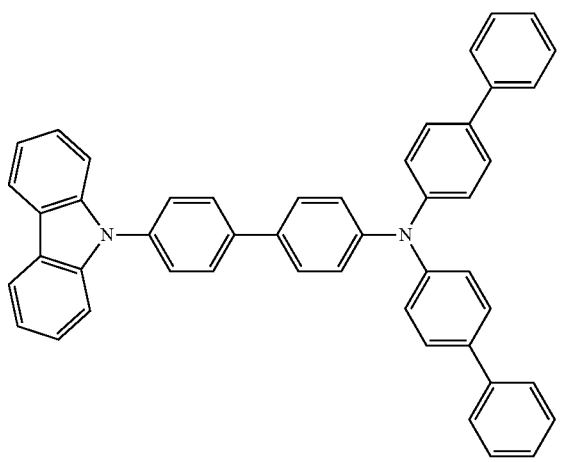

-continued
HT19
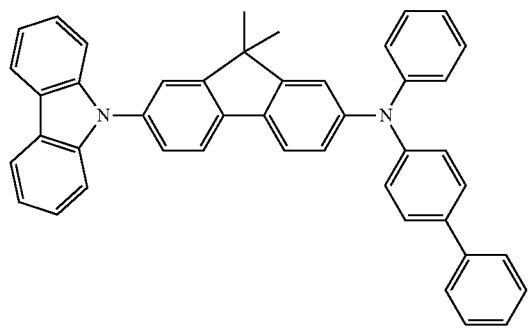
HT20
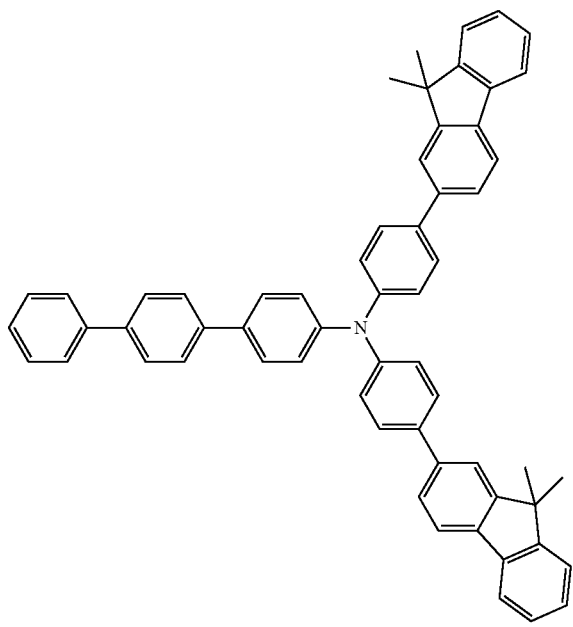
HT21
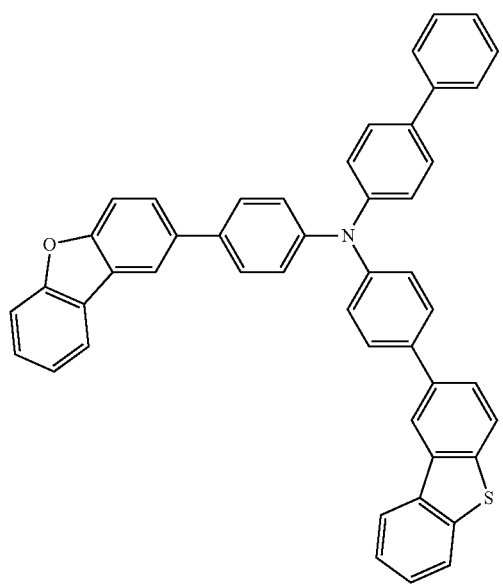
HT22
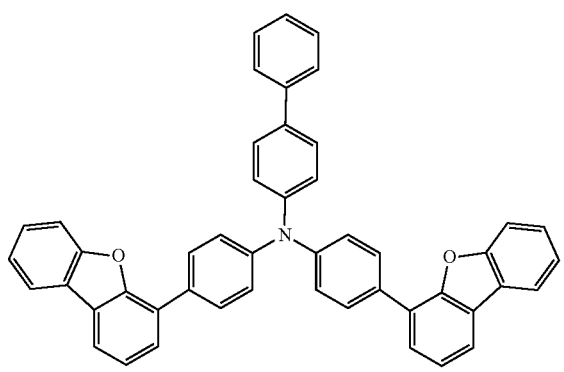

HT23
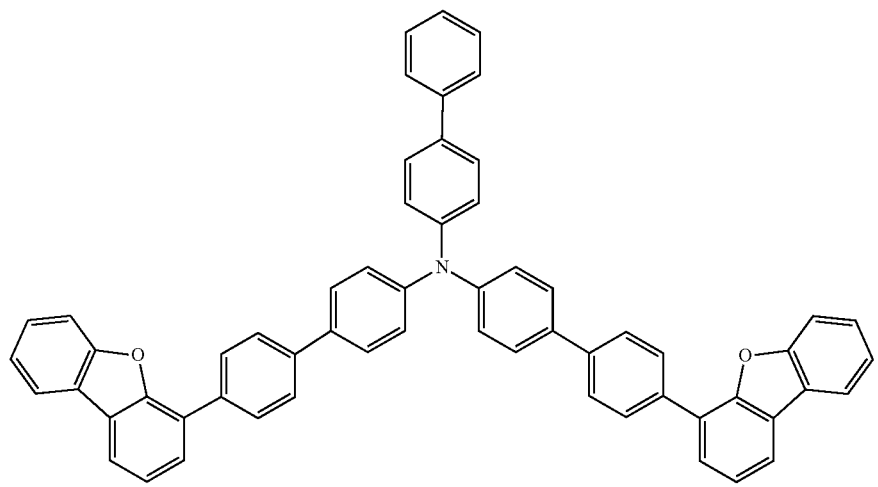
HT24
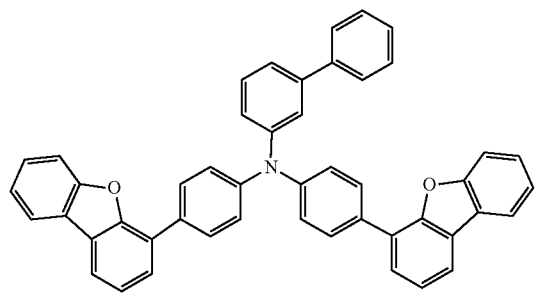
HT25
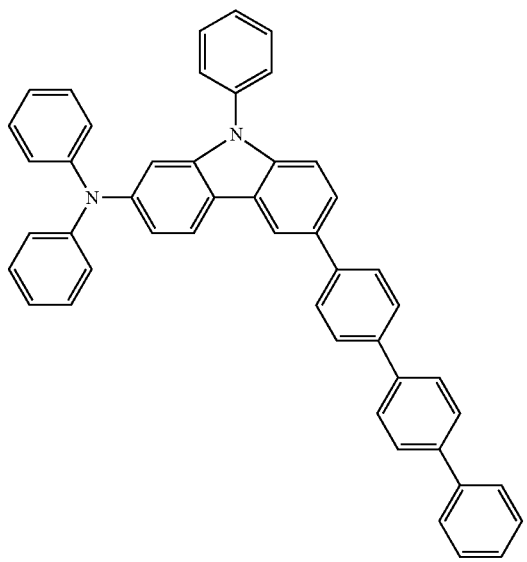
HT26
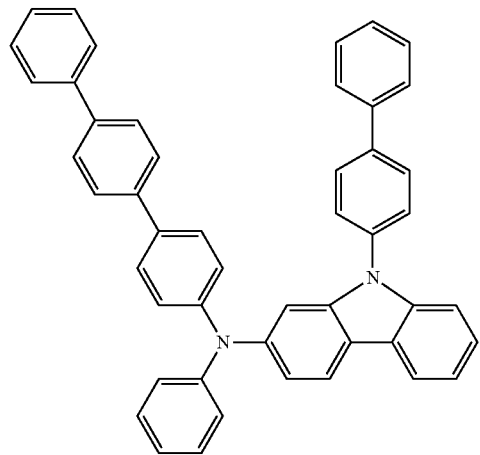
HT27
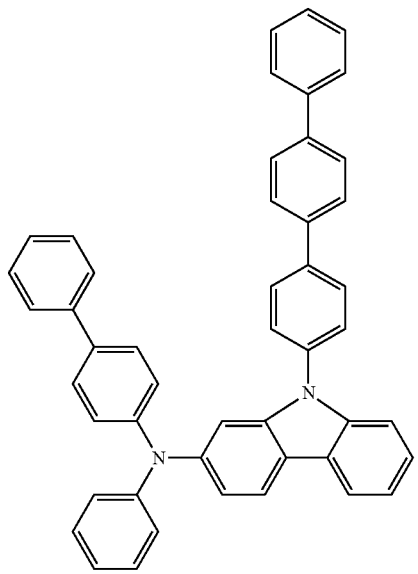

-continued
HT28
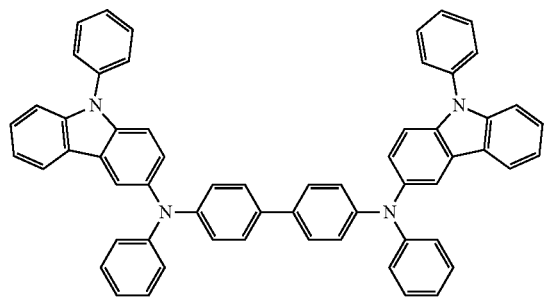
HT29
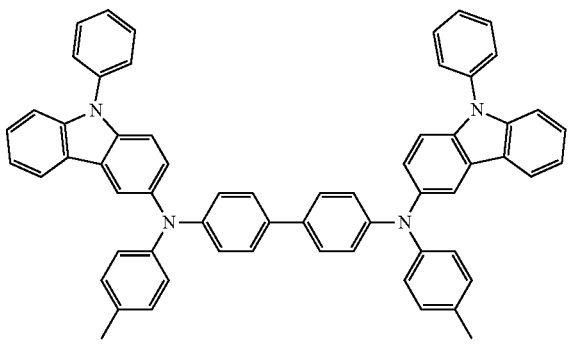
HT30
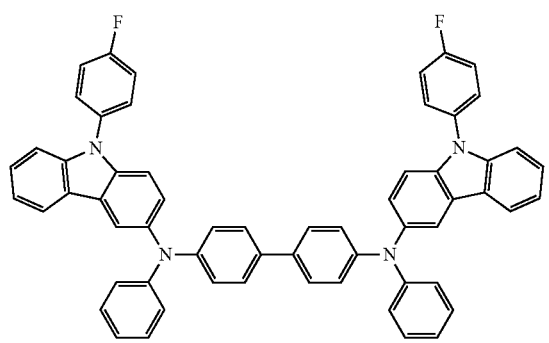
HT31
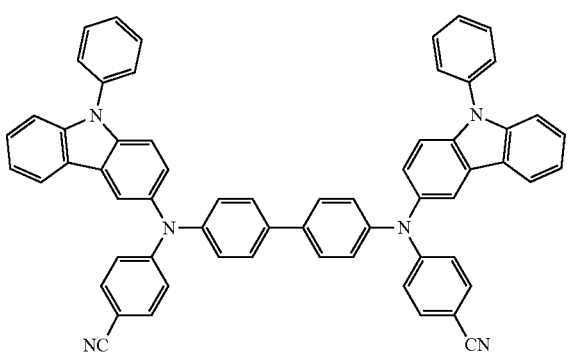
HT32
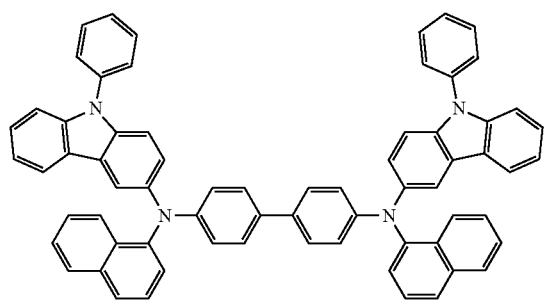
HT33
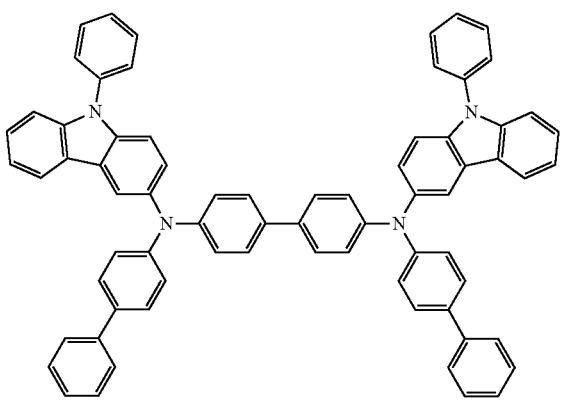

-continued
HT34
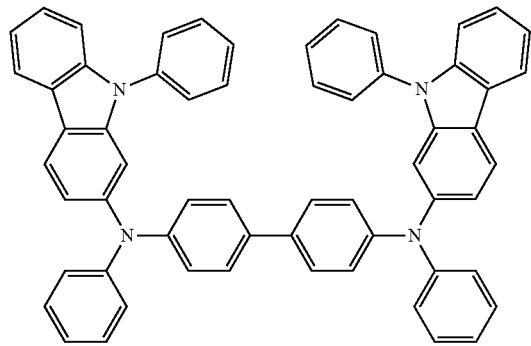
HT35
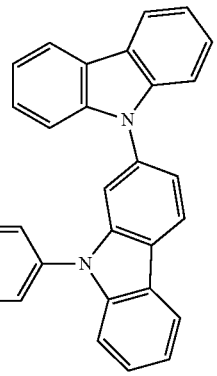
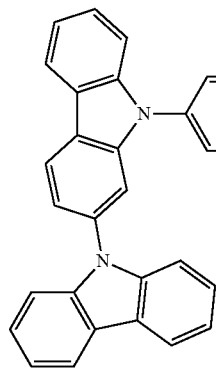
HT36
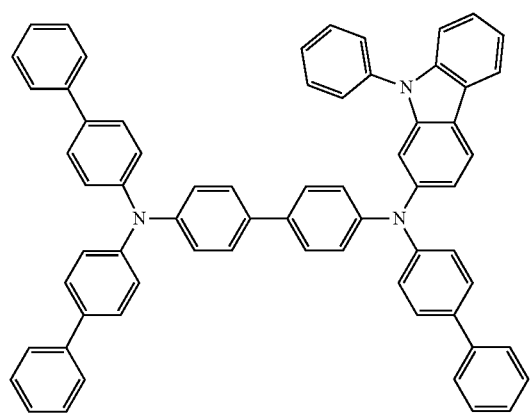
HT37
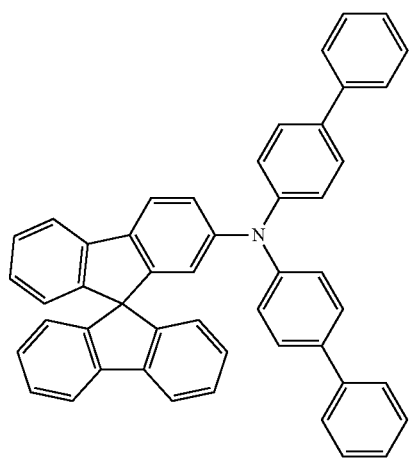
HT38
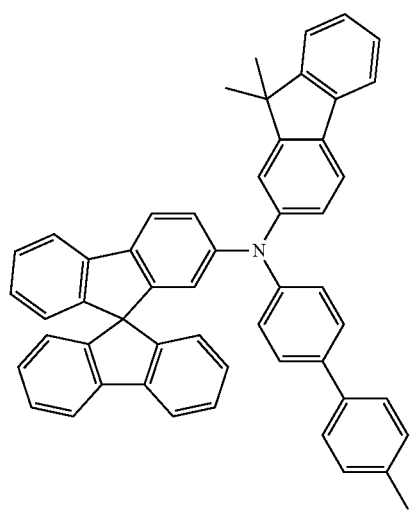
HT39
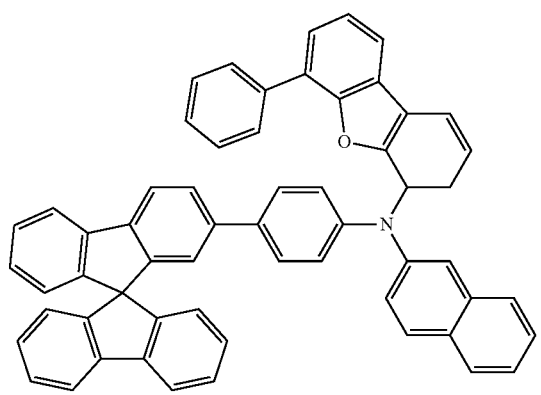

HT40
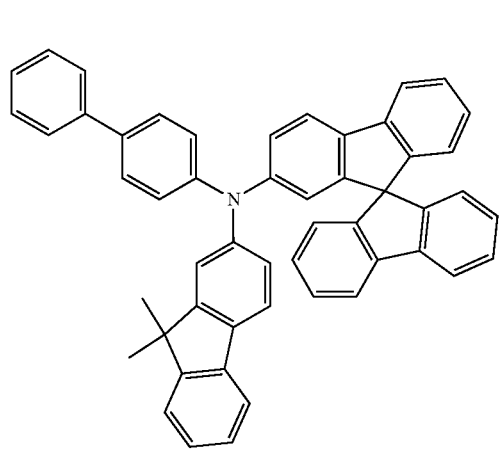
HT41
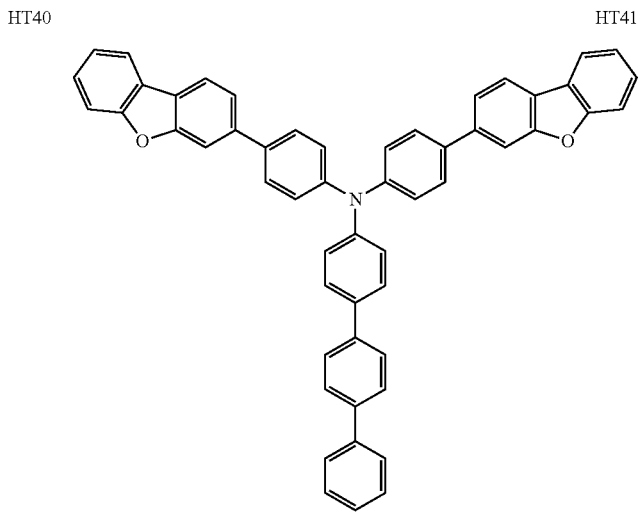
HT42
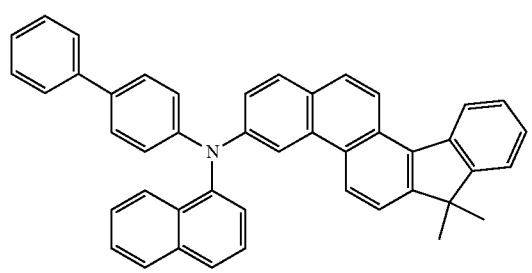
HT43
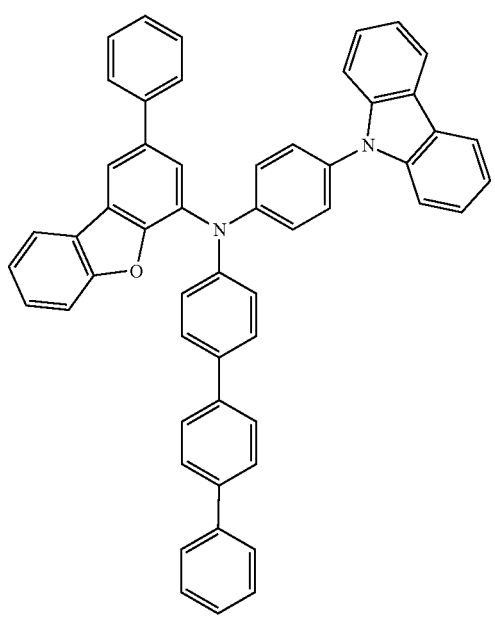

-continued
HT44
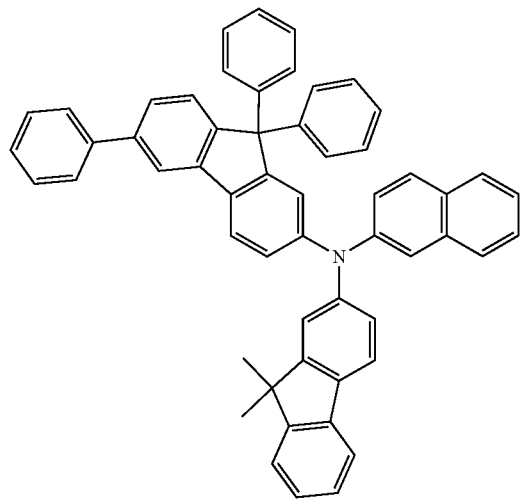
m-MTDATA
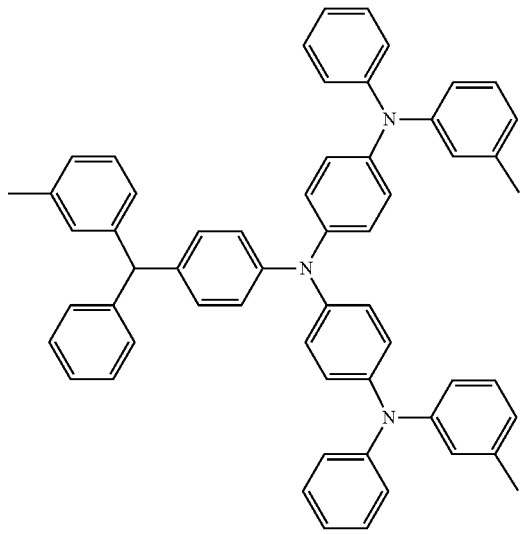
TDATA
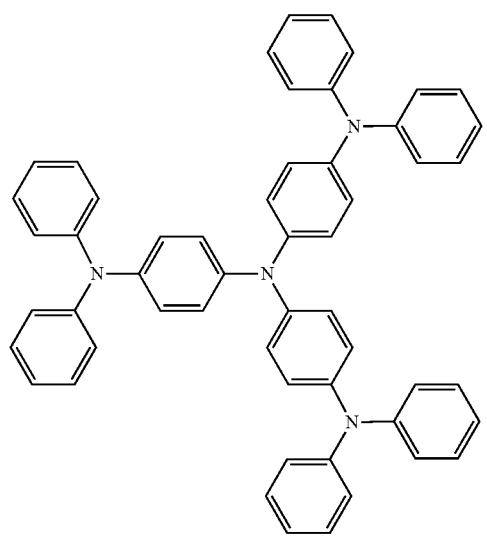
2-TNATA
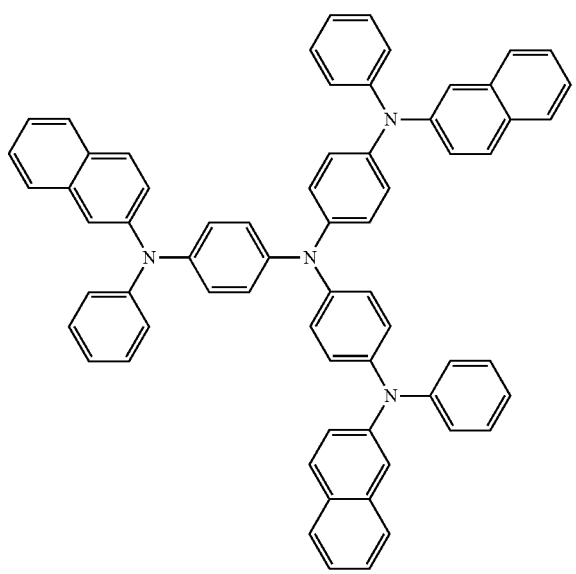
NPB
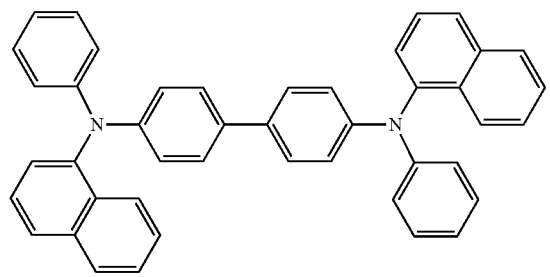
β-NPB
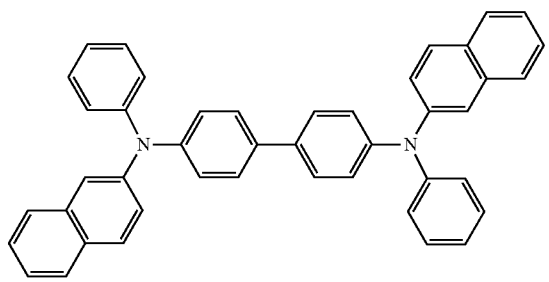

-continued

TPD
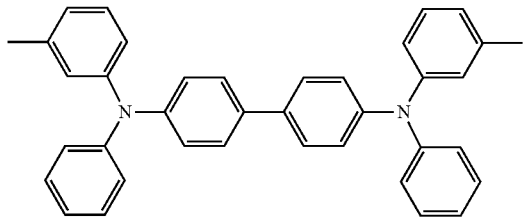

Spiro-TPD
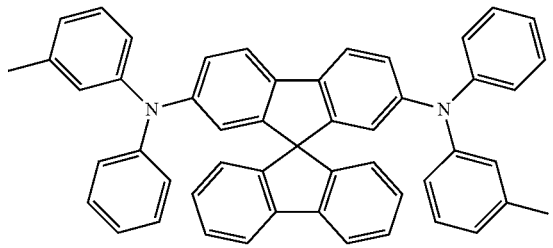

Spiro-NPD
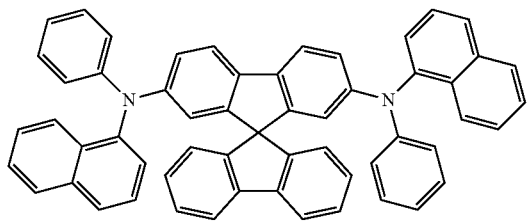

methylated-NPB
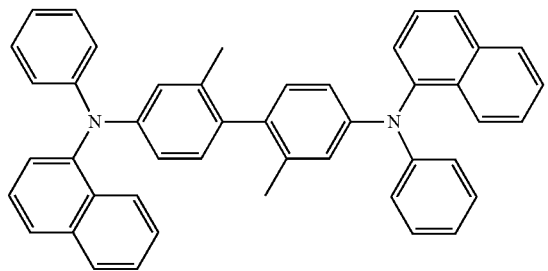

TAPC
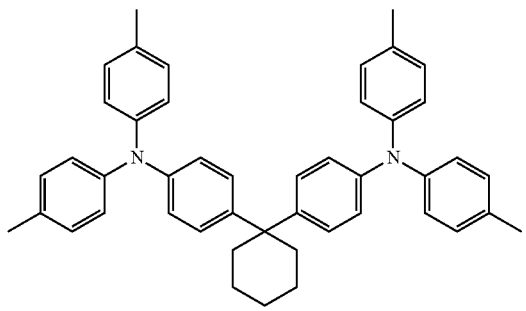

HMTPD
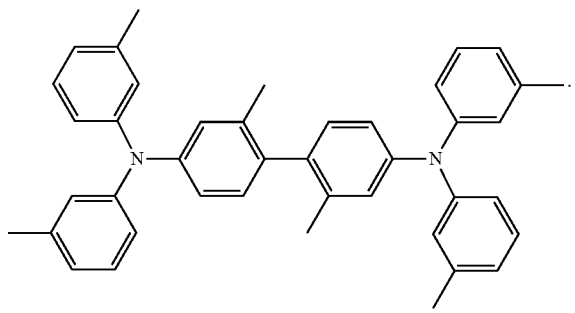

The thicknesses of the hole transport regions 151-1, 151-2, and 151-3 may each be about 50 (Angstroms) Å to about 10,000 Å, and in some embodiments, about 100 Å to about 4,000 Å. When the hole transport regions 151-1, 151-2, and 151-3 each include a hole injection layer, a hole transport layer, or any combination thereof, the thickness of the hole injection layer may be about 100 Å to about 9,000 Å, and in some embodiments, about 100 Å to about 1,000 Å; and the thickness of the hole transport layer may be about 50 Å to about 2,000 Å, and in some embodiments, about 100 Å to about 1,500 Å. When the thicknesses of the hole transport region, the hole injection layer, and the hole transport layer are within any of these ranges, excellent hole transport characteristics may be obtained without a substantial increase in driving voltage.

The thickness of the hole transfer layer 151-1c may be about 0.5 Å to about 50 Å.

The emission auxiliary layer may increase the light emission efficiency of a device by compensating for an optical resonance distance of the wavelength of light emitted by an emission layer. The electron blocking layer may reduce or eliminate the flow of electrons from an electron transport region. The emission auxiliary layer and the electron blocking layer may each include the aforementioned materials.

p-dopant

The hole transport regions 151-1, 151-2, and 151-3 may each include a charge generating material as well as the aforementioned materials, to improve the conductive properties of the hole transport region. The charge generating material may be substantially homogeneously or non-homogeneously dispersed in the hole transport region, and for example, may be present in a single layer including (e.g., consisting of) charge generating material.

The charge generating material may include, for example, a p-dopant.

In some embodiments, a lowest unoccupied molecular orbital (LUMO) energy level of the p-dopant may be −3.5 eV or less.

In some embodiments, the p-dopant may include a quinone derivative, a cyano group-containing compound, a compound including elements EL1 and EL2, or any combination thereof.

Non-limiting examples of the quinone derivative include TCNQ, F4-TCNQ, and the like.

Non-limiting examples of the cyano group-containing compound include HAT-CN, a compound represented by Formula 221, and the like:

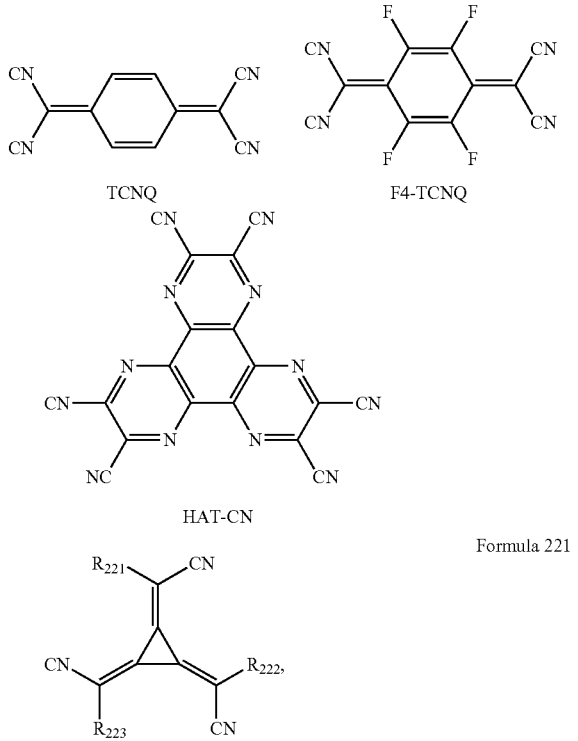

wherein, in Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be: a $C_3$-$C_{60}$ carbocyclic group or a $C_1$-$C_{60}$ heterocyclic group, substituted with a cyano group; —F; —Cl; —Br; —I; a $C_1$-$C_{20}$ alkyl group substituted with a cyano group, —F, —Cl, —Br, —I, or any combination thereof; or any combination thereof.

In the compound including elements EL1 and EL2, element EL1 may be metal, metalloid, or a combination thereof, and element EL2 may be non-metal, metalloid, or a combination thereof.

Non-limiting examples of the metal include: an alkali metal (e.g., lithium (Li), sodium (Na), potassium (K), rubidium (Rb), cesium (Cs), and/or the like); an alkaline earth metal (e.g., beryllium (Be), magnesium (Mg), calcium (Ca), strontium (Sr), barium (Ba), and/or the like); a transition metal (e.g., titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), and/or the like); a post-transition metal (e.g., zinc (Zn), indium (In), tin (Sn), and/or the like); a lanthanide metal (e.g., lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), ruthenium(Lu), and/or the like); and the like.

Non-limiting examples of the metalloid include silicon (Si), antimony (Sb), tellurium (Te), and the like.

Non-limiting examples of the non-metal include oxygen (O), halogen (e.g., F, Cl, Br, I, and/or the like), and the like.

For example, the compound including elements EL1 and EL2 may include a metal oxide, a metal halide (e.g., metal fluoride, metal chloride, metal bromide, metal iodide, and/or the like), a metalloid halide (e.g., a metalloid fluoride, a metalloid chloride, a metalloid bromide, a metalloid iodide, and/or the like), a metal telluride, or any combination thereof.

Non-limiting examples of the metal oxide include a tungsten oxide (e.g., WO, $W_2O_3$, $WO_2$, $WO_3$, $W_2O_5$, and/or the like), a vanadium oxide (e.g., VO, $V_2O_3$, $VO_2$, $V_2O_5$, and/or the like), a molybdenum oxide (MoO, $MO_2O_3$, $MoO_2$, $MoO_3$, $Mo_2O_5$, and/or the like), a rhenium oxide (e.g., $ReO_3$ and/or the like), and the like.

Non-limiting examples of the metal halide include an alkali metal halide, an alkaline earth metal halide, a transition metal halide, a post-transition metal halide, a lanthanide metal halide, and the like.

Non-limiting examples of the alkali metal halide include LiF, NaF, KF, RbF, CsF, LiCl, NaCl, KCl, RbCl, CsCl, LiBr, NaBr, KBr, RbBr, CsBr, LiI, NaI, KI, RbI, CsI, and the like.

Non-limiting examples of the alkaline earth metal halide include $BeF_2$, $MgF_2$, $CaF_2$, $SrF_2$, $BaF_2$, $BeCl_2$, $MgCl_2$, $CaCl_2$, $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, $BaI_2$, and the like.

Non-limiting examples of the transition metal halide include a titanium halide (e.g., $TiF_4$, $TiCl_4$, $TiBr_4$, $TiI_4$, and/or the like), a zirconium halide (e.g., $ZrF_4$, $ZrCl_4$, $ZrBr_4$, $ZrI_4$, and/or the like), a hafnium halide(e.g., $HfF_4$, $HfCl_4$, $HfBr_4$, $HfI_4$, and/or the like), a vanadium halide (e.g., $VF_3$, $VCl_3$, $VBr_3$, $VI_3$, and/or the like), a niobium halide (e.g., $NbF_3$, $NbCl_3$, $NbBr_3$, $NbI_3$, and/or the like), a tantalum halide (e.g., $TaF_3$, $TaCl_3$, $TaBr_3$, $TaI_3$, and/or the like), a chromium halide (e.g., $CrF_3$, $CrCl_3$, $CrBr_3$, $CrI_3$, and/or the like), a molybdenum halide (e.g., $MoF_3$, $MoCl_3$, $MoBr_3$, $MoI_3$, and/or the like), a tungsten halide (e.g., $WF_3$, $WCl_3$, $WBr_3$, $WI_3$, and/or the like), a manganese halide (e.g., $MnF_2$, $MnCl_2$, $MnBr_2$, $MnI_2$, and/or the like), a technetium halide (e.g., $TcF_2$, $TcCl_2$, $TcBr_2$, $TcI_2$, and/or the like), a rhenium halide (e.g., $ReF_2$, $ReCl_2$, $ReBr_2$, $ReI_2$, and/or the like), an iron halide (e.g., $FeF_2$, $FeCl_2$, $FeBr_2$, $FeI_2$, and/or the like), a ruthenium halide (e.g., $RuF_2$, $RuCl_2$, $RuBr_2$, $RuI_2$, and/or the like), an osmium halide (e.g., $OsF_2$, $OsCl_2$, $OsBr_2$, $OsI_2$, and/or the like), a cobalt halide (e.g., $CoF_2$, $CoCl_2$, $CoBr_2$, $CoI_2$, and/or the like), a rhodium halide (e.g., $RhF_2$, $RhCl_2$, $RhBr_2$, $RhI_2$, and/or the like), an iridium halide (e.g., $IrF_2$, $IrCl_2$, $IrBr_2$, $Ir_2$, and/or the like), a nickel halide (e.g., $NiF_2$, $NiCl_2$, $NiBr_2$, $NiI_2$, and/or the like), a palladium halide (e.g., $PdF_2$, $PdCl_2$, $PdBr_2$, $PdI_2$, and/or the like), a platinum halide (e.g., $PtF_2$, $PtCl_2$, $PtBr_2$, $PtI_2$, and/or the like), a copper halide (e.g., CuF, CuCl, CuBr, CuI, and/or the like), a silver halide (e.g., AgF, AgCl, AgBr, AgI, and/or the like), a gold halide (e.g., AuF, AuCl, AuBr, AuI, and/or the like), and the like.

Non-limiting examples of the post-transition metal halide include a zinc halide (e.g., $ZnF_2$, $ZnCl_2$, $ZnBr_2$, $ZnI_2$, and/or the like), an indium halide (e.g., $InI_3$ and/or the like), a tin halide (e.g., $SnI_2$ and/or the like), and the like.

Non-limiting examples of the lanthanide metal halide include YbF, $YbF_2$, $YbF_3$, $SmF_3$, YbCl, $YbCl_2$, $YbCl_3$, $SmCl_3$, YbBr, $YbBr_2$, $YbBr_3$, $SmBr_3$, YbI, $YbI_2$, $YbI_3$, $SmI_3$, and the like.

Non-limiting examples of the metalloid halide may include an antimony halide (e.g., $SbCl_5$ and/or the like) and the like.

Non-limiting examples of the metal telluride include an alkali metal telluride (e.g., $Li_2Te$, $Na_2Te$, $K_2Te$, $Rb_2Te$, $Cs_2Te$, and the like), an alkaline earth metal telluride (e.g., BeTe, MgTe, CaTe, SrTe, BaTe, and the like), a transition metal telluride (e.g., $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, and/or the like), a post-transition metal telluride (e.g., ZnTe and/or the like), a lanthanide metal telluride (e.g., LaTe, CeTe, PrTe, NdTe, PmTe, EuTe, GdTe, TbTe, DyTe, HoTe, ErTe, TmTe, YbTe, LuTe, and/or the like), and the like.

Emission Layers 152-1, 152-2, and 152-3 in Interlayer 150

When the light-emitting device 10 is a full color light-emitting device, the emission layers 152-1, 152-2, and 152-3 may be patterned into a red emission layer, a green emission layer, and/or a blue emission layer, according to a sub-pixel. In one or more embodiments, the emission layers 152-1, 152-2, and 152-3 may each have a stacked structure. The stacked structure may include two or more layers selected from a red emission layer, a green emission layer, and a blue emission layer. In some embodiments, the two or more layers may be in direct contact with each other. In some embodiments, the two or more layers may be separated from each other. In one or more embodiments, the emission layer may include two or more materials. The two or more materials may include a red light-emitting material, a green light-emitting material, or a blue light-emitting material. The two or more materials may be mixed with each other in a single layer. The two or more materials mixed with each other in the single layer may be to emit white light.

The emission layers 152-1, 152-2, and 152-3 may each include a host and a dopant. The dopant may be a phosphorescent dopant, a fluorescent dopant, or any combination thereof.

The amount of the dopant in each of the emission layers 152-1, 152-2, and 152-3 may be about 0.01 parts to about 15 parts by weight based on 100 parts by weight of the host.

In some embodiments, the emission layers 152-1, 152-2, and 152-3 may each include quantum dots.

The emission layers 152-1, 152-2, and 152-3 may each include a delayed fluorescence material. The delayed fluorescence material may serve as a host or a dopant in the emission layers 152-1, 152-2, and 152-3.

The thickness of each of the emission layers 152-1, 152-2, and 152-3 may be about 100 Å to about 1,000 Å, and in some embodiments, about 200 Å to about 600 Å. When the thickness of the emission layers 152-1, 152-2, and 152-3 is within any of these ranges, improved luminescence characteristics may be obtained without a substantial increase in driving voltage.

Host

The host may include a compound represented by Formula 301:

$$[Ar_{301}]_{xb11}-[(L_{301})_{xb1}-R_{301}]_{xb21}, \quad \text{Formula 301}$$

wherein, in Formula 301, $Ar_{301}$ and $L_{301}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xb11 may be 1, 2, or 3, xb1 may be an integer from 0 to 5, $R_{301}$ may be hydrogen, deuterium, —F, —$C_1$, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), or —P(=O)($Q_{301}$)($Q_{302}$), xb21 may be an integer from 1 to 5, and $Q_{301}$ to $Q_{303}$ may each independently be the same as $Q_1$.

In some embodiments, when xb11 in Formula 301 is 2 or greater, at least two $Ar_{301}$(s) may be bound via a single bond.

In some embodiments, the host may include a compound represented by Formula 301-1, a compound represented by Formula 301-2, or any combination thereof:

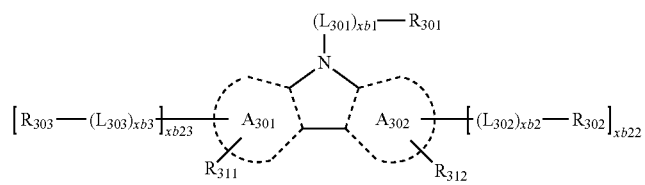

Formula 301-1

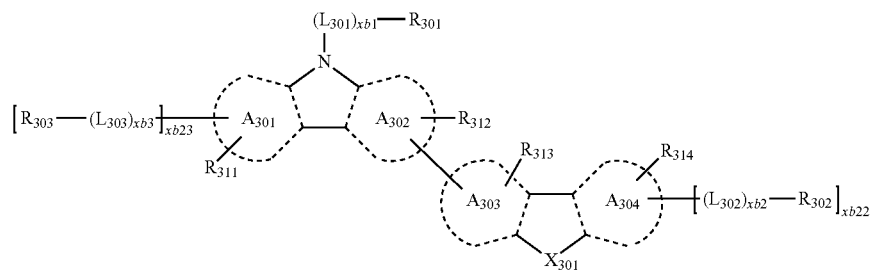

Formula 301-2 wherein, in Formulae 301-1 to 301-2,
ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$,
$X_{301}$ may be O, S, N—[(L$_{304}$)$_{xb4}$-R$_{304}$], C(R$_{304}$)(R$_{305}$), or Si(R$_{304}$)(R$_{305}$),
xb22 and xb23 may each independently be 0, 1, or 2,
$L_{301}$, xb1, and $R_{301}$ may each respectively be the same as $L_{301}$, xb1, and $R_{301}$,
$L_{302}$ to $L_{304}$ may each independently be the same as $L_{301}$,
xb2 to xb4 may each independently be the same as xb1, and
$R_{302}$ to $R_{305}$ and $R_{311}$ to $R_{314}$ may each independently be the same as $R_{301}$.

In some embodiments, the host may include an alkaline earth metal complex. In some embodiments, the host may include a Be complex (e.g., Compound H55), a Mg complex, a Zn complex, or any combination thereof.

In some embodiments, the host may include one of Compounds H1 to H124, 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di(carbazol-9-yl)benzene (mCP), 1,3,5-tri(carbazol-9-yl)benzene (TCP), or any combination thereof:

H1
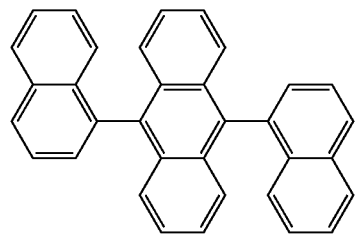

H2
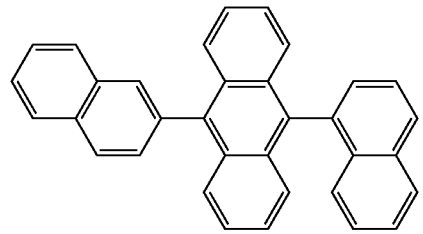

H3
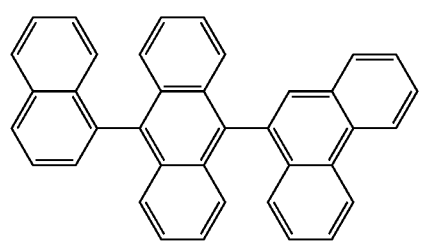

H4
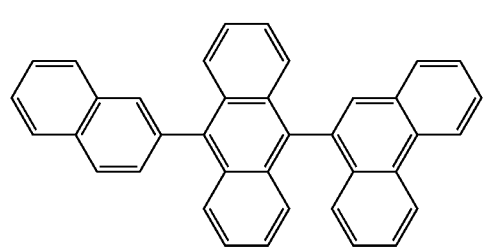

H5
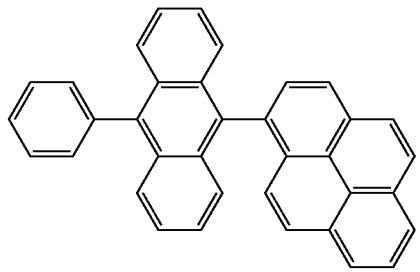

H6
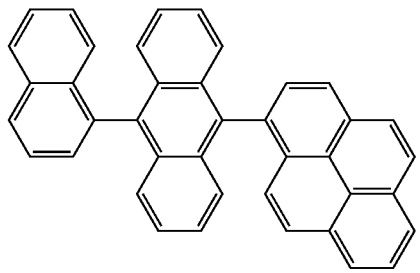

H7
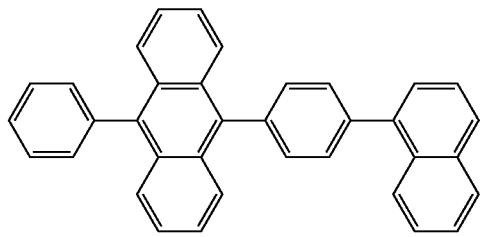

H8
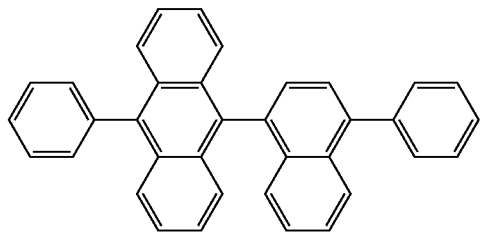

H9
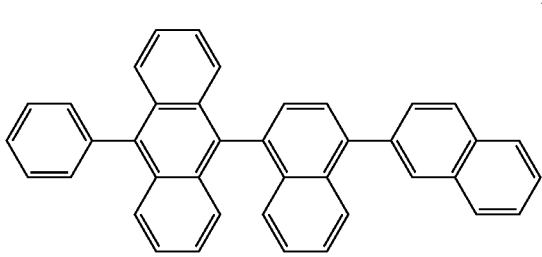

H10
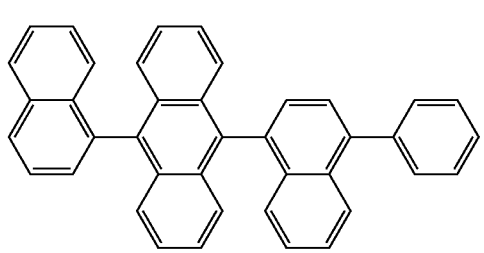

-continued
H11
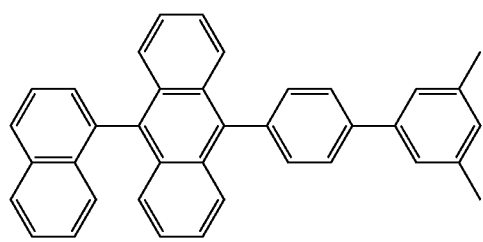
H12
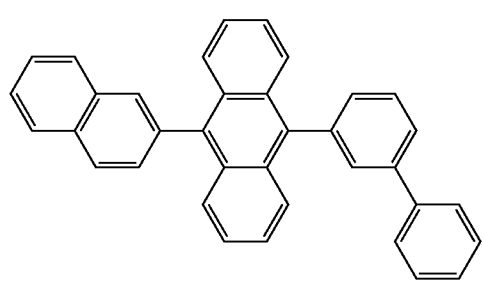
H13
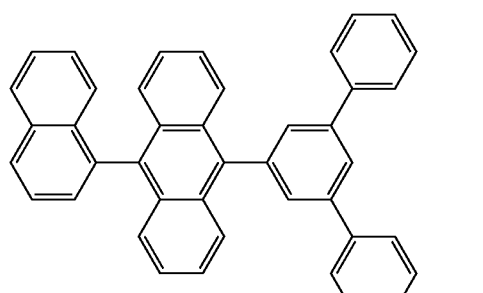
H14
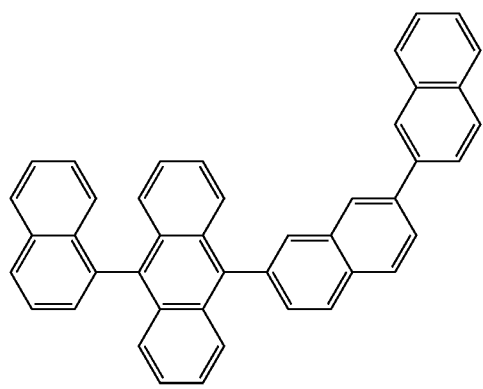
H15
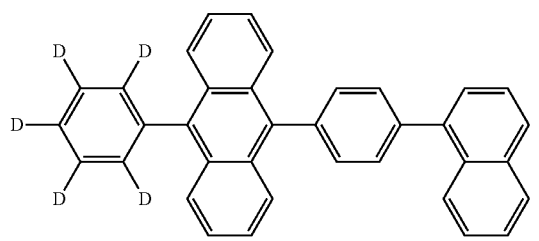
-continued
H16
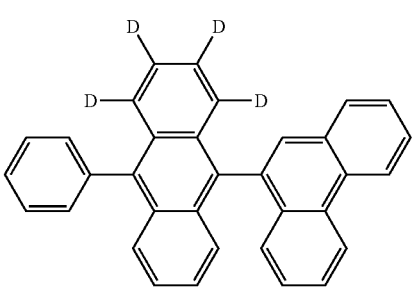
H17
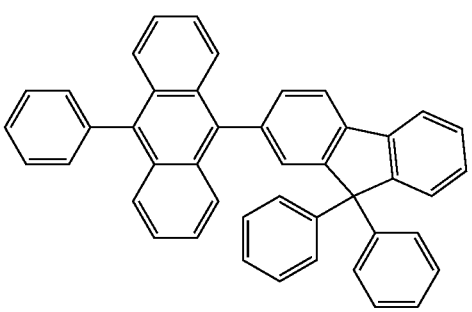
H18
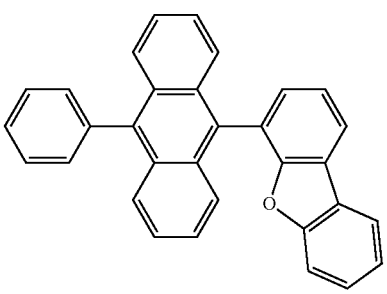
H19
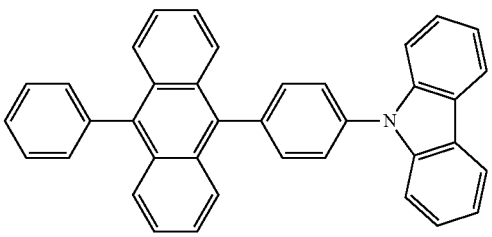
H20
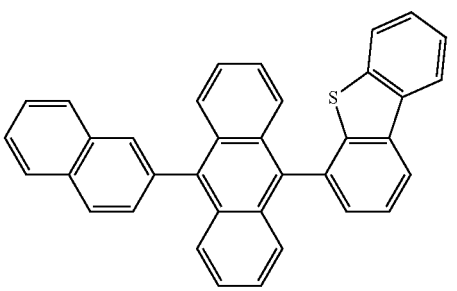

H21
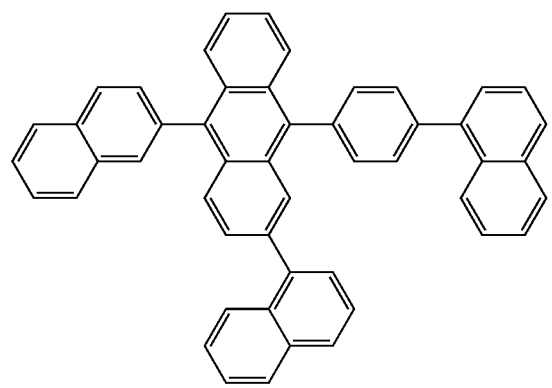
H22
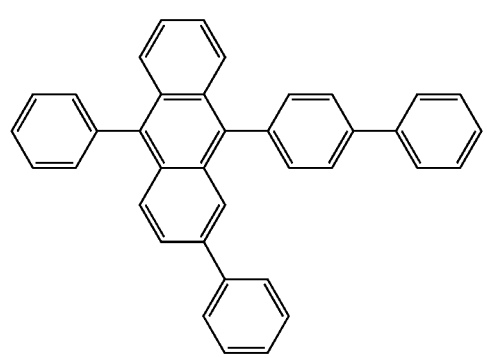
H23
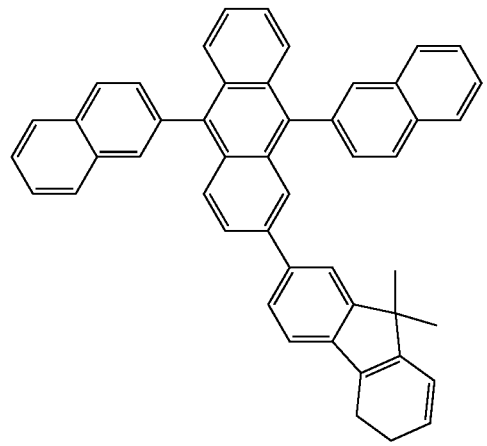
H24
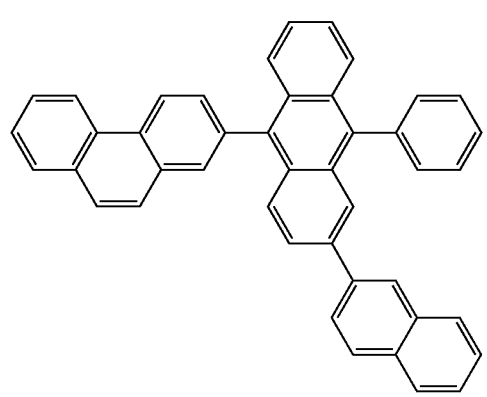
H25
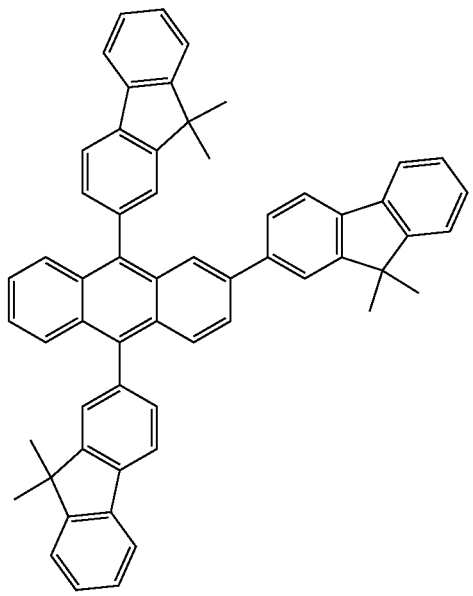
H26
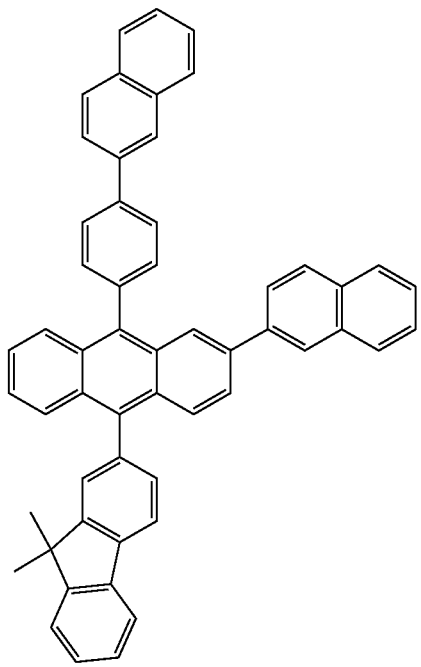

H27
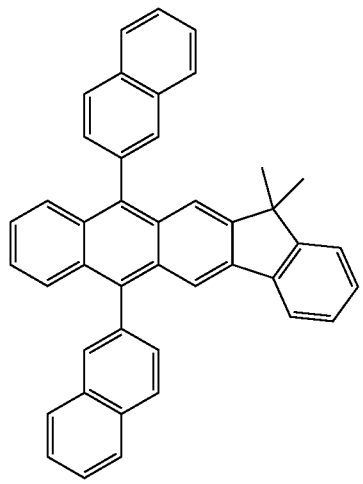
H28
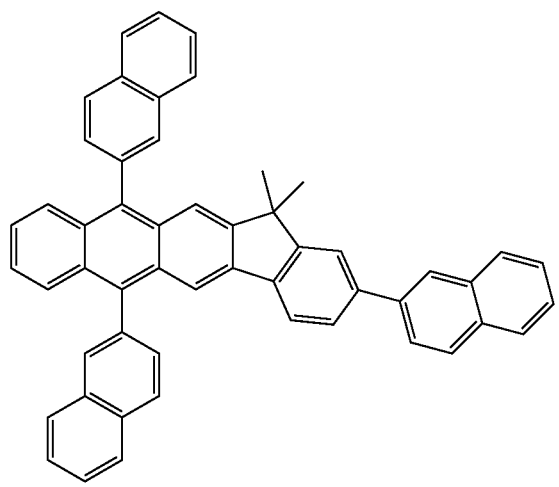
H29
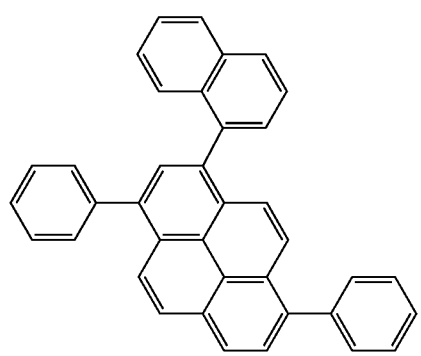
H30
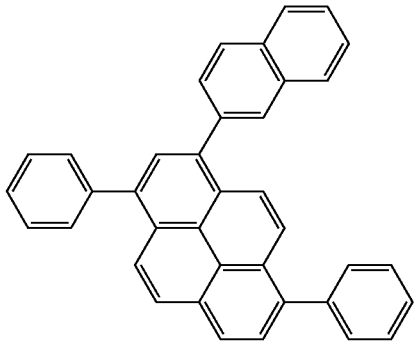
H31
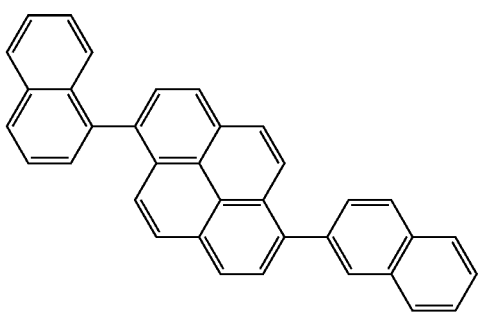
H32
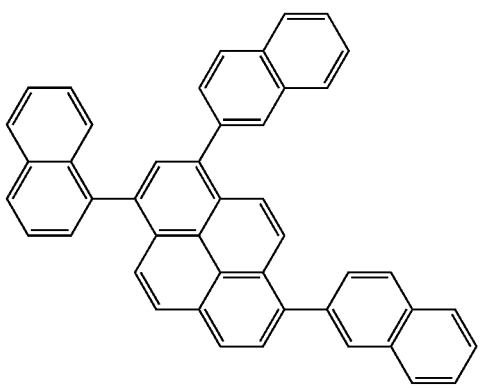
H33
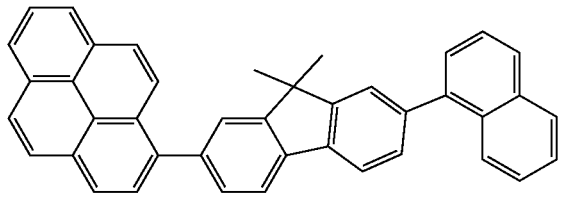
H34
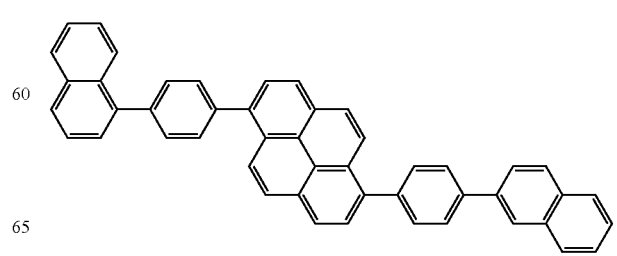

-continued
H35
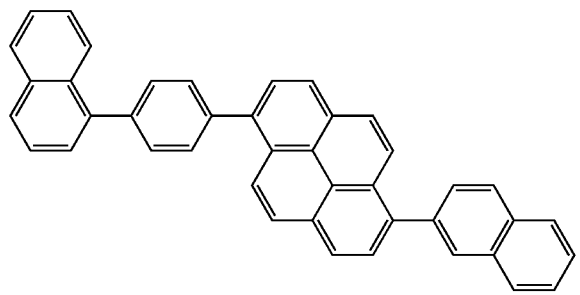
H36
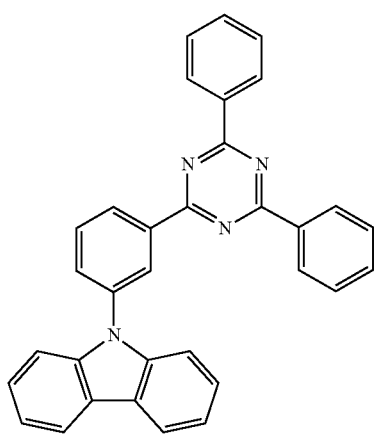
H37
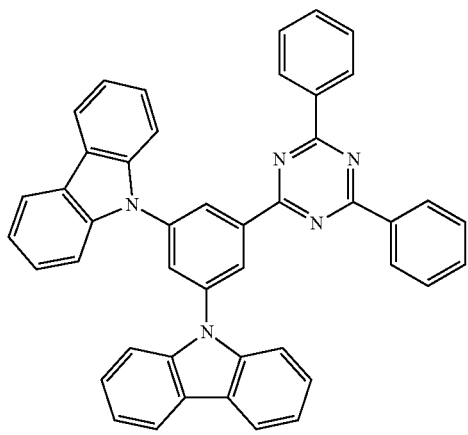
H38
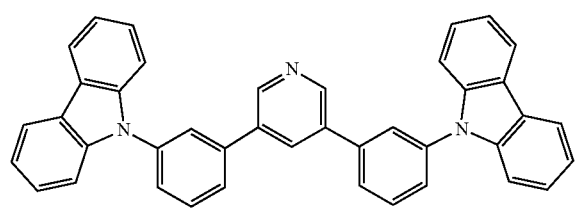
-continued
H39
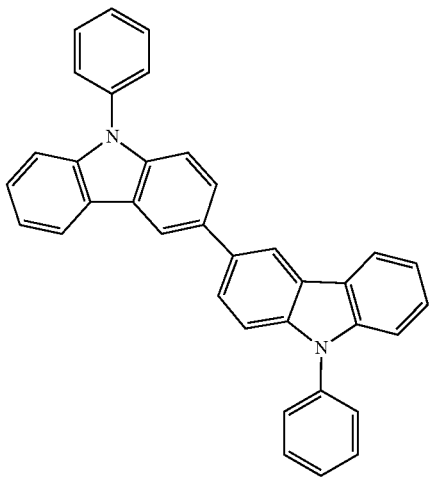
H40
H41

-continued
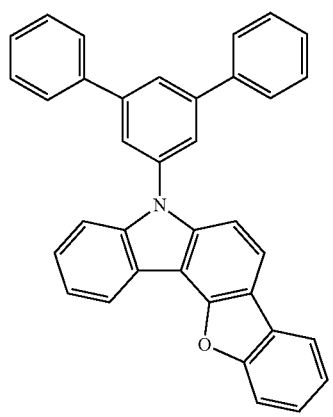
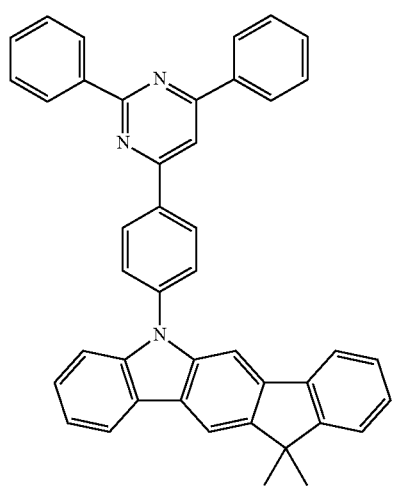
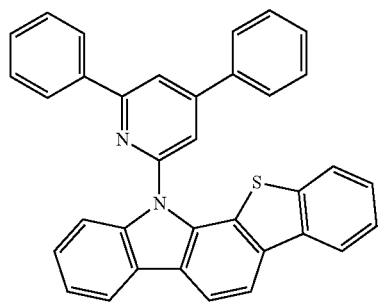
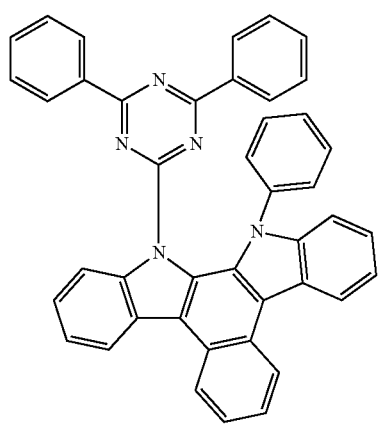
-continued
H42
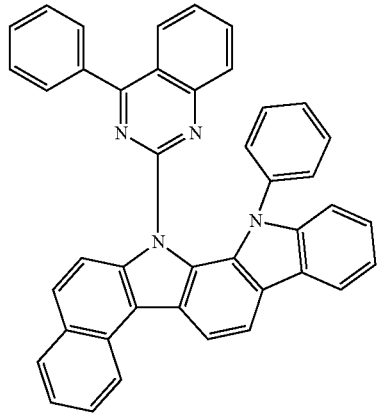
H43
H44
H45
H46
H47
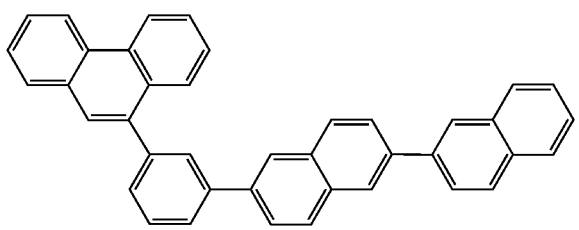
H48
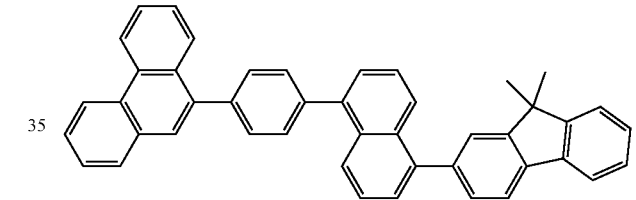
H49
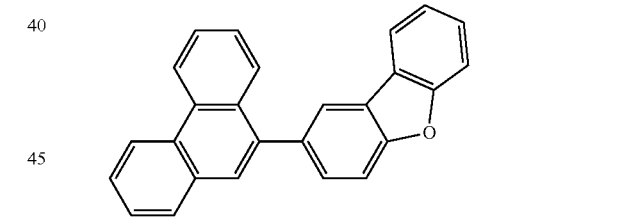
H50
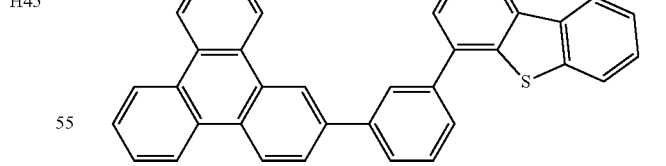
H51
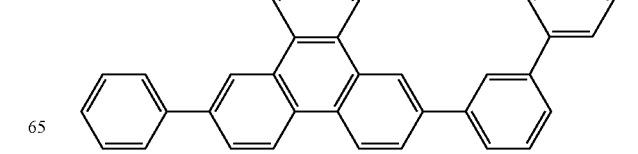

H52
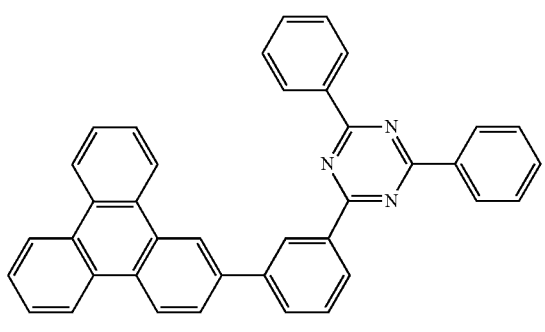
H56
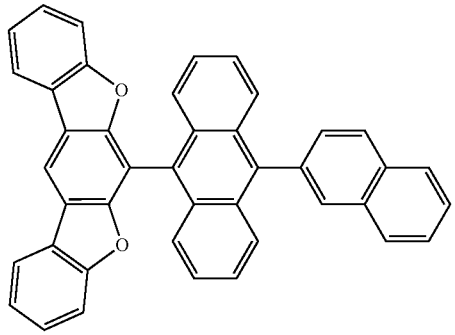
H53
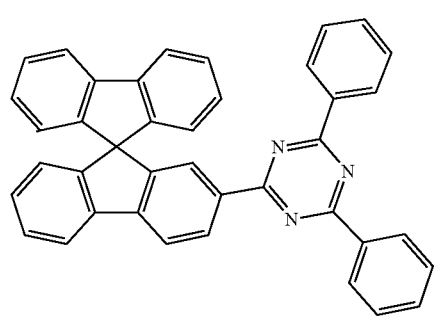
H57
H54
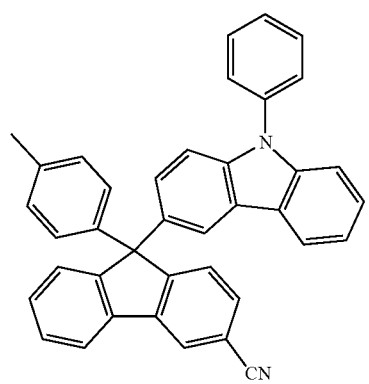
H58
H55
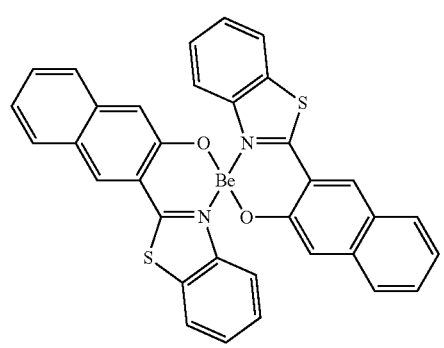
H59
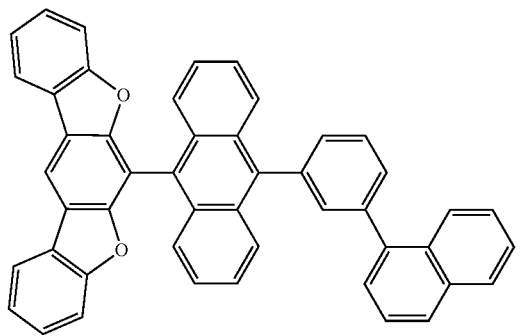

H60
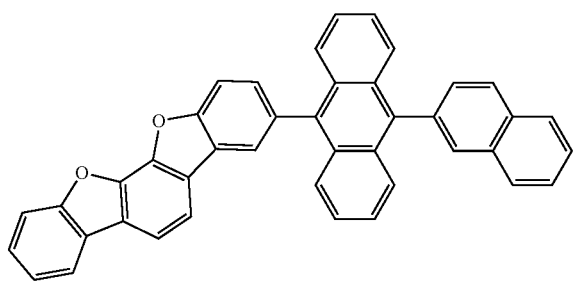
H61
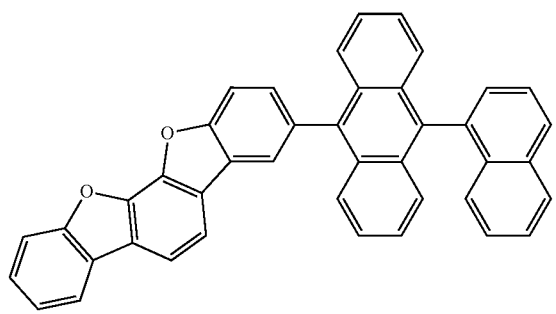
H62
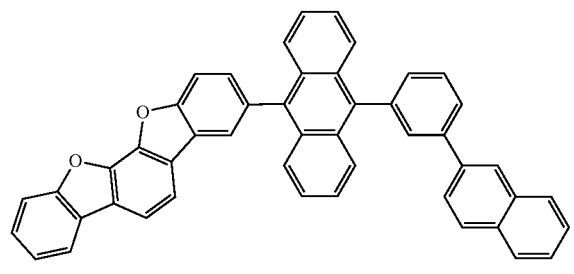
H63
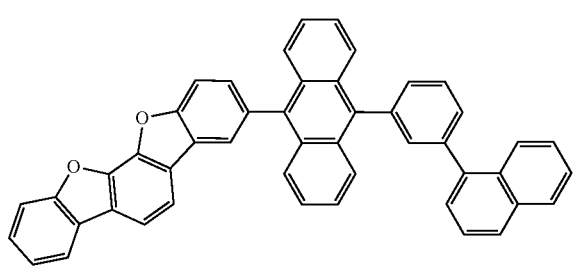
H64
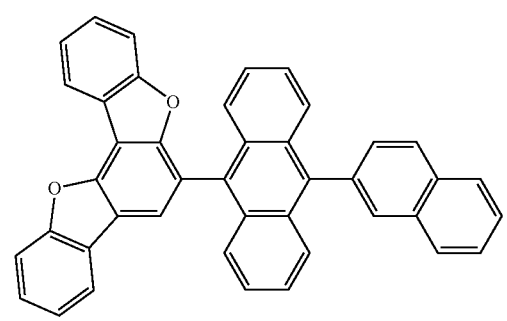
H65
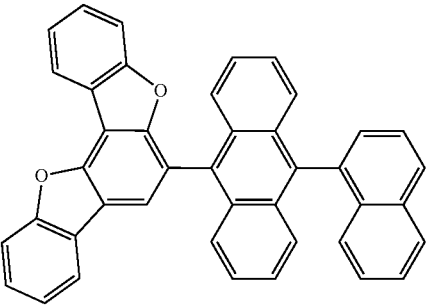
H66
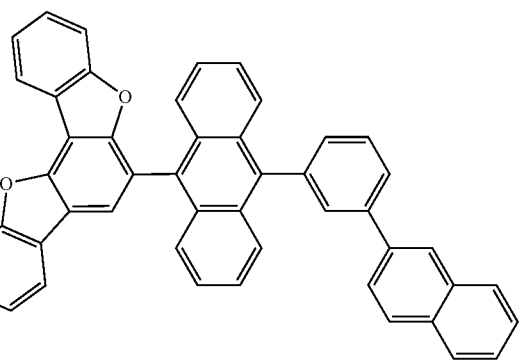
H67
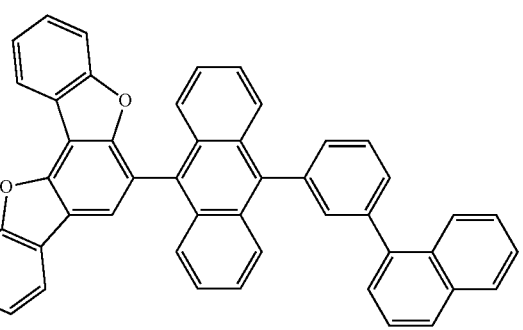
H68
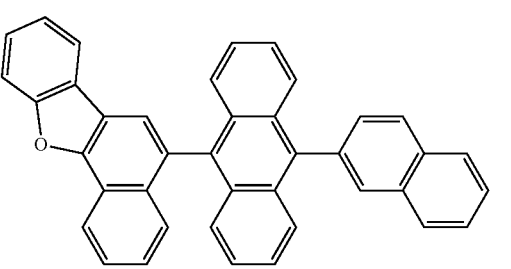
H69
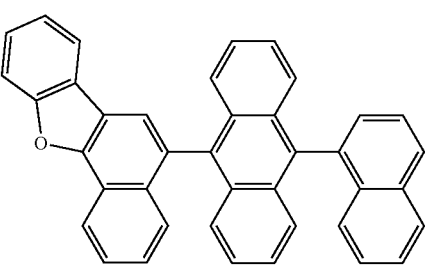

H70
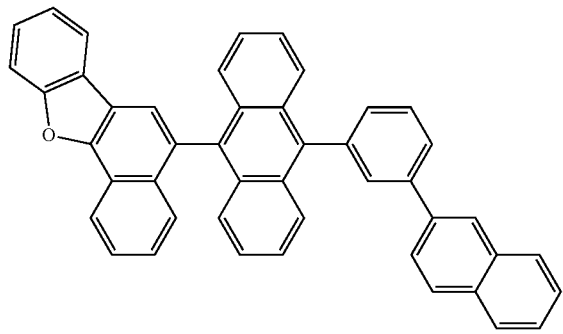
H71
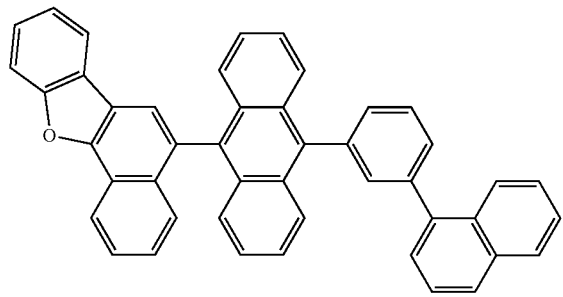
H72
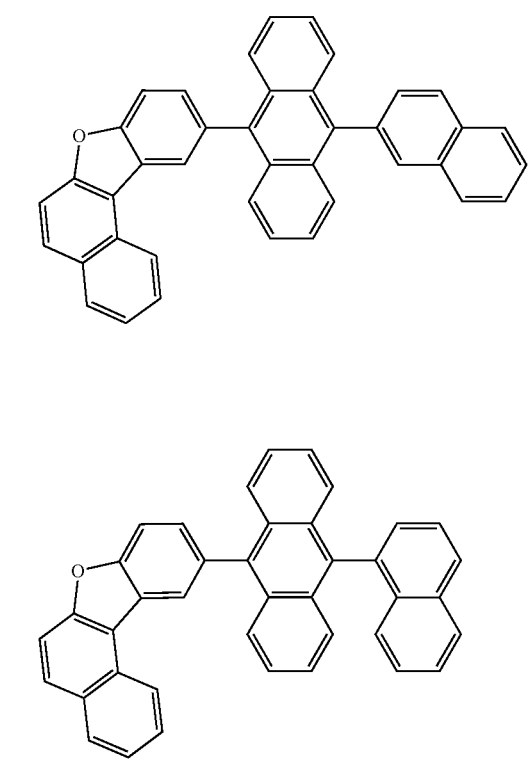
H73
H74
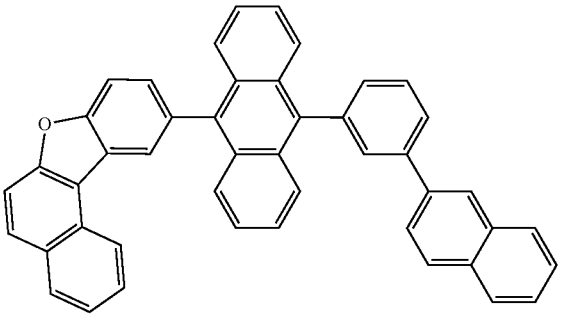
H75
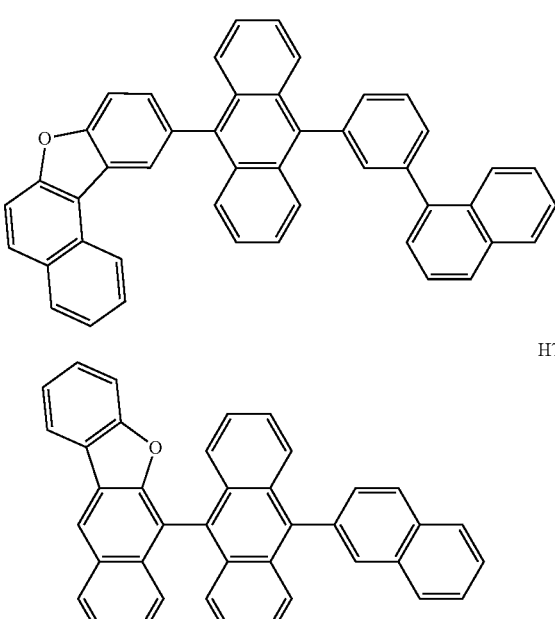
H76
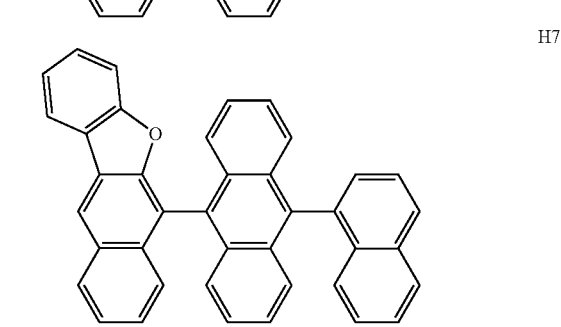
H77
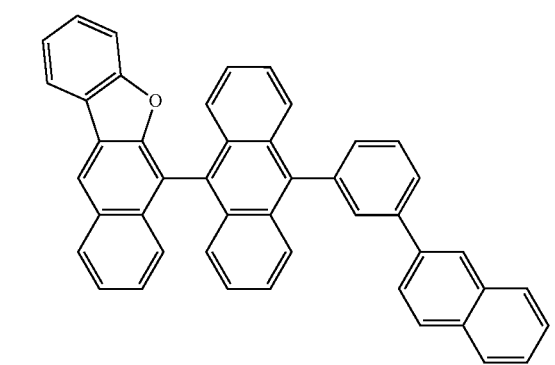
H78

-continued
H79
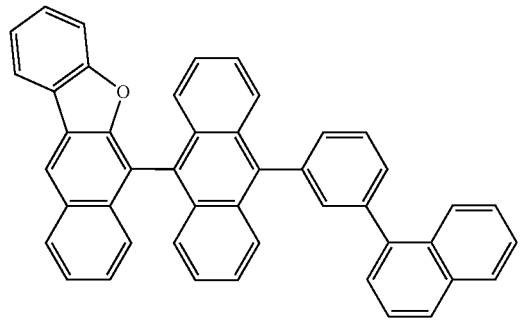
H80
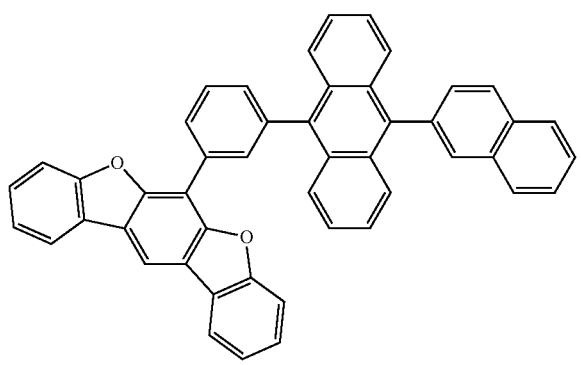
H81
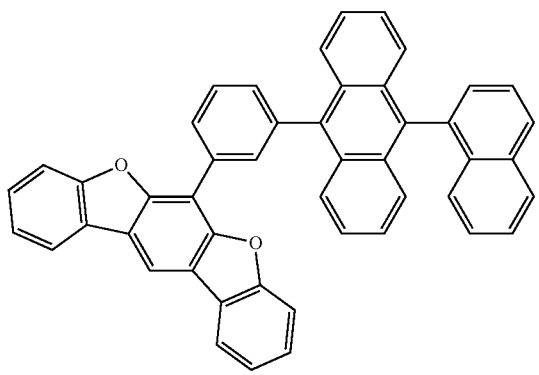
H82
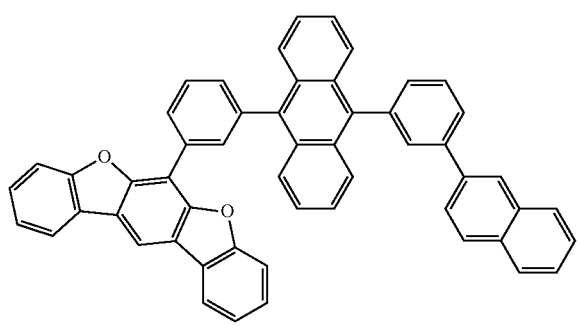
-continued
H83
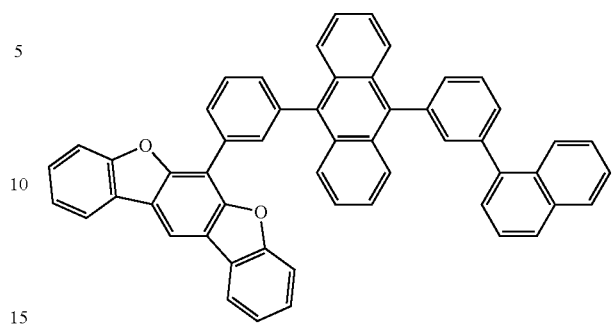
H84
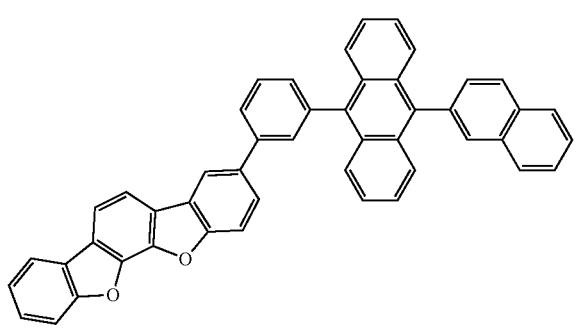
H85
H86
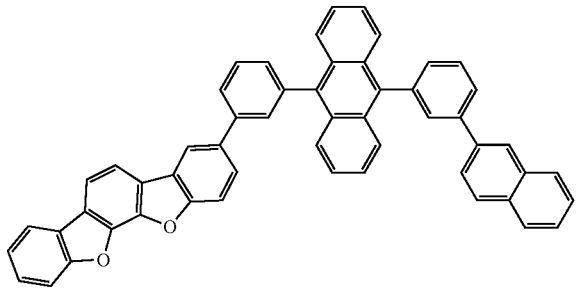

H87
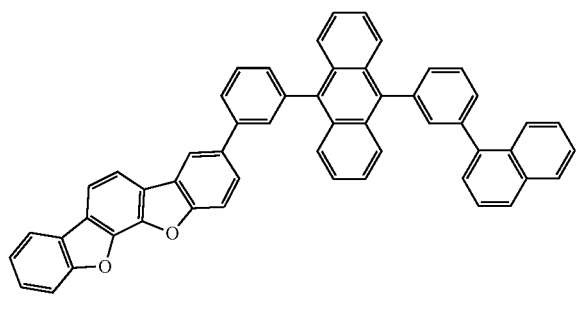
H91
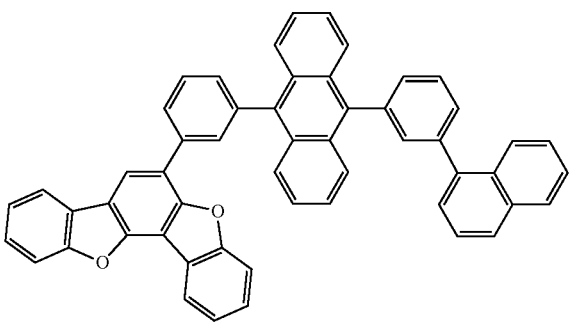
H88
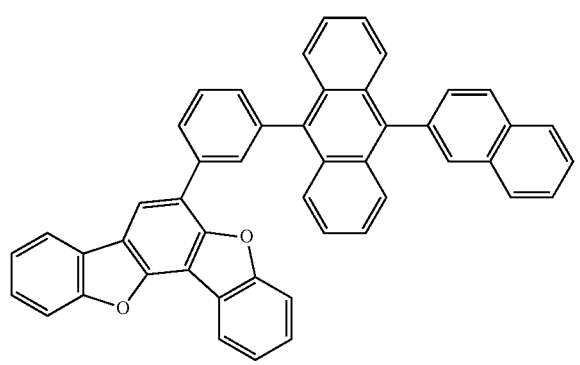
H92
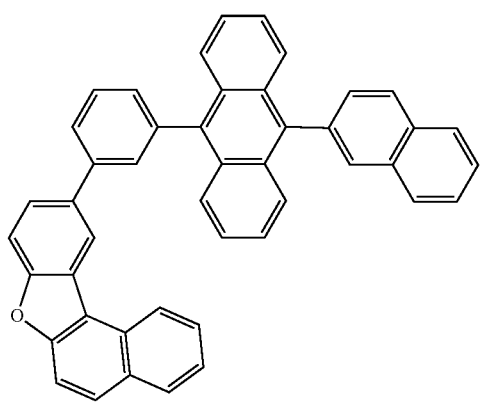
H89
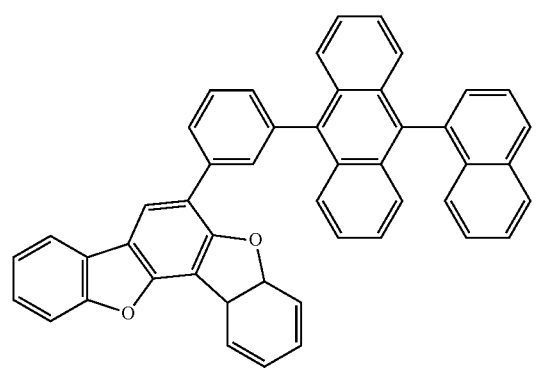
H93
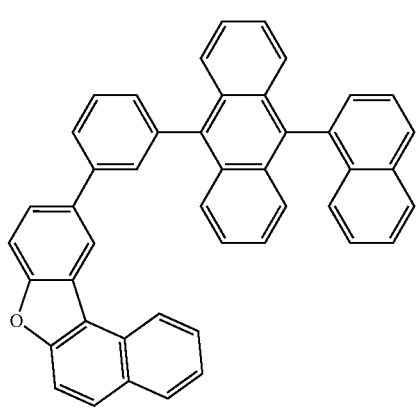
H90
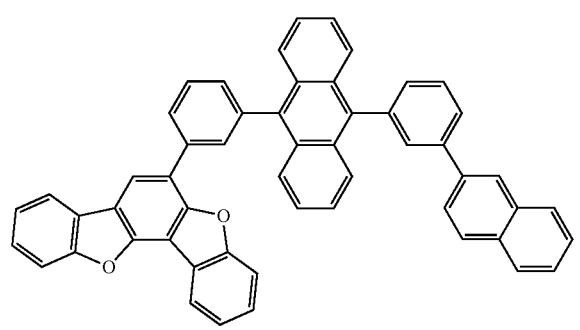
H94
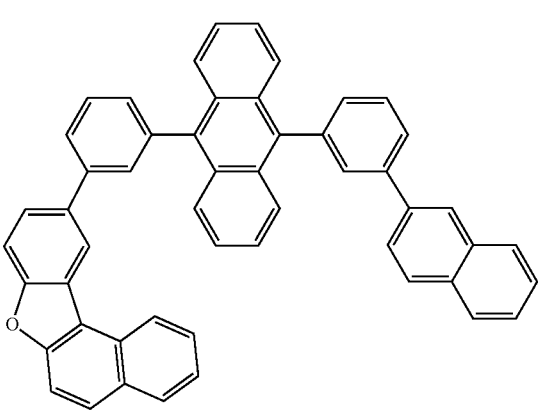

H95
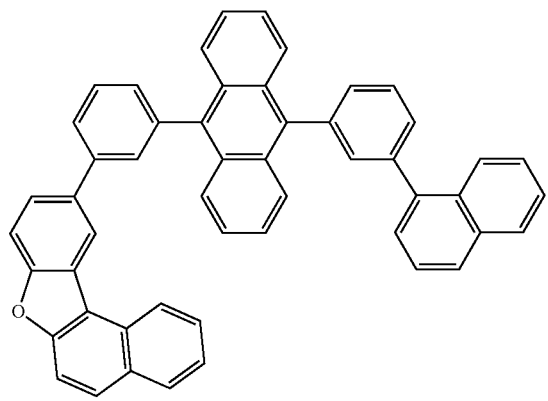
H96
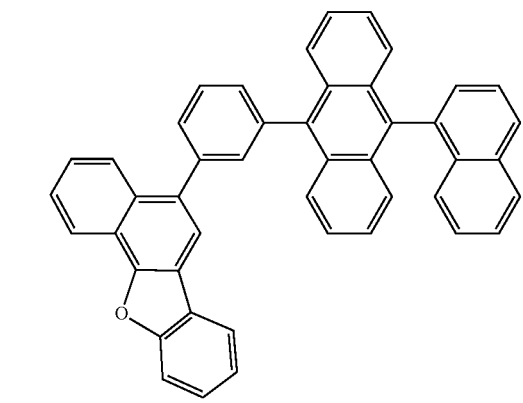
H97
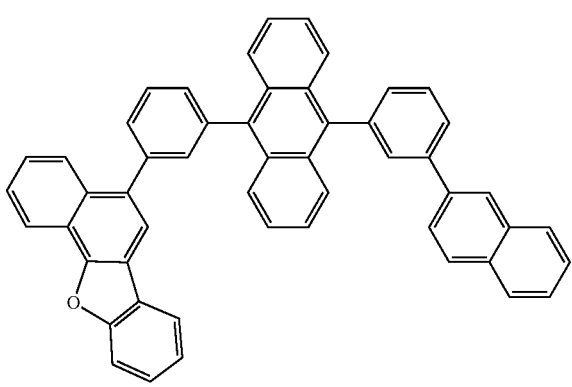
H98
H99
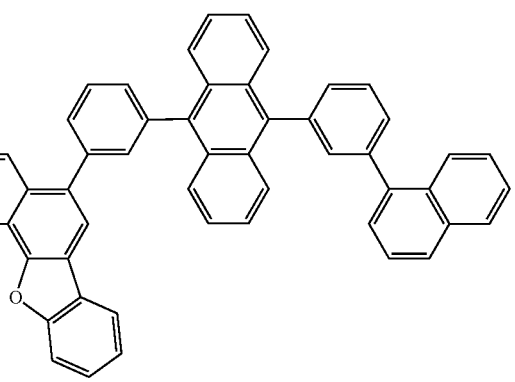
H100
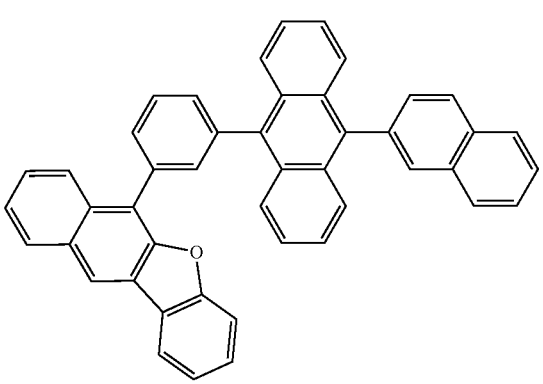
H101
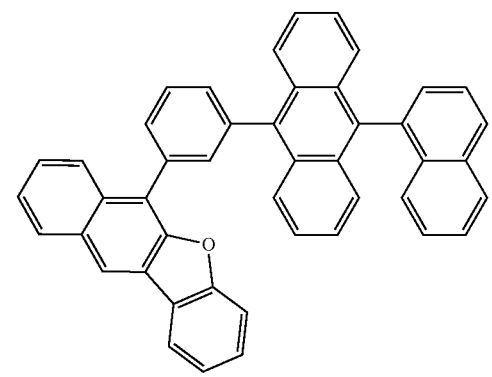
H102
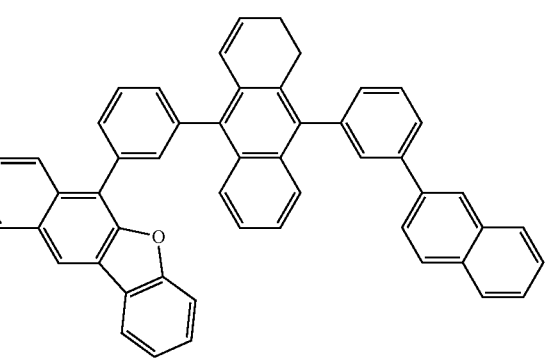

H103
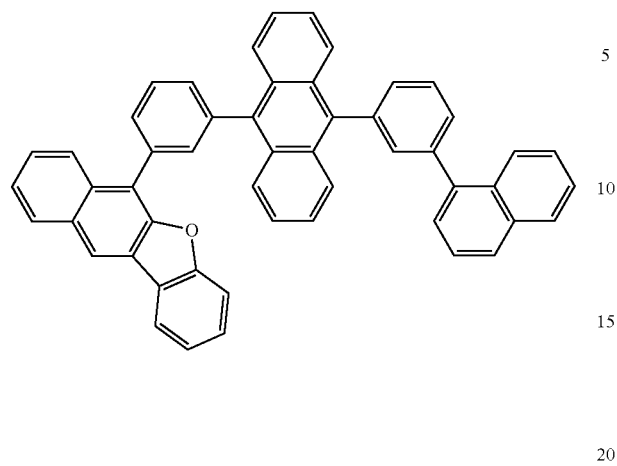
H106
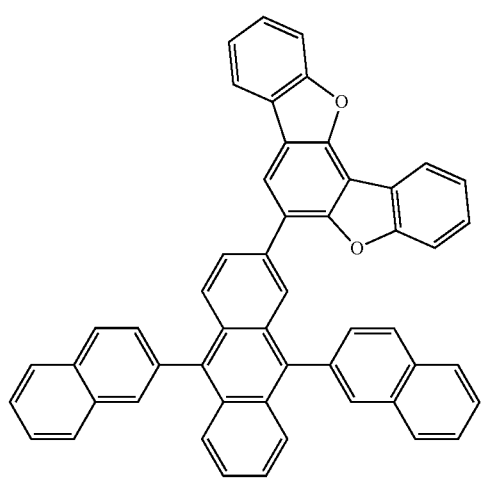
H104
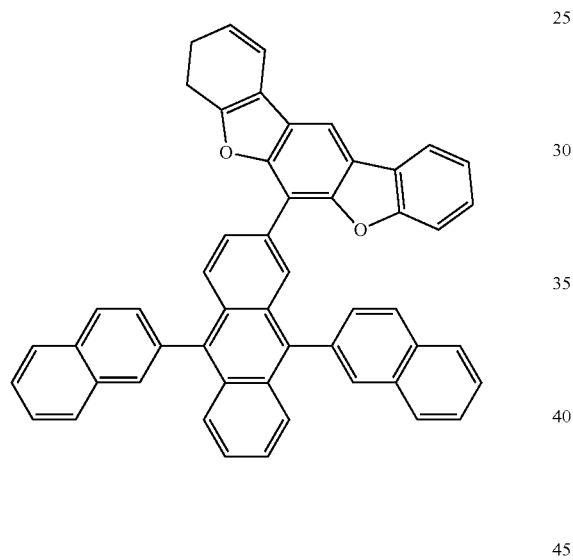
H107
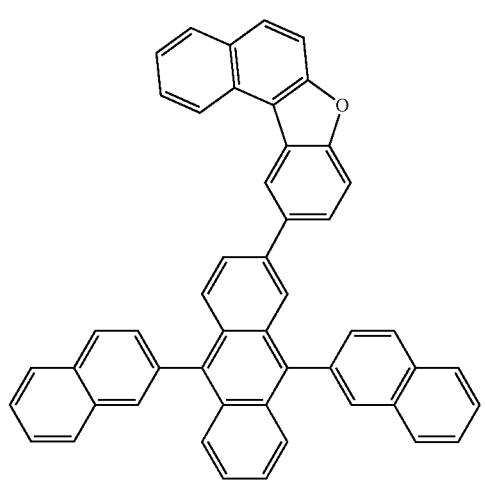
H105
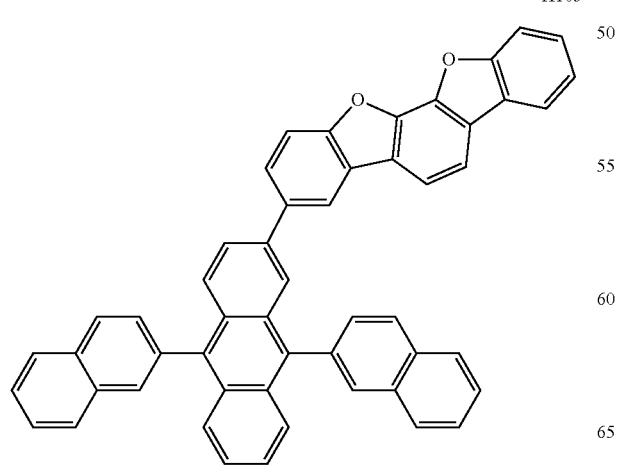
H108
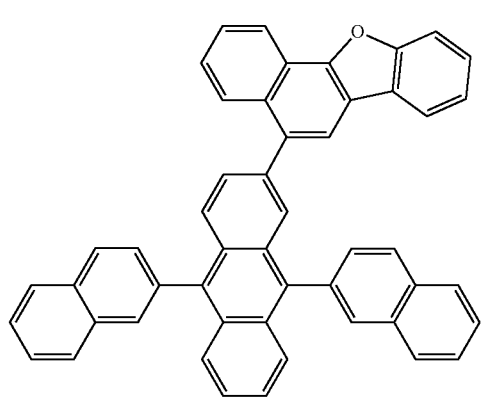

-continued
H109
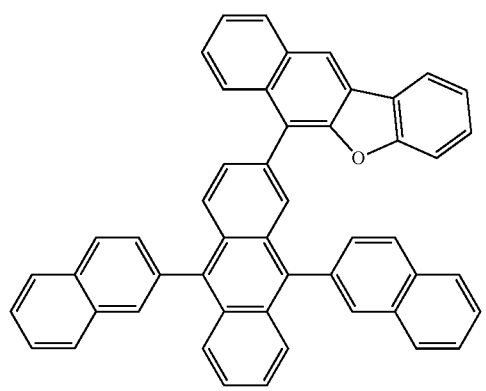
H110
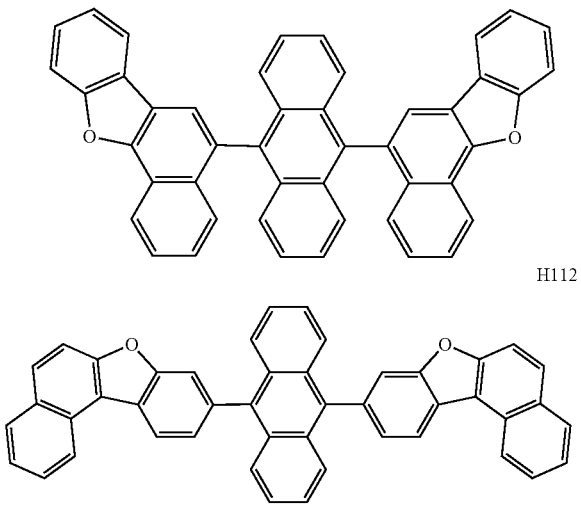
H111
H112
H113
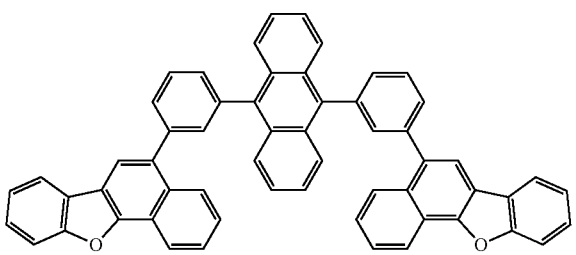
-continued
H114
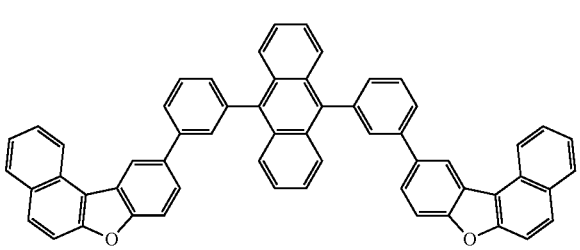
H115
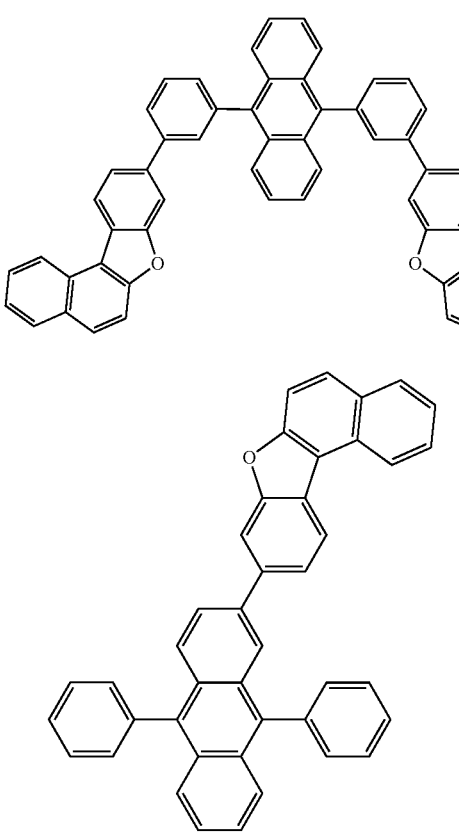
H116
H117
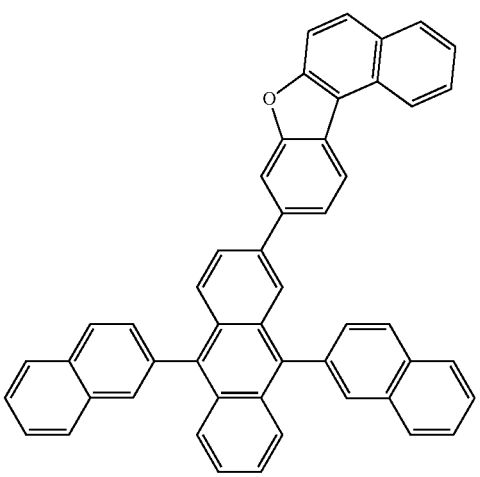

H118
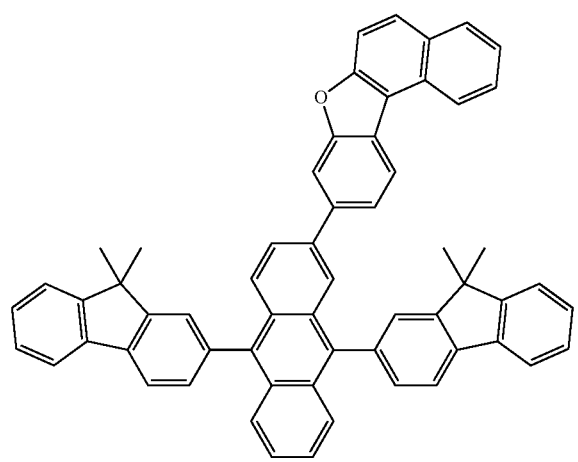
H119
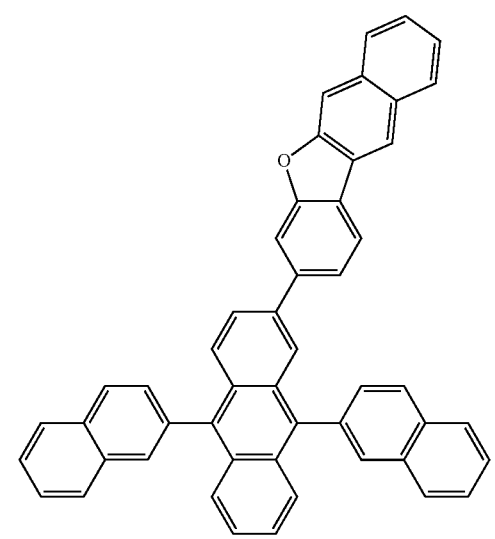
H120
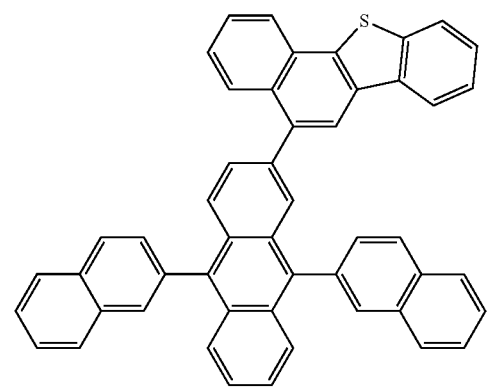
H121
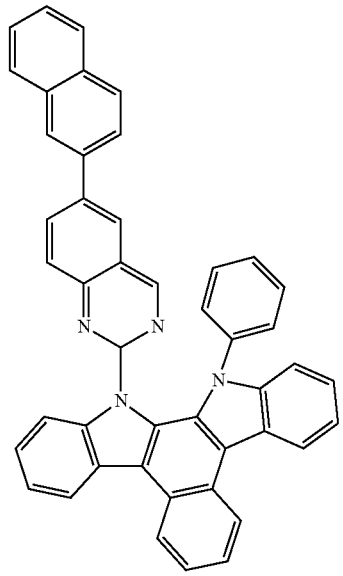
H122
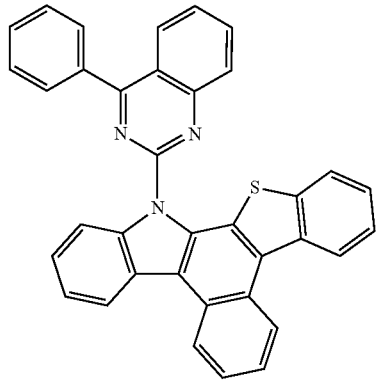
H123
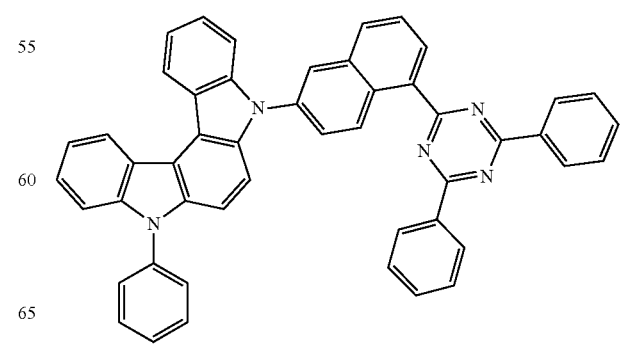

H124

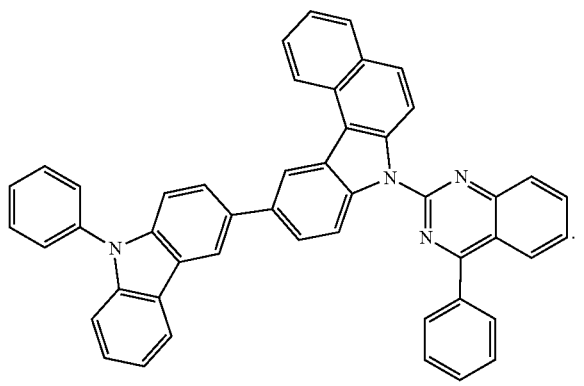

Phosphorescent Dopant

The phosphorescent dopant may include at least one transition metal as a metal center.

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

In some embodiments, the phosphorescent dopant may include an organometallic complex represented by Formula 401:

$$M(L_{401})_{xc1}(L_{402})_{xc2}$$  Formula 401

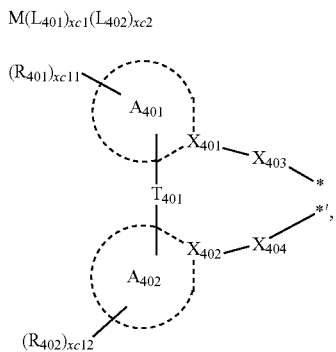

Formula 402 wherein, in Formulae 401 and 402,

M may be a transition metal (e.g., iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, and when xc1 is 2 or greater, at least two $L_{401}$(s) may be identical to or different from each other, $L_{402}$ may be an organic ligand, and xc2 may be an integer from 0 to 4, and when xc2 is 2 or greater, at least two $L_{402}$(s) may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, *—O—*', *—S—*', *—C(=O)—*', *—N($Q_{411}$)-*', *—C($Q_{411}$)($Q_{412}$)-*', *—C($Q_{411}$)=C($Q_{412}$)-*', *—C($Q_{411}$)=*', or *=C=*', $X_{403}$ and $X_{404}$ may each independently be a chemical bond (e.g., a covalent bond or a coordinate bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ may each independently be the same as $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ may each independently be the same as $Q_1$, xc11 and xc12 may each independently be an integer from 0 to 10, and

* and *' in Formula 402 each indicate a binding site to M in Formula 401.

In one or more embodiments, in Formula 402, i) $X_{401}$ may be nitrogen, and $X_{402}$ may be carbon, or ii) $X_{401}$ and $X_{402}$ may both (e.g., simultaneously) be nitrogen.

In one or more embodiments, when xc1 in Formula 401 is 2 or greater, two ring $A_{401}$(s) in the at least two $L_{401}$(s) may optionally be bound via $T_{402}$ as a linking group, or two ring $A_{402}$(s) may optionally be bound via $T_{403}$ as a linking group (▭▭▭▭▭ Compounds PD1 to PD4 and PD7). $T_{402}$ and $T_{403}$ may each independently be the same as $T_{401}$.

$L_{402}$ in Formula 401 may be any suitable organic ligand. For example, $L_{402}$ may be a halogen group, a diketone group (e.g., an acetylacetonate group), a carboxylic acid group (e.g., a picolinate group), —C(=O), an isonitrile group, —CN, or a phosphorus group (e.g., a phosphine group or a phosphite group).

The phosphorescent dopant may be, for example, one of Compounds PD1 to PD25 or any combination thereof:

PD1

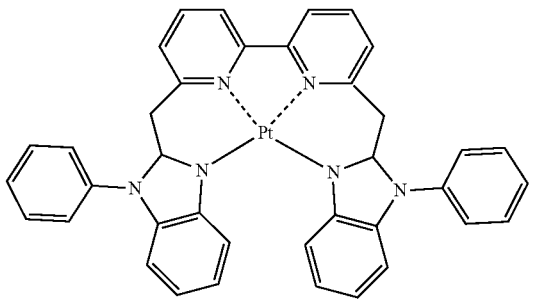

PD2

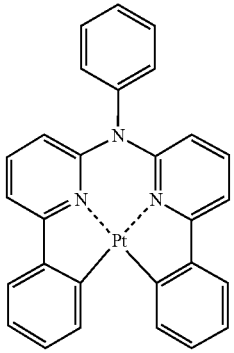

-continued
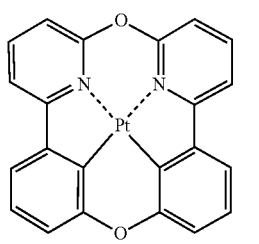
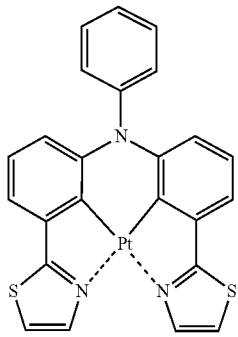
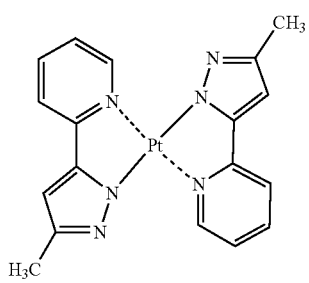
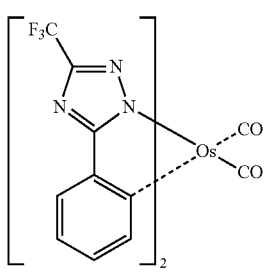
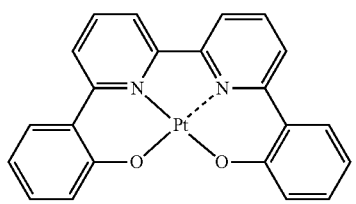
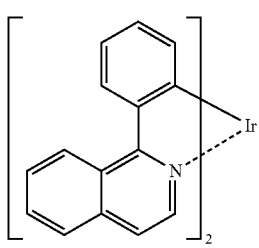
-continued
PD3
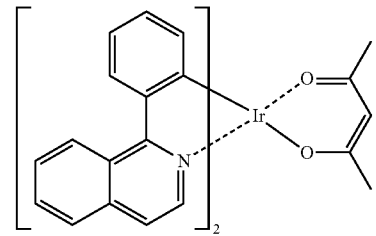
PD4
PD5
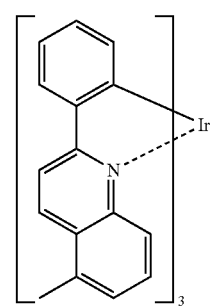
PD6
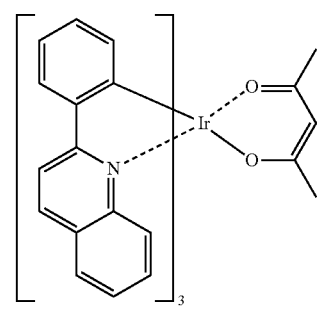
PD7
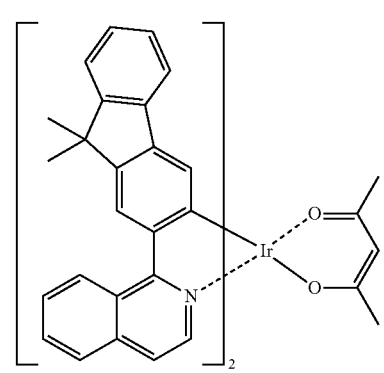
PD8
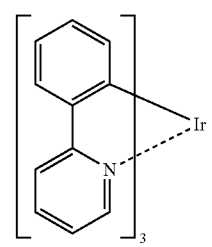
PD9
PD10
PD11
PD12
PD13

-continued
PD14
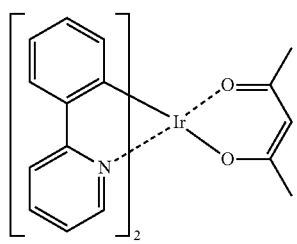
PD15
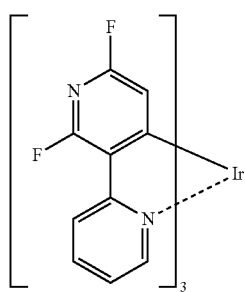
PD16
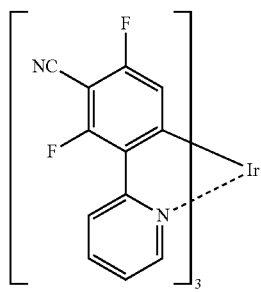
PD17
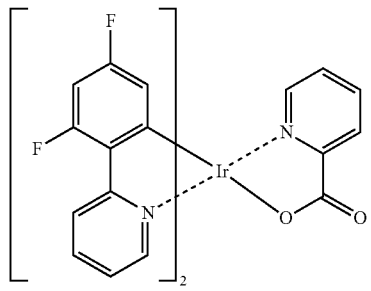
PD18
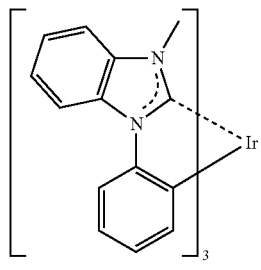
-continued
PD19
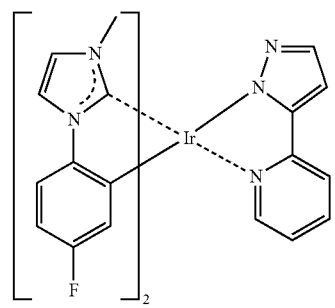
PD20
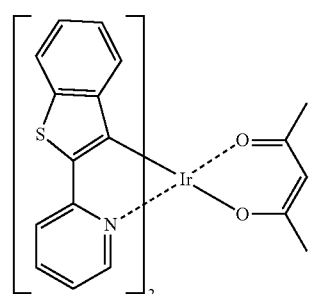
PD21
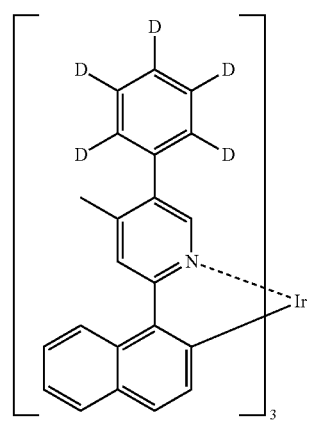
PD22
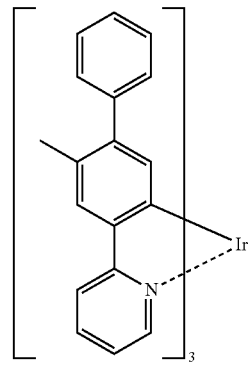

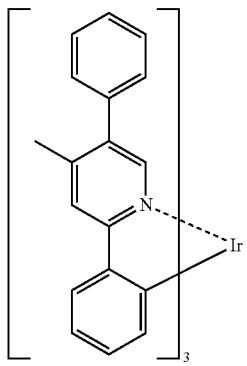

PD23

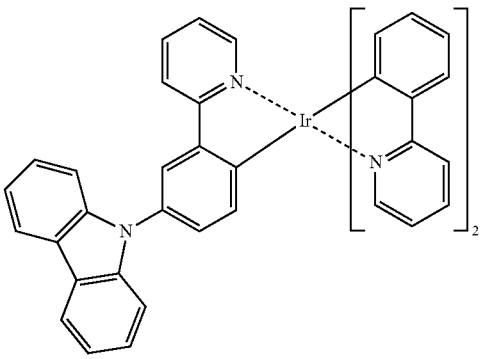

PD25

Fluorescent Dopant

The fluorescent dopant may include an amine group-containing compound, a styryl group-containing compound, or any combination thereof.

In some embodiments, the fluorescent dopant may include a compound represented by Formula 501:

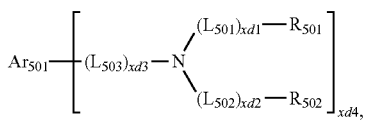

Formula 501 wherein, in Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

In some embodiments, in Formula 501, $Ar_{501}$ may include a condensed ring group (e.g., an anthracene group, a chrysene group, or a pyrene group) in which at least three monocyclic groups are condensed.

In some embodiments, xd4 in Formula 501 may be 2.

In some embodiments, the fluorescent dopant may include one of Compounds FD1 to FD36, DPVBi, DPAVBi, or any combination thereof:

PD24

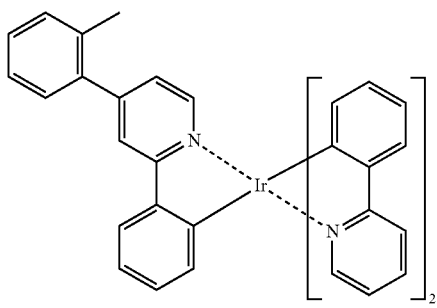

FD1

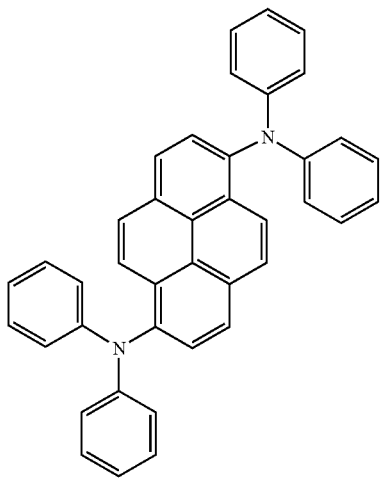

FD2

-continued
97 FD3
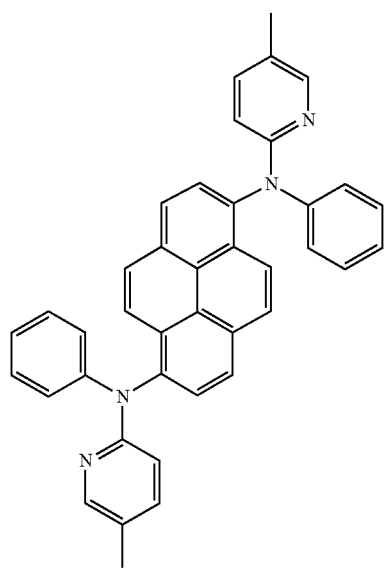
98 FD4
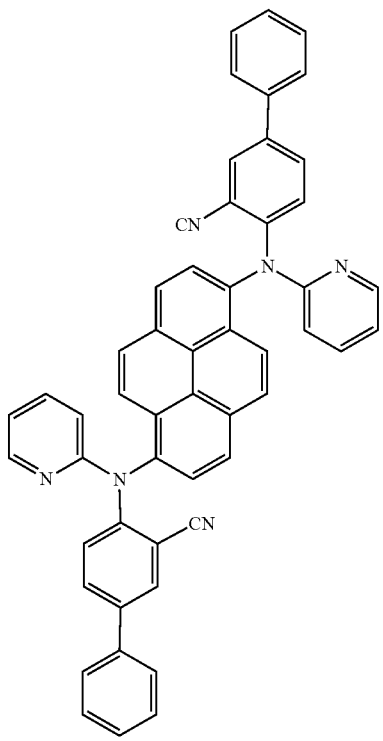
FD5
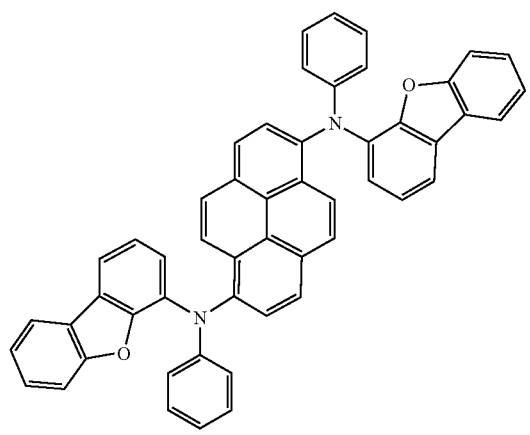
FD6
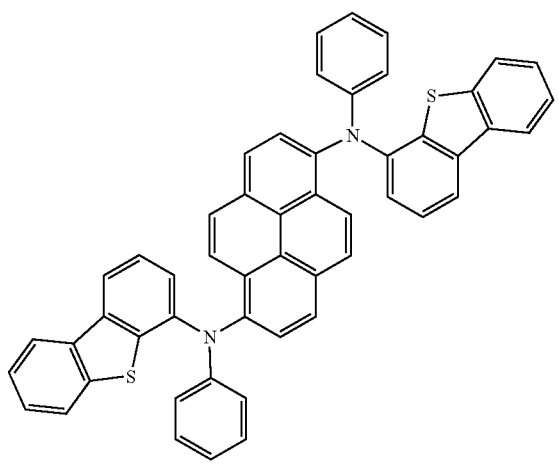

-continued
FD7
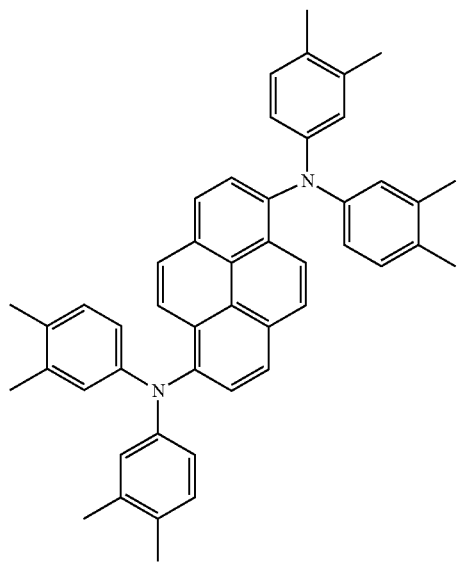
FD8
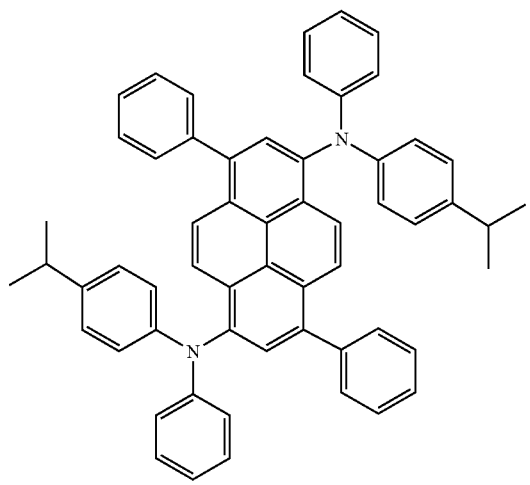
FD9
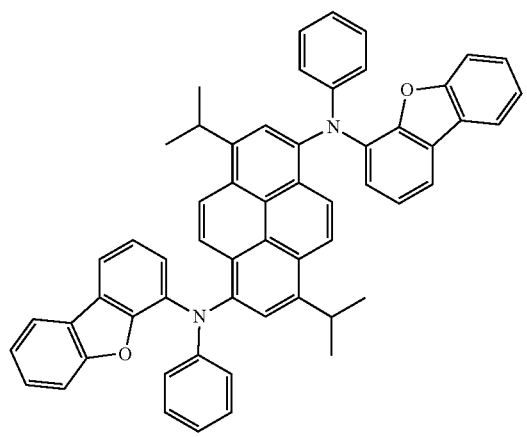
FD10
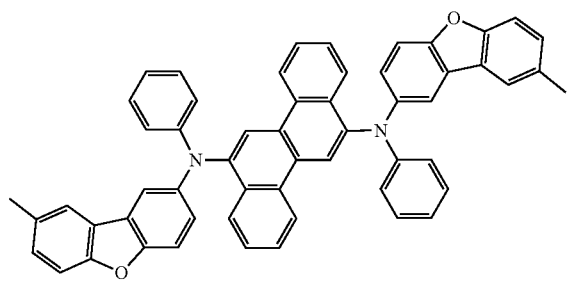
FD11
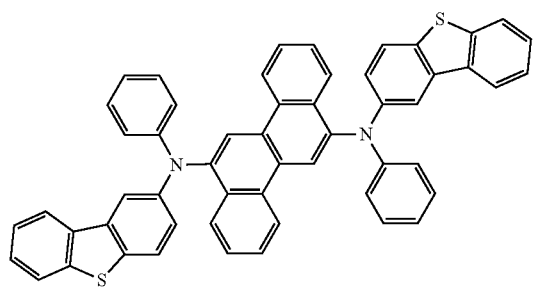
FD12
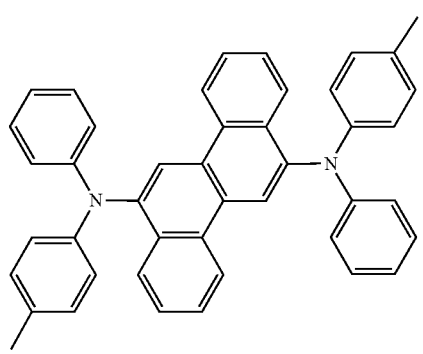

-continued
FD13
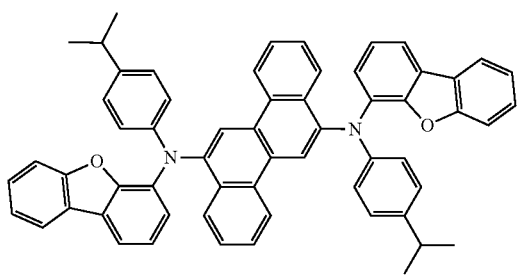
FD14
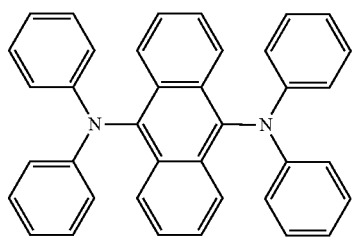
FD15
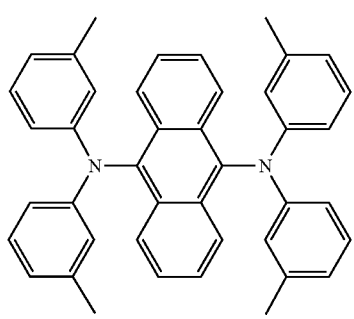
FD16
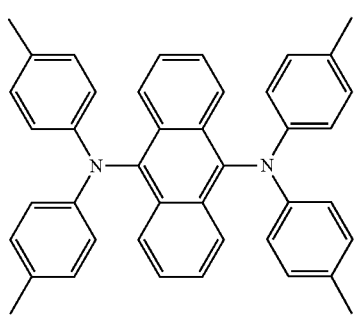
FD17
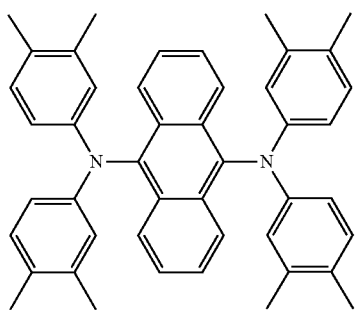
FD18
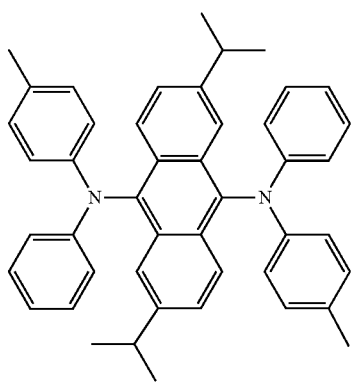
FD19
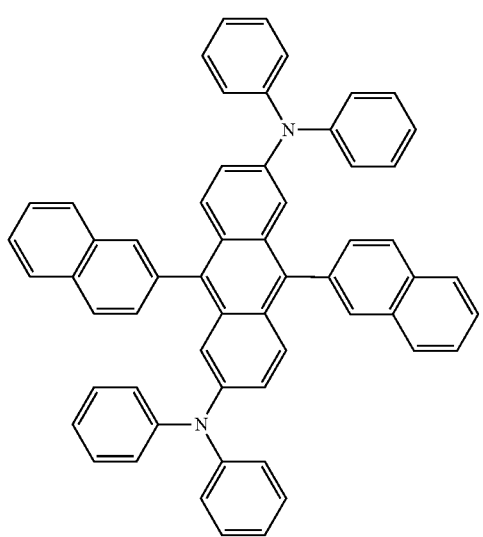
FD20
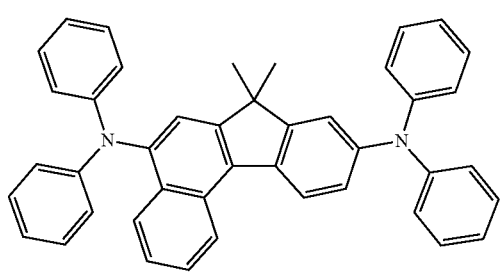

-continued
FD21
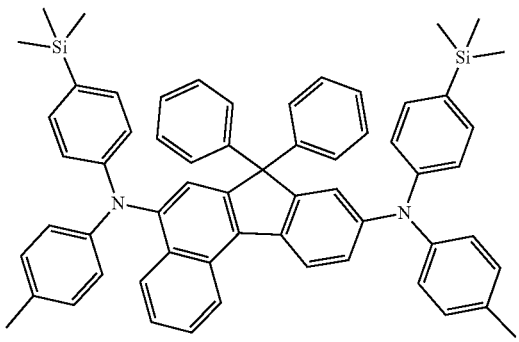
FD22
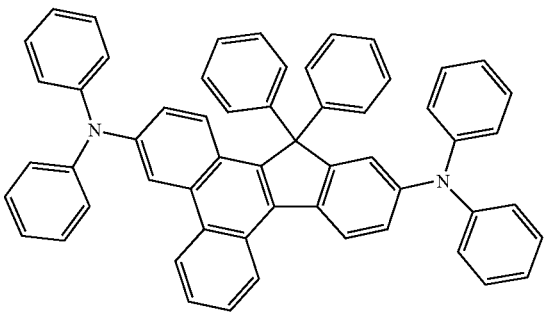
FD23
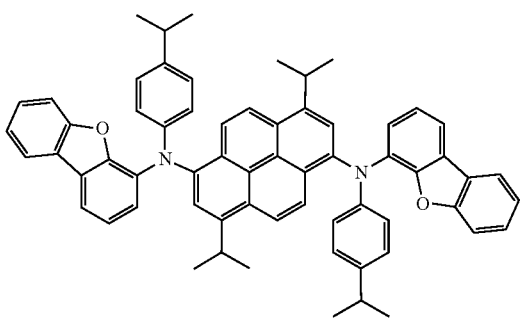
FD24
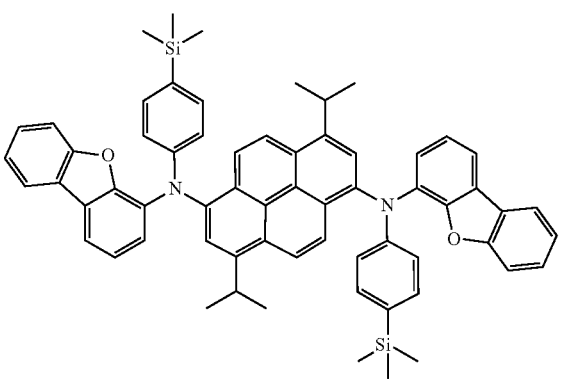
FD25
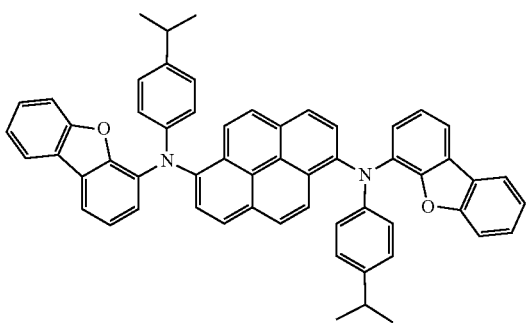
FD26
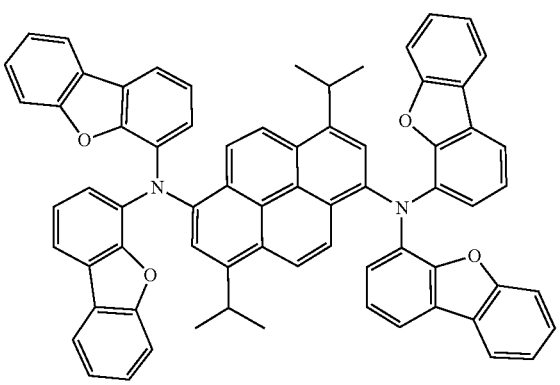
FD27
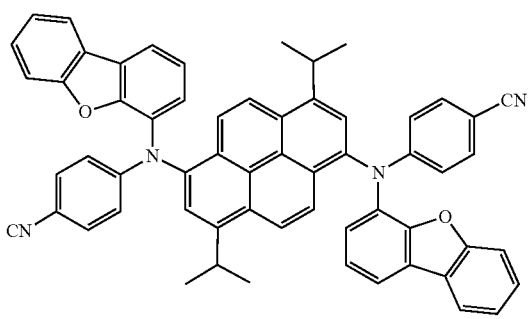
FD28
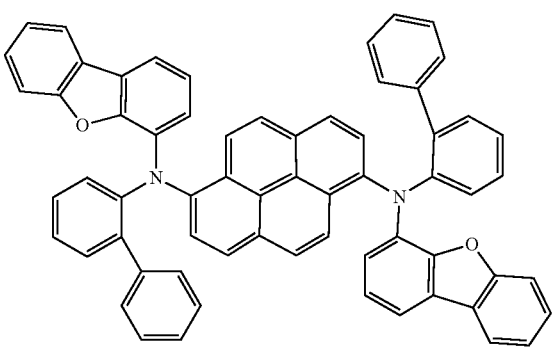

-continued
| FD29 | FD30 |
|---|---|
| 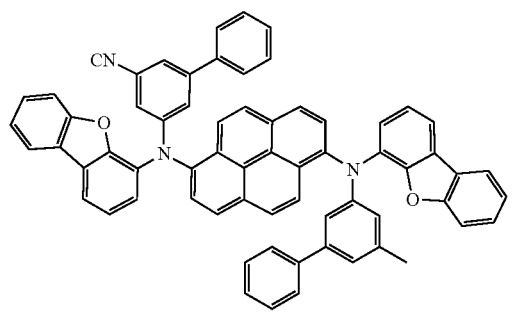 | 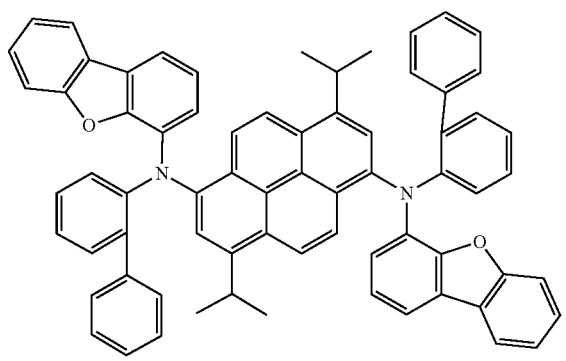 |
| FD31 | FD32 |
| 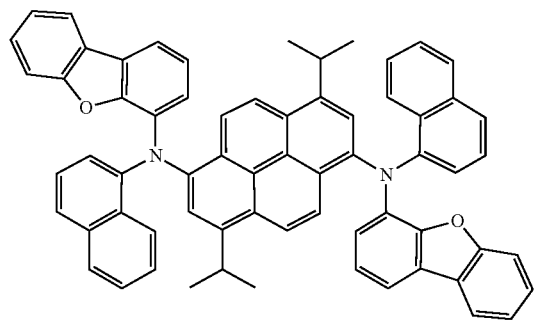 | 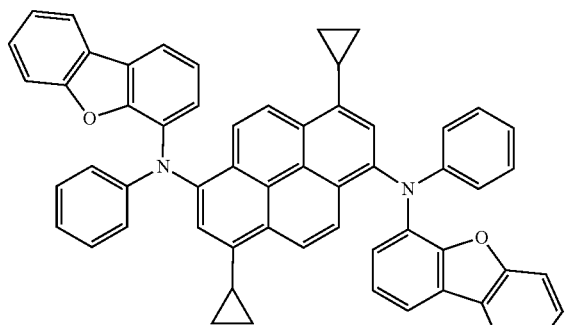 |
| FD33 | FD34 |
| | 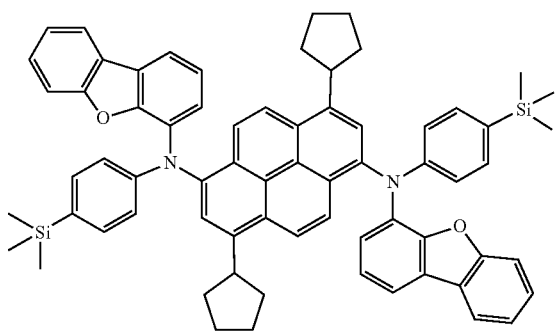 |
| FD35 | FD36 |
| 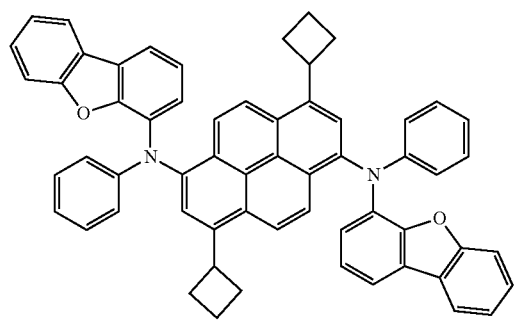 | 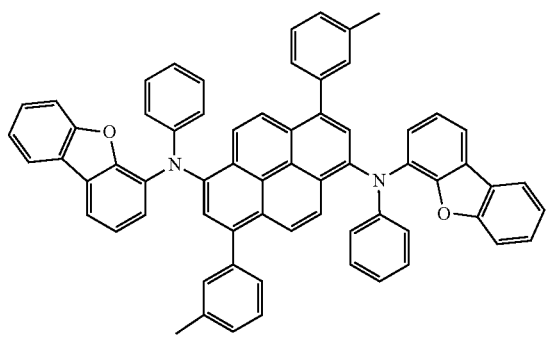 |

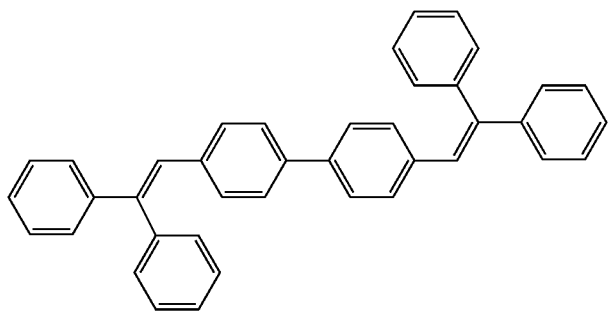

DPVBi

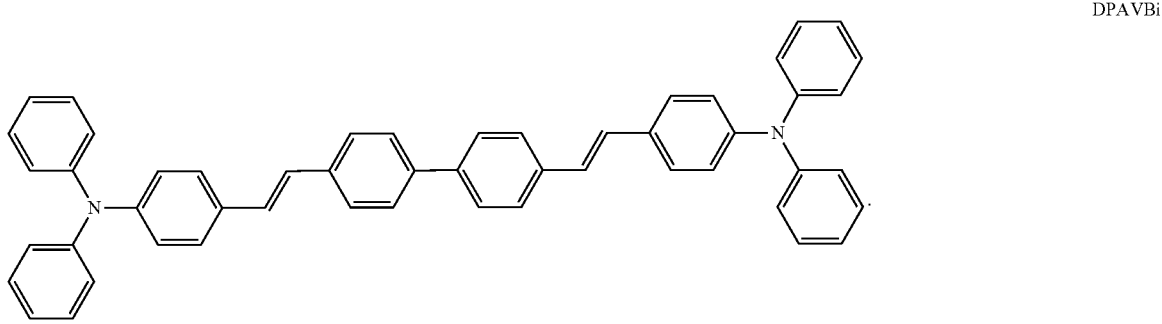

DPAVBi

Delayed Fluorescence Material

The emission layers 152-1, 152-2, and 152-3 may each include a delayed fluorescence material.

The delayed fluorescence material described herein may be any suitable compound to emit delayed fluorescence according to a delayed fluorescence emission mechanism.

The delayed fluorescence material included in the emission layers 152-1, 152-2, and 152-3 may serve as a host or a dopant, depending on the functions of other materials included in the emission layers 152-1, 152-2, and 152-3.

In some embodiments, a difference between a triplet energy level (eV) of the delayed fluorescence material and a singlet energy level (eV) of the delayed fluorescence material may be about 0 eV or greater and about 0.5 eV or smaller. When the difference between a triplet energy level (eV) of the delayed fluorescence material and a singlet energy level (eV) of the delayed fluorescence material is within this range, up-conversion from a triplet state to a singlet state in the delayed fluorescence material may be enhanced, thus improving luminescence efficiency and/or the like of the light-emitting device 10.

In some embodiments, the delayed fluorescence material may include: i) a material including at least one electron donor (e.g., a π electron-rich $C_3$-$C_{60}$ cyclic group, such as a carbazole group and/or the like) and at least one electron acceptor (e.g., a sulfoxide group, a cyano group, a π electron-deficient nitrogen-containing $C_1$-$C_{60}$ cyclic group, and/or the like), ii) a material including a $C_8$-$C_{60}$ polycyclic group including at least two cyclic groups condensed to each other and sharing boron (B), and/or the like.

Non-limiting examples of the delayed fluorescence material include at least one of Compounds DF1 to DF9:

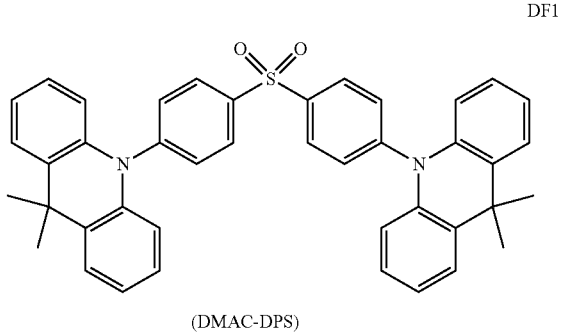

DF1

(DMAC-DPS)

-continued
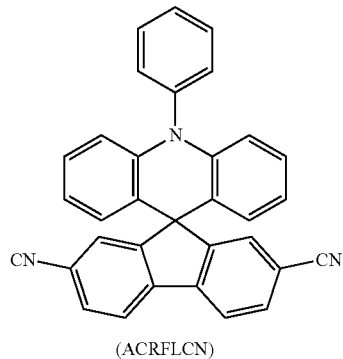
(ACRFLCN)
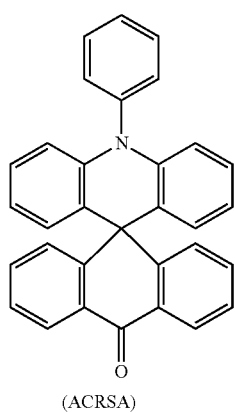
(ACRSA)
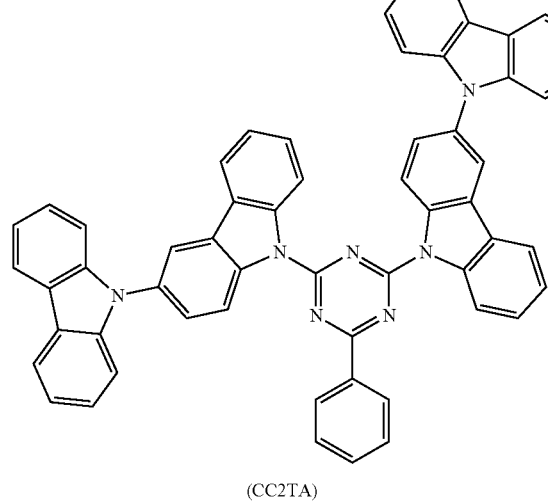
(CC2TA)
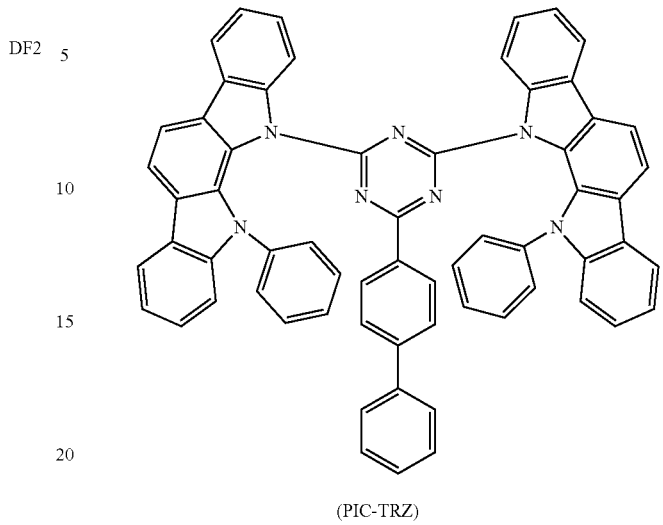
(PIC-TRZ)
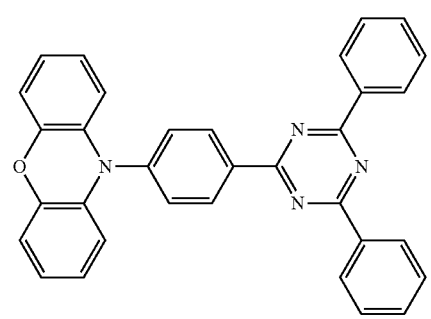
(PIC-TRZ2)
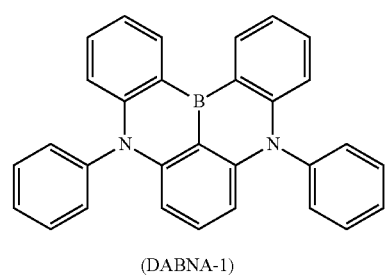
(PXZ-TRZ)
(DABNA-1)

-continued

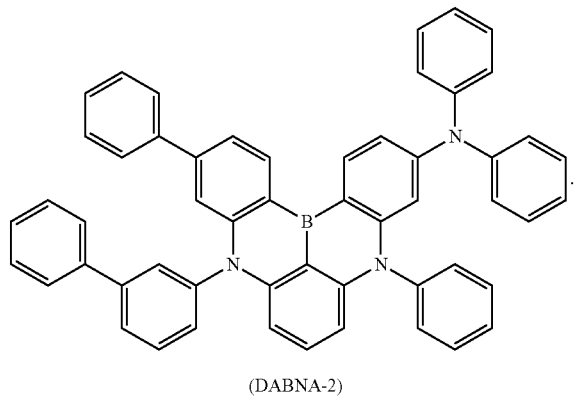

(DABNA-2)

Quantum Dot

In some embodiments, the emission layers 152-1, 152-2, and 152-3 may each include quantum dots.

The term "quantum dot" as used herein refers to a crystal of any suitable semiconductor compound material capable of emitting emission wavelengths of various lengths according to the size of the crystal.

The diameter of the quantum dot may be, for example, about 1 nm to about 10 nm.

The quantum dots may be synthesized by a wet chemical process, a metal organic chemical vapor deposition process, a molecular beam epitaxy process, or any suitable process.

The wet chemical process is a method of growing a quantum dot particle crystal by mixing a precursor material with an organic solvent. When the crystal grows, the organic solvent may naturally serve as a dispersant coordinated on the surface of the quantum dot crystal, and may thereby control the growth of the crystal. Thus, the wet chemical process may be easier than the vapor deposition process (such as the metal organic chemical vapor deposition (MOCVD) or the molecular beam epitaxy (MBE) process). Further, the growth of quantum dot particles may be controlled with a lower manufacturing cost.

The quantum dot may include a II-VI group semiconductor compound; a III-V group semiconductor compound; a III-VI group semiconductor compound; a I-III-VI group semiconductor compound; a IV-VI group semiconductor compound; a IV group element or compound; or any combination thereof.

Non-limiting examples of the II-VI group semiconductor compound include a binary compound (such as CdS, CdSe, CdTe, ZnS, ZnSe, ZnTe, ZnO, HgS, HgSe, HgTe, MgSe, and/or MgS); a ternary compound (such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and/or MgZnS); a quaternary compound (such as CdZnSeS, CdZnSeTe, CdZnSTe, CdHgSeS, CdHgSeTe, CdHgSTe, HgZnSeS, HgZnSeTe, and/or HgZnSTe); or any combination thereof.

Non-limiting examples of the III-V group semiconductor compound include a binary compound (such as GaN, GaP, GaAs, GaSb, AlN, AlP, AlAs, AlSb, InN, InP, InAs, and/or InSb); a ternary compound (such as GaNP, GaNAs, GaNSb, GaPAs, GaPSb, AlNP, AlNAs, AlNSb, AlPAs, AlPSb, InGaP, InNP, InNAs, InAlP, InNAs, InNSb, InPAs, InPSb, and/or GaAlNP); a quaternary compound (such as GaAlNAs, GaAlNSb, GaAlPAs, GaAlPSb, GaInNP, GaInNAs, GaInNSb, GaInPAs, GaInPSb, InAlNP, InAlNAs, InAl-NSb, InAlPAs, and/or InAlPSb); or any combination thereof. In some embodiments, the III-V group semiconductor compound may further include a II group element. Non-limiting examples of the III-V group semiconductor compound further including the II group element include InZnP, InGaZnP, InAlZnP, and the like.

Non-limiting examples of the III-VI group semiconductor compound include a binary compound (such as GaS, GaSe, $Ga_2Se_3$, GaTe, InS, InSe, $In_2S_3$, $In_2Se_3$, InTe, and/or the like); a ternary compound (such as $InGaS_3$, $InGaSe_3$, and/or the like); and any combination thereof.

Non-limiting examples of the I-III-VI group semiconductor compound include a ternary compound (such as AgInS, $AgInS_2$, CuInS, $CuInS_2$, $CuGaO_2$, $AgGaO_2$, $AgAlO_2$, and/or any combination thereof).

Non-limiting examples of the IV-VI group semiconductor compound include a binary compound (such as SnS, SnSe, SnTe, PbS, PbSe, and/or PbTe); a ternary compound (such as SnSeS, SnSeTe, SnSTe, PbSeS, PbSeTe, PbSTe, SnPbS, SnPbSe, and/or SnPbTe); a quaternary compound (such as SnPbSSe, SnPbSeTe, and/or SnPbSTe); and any combination thereof.

The IV group element or compound may be a single element compound (such as Si or Ge); a binary compound (such as SiC and/or SiGe); or any combination thereof.

Each element included in the multi-element compound (such as the binary compound, the ternary compound, and the quaternary compound), may be present in a particle (e.g., a quantum dot) thereof at a substantially uniform or non-uniform concentration.

The quantum dot may have a single structure, in which the concentration of each element included in the quantum dot is substantially uniform, or a core-shell double structure, in which a shell surrounds a core. In some embodiments, materials included in the core may be different from materials included in the shell.

The shell of the quantum dot may serve as a protective layer to prevent or reduce chemical denaturation of the core, in order to maintain semiconductor characteristics and/or as a charging layer for imparting electrophoretic characteristics to the quantum dot. The shell may be monolayer or multi-layer. An interface between a core and a shell may have a concentration gradient in which a concentration of elements present in the shell decreases toward the core.

Non-limiting examples of the shell material of the quantum dot include a metal oxide, a metalloid oxide, a nonmetal oxide, a semiconductor compound, and a combination thereof. Non-limiting examples of the metal oxide, metalloid oxide, or nonmetal oxide include: a binary compound (such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO); a ternary compound (such as $MgAl_2O_4$, $CoFe_2O_4$, $NiFe_2O_4$, and/or $CoMn_2O_4$); and any combination thereof. Non-limiting examples of the semiconductor compound include a II-VI group semiconductor compound; a III-V group semiconductor compound; a III-VI group semiconductor compound; a I-III-VI group semiconductor compound; a IV-VI group semiconductor compound; and any combination thereof. In some embodiments, the semiconductor compound may be CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

The quantum dot may have an emission wavelength spectral full width at half maximum (FWHM) of about 45 nm or less, about 40 nm or less, or about 30 nm or less. When the FWHM of the quantum dot is within this range, color purity or color reproducibility may be improved. In addition, because light emitted by the quantum dot is emitted in all directions, an optical viewing angle may be improved.

In some embodiments, the quantum dot may be a spherical, pyramidal, multi-arm, and/or cubic nanoparticle, nanotube, nanowire, nanofiber, and/or nanoplate particle.

By adjusting the size of the quantum dot, the energy band gap may also be adjusted, thereby yielding light of various suitable wavelengths in the quantum dot emission layer. By using quantum dots of various sizes, a light-emitting device that may emit light of various wavelengths may be realized. In some embodiments, the size of the quantum dot may be selected such that the quantum dot may be to emit red, green, and/or blue light. In addition, the size of the quantum dot may be selected such that the quantum dot may be to emit white light by combining various light of colors.

Electron Transport Regions 153-1, 153-2, and 153-3 in Interlayer 150

The electron transport regions 153-1, 153-2, and 153-3 may have i) a single-layered structure including (e.g., consisting of) a single material, ii) a single-layered structure including a plurality of different materials, or iii) a multi-layered structure having a plurality of layers including a plurality of different materials.

The electron transport regions 153-1, 153-2, and 153-3 may respectively include a buffer layer, a hole blocking layer, an electron control layer, an electron transport layer 153-1a, 153-2a, and 153-3a, an electron injection layer 153-1b, 153-2b, and 153-3b, or any combination thereof.

In some embodiments, the electron transport regions 153-1, 153-2, and 153-3 may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein layers of each structure are sequentially stacked on the emission layer in each stated order.

The electron transport region (e.g., a buffer layer, a hole blocking layer, an electron control layer, and/or an electron transport layer in the electron transport region) may include a metal-free compound including at least one π electron-deficient nitrogen-containing $C_1$-$C_{60}$ cyclic group.

In some embodiments, the electron transport regions 153-1, 153-2, and 153-3 may each include a compound represented by Formula 601:

$$[Ar_{601}]_{xe11}\text{-}[(L_{601})_{xe1}\text{-}R_{601}]_{xe21},\qquad\text{Formula 601}$$

wherein, in Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, $-Si(Q_{601})(Q_{602})(Q_{603})$, $-C(=O)(Q_{601})$, $-S(=O)_2(Q_{601})$, or $-P(=O)(Q_{601})(Q_{602})$, $Q_{601}$ to $Q_{603}$ may each independently be the same as $Q_1$, xe21 may be 1, 2, 3, 4, or 5, and at least one of $Ar_{601}$, $L_{601}$, or $R_{601}$ may each independently be a π electron-deficient nitrogen-containing $C_1$-$C_{60}$ cyclic group unsubstituted or substituted with at least one $R_{10a}$.

In some embodiments, when xe11 in Formula 601 is 2 or greater, at least two $Ar_{601}$(s) may be bound via a single bond.

In some embodiments, in Formula 601, $Ar_{601}$ may be a substituted or unsubstituted anthracene group.

In some embodiments, the electron transport regions 153-1, 153-2, and 153-3 may each include a compound represented by Formula 601-1:

Formula 601-1

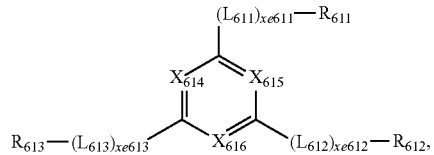

wherein, in Formula 601-1, $X_{614}$ may be N or $C(R_{614})$, $X_{615}$ may be N or $C(R_{615})$, $X_{616}$ may be N or $C(R_{616})$, and at least one selected from $X_{614}$ to $X_{616}$ may be N, $L_{611}$ to $L_{613}$ may each independently be the same as $L_{601}$, xe611 to xe613 may each independently be the same as xe1, $R_{611}$ to $R_{613}$ may each independently be the same as $R_{601}$, and $R_{614}$ to $R_{616}$ may each independently be hydrogen, deuterium, $-F$, $-C_1$, $-Br$, $-I$, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

In some embodiments, in Formulae 601 and 601-1, xe1 and xe611 to xe613 may each independently be 0, 1, or 2.

The electron transport region may include one of Compounds ET1 to ET45, 2,9-dimethyl-4,7-diphenyl-1,10-phenanthroline (BCP), 4,7-diphenyl-1,10-phenanthroline (Bphen), Alq3, BAlq, TAZ, NTAZ, or any combination thereof:

ET1

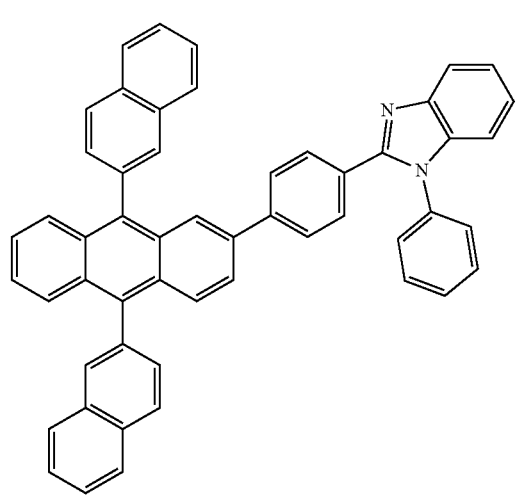

115
-continued
ET2
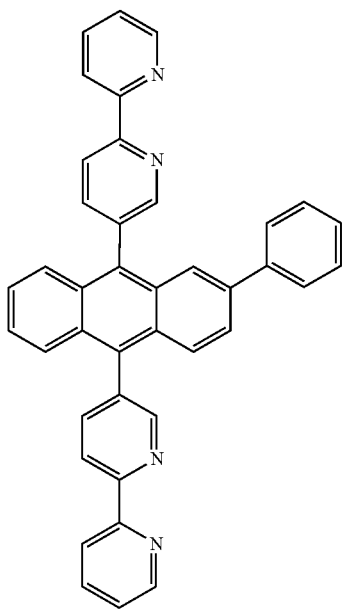
ET3
ET4
116
-continued
ET5
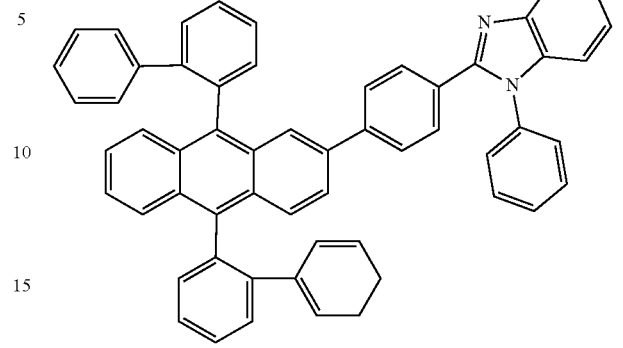
ET6
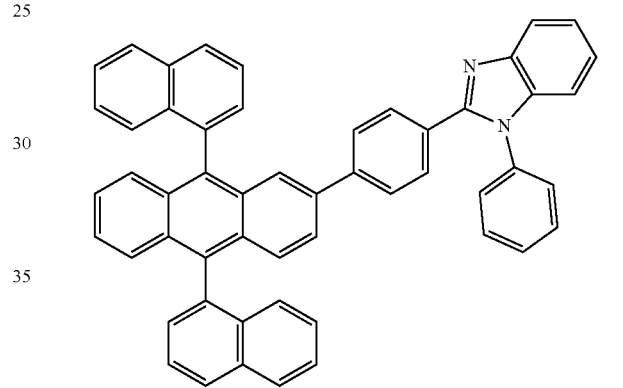
ET7
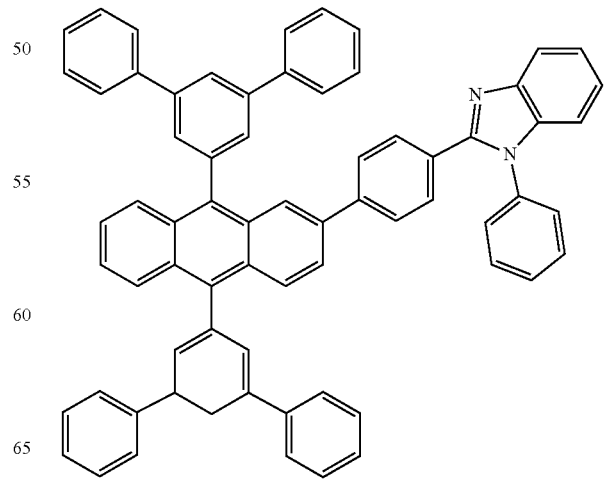

ET8
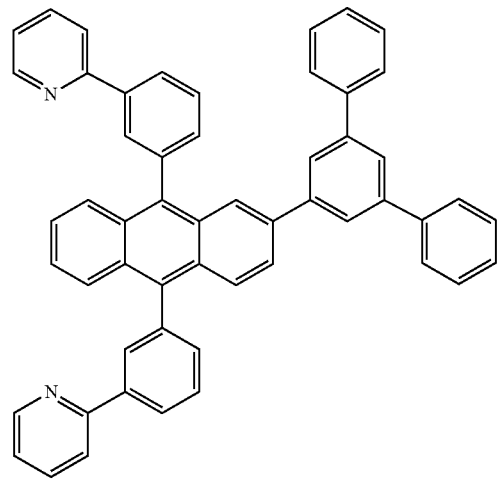
ET9
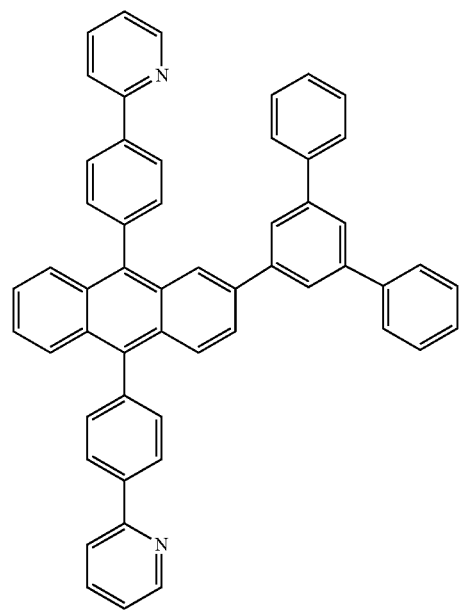
ET10
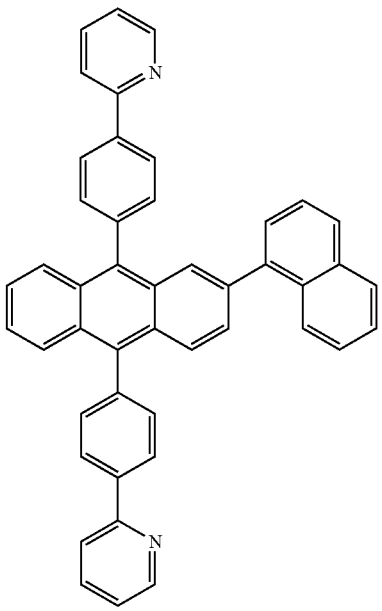
ET11
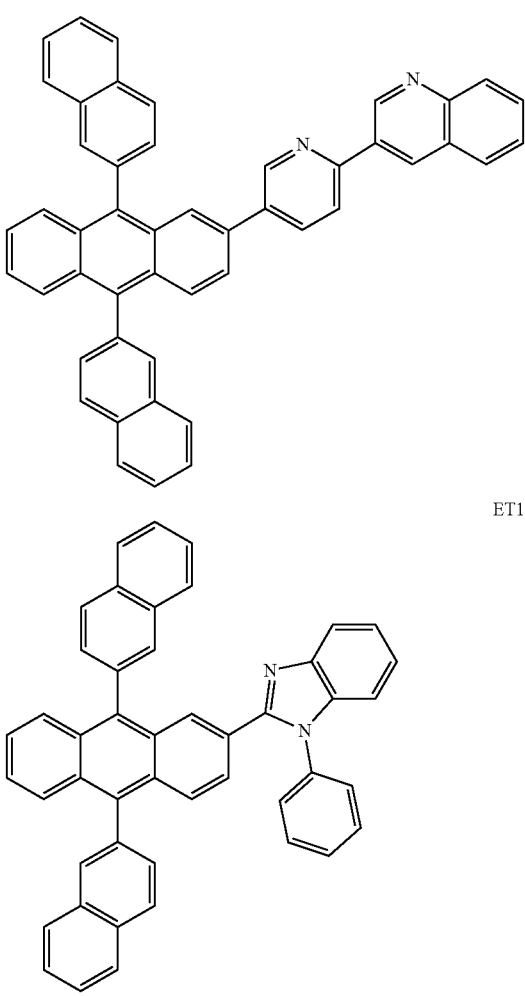
ET12

ET13
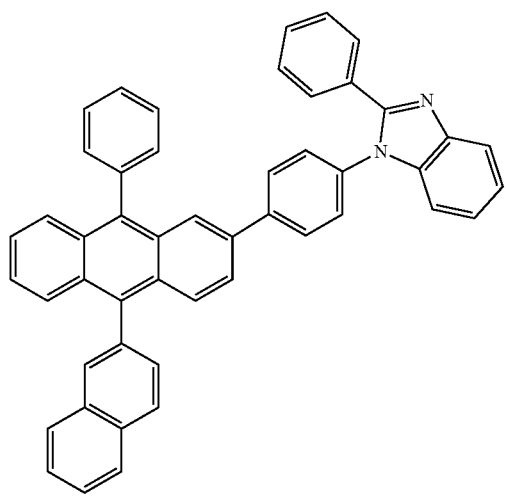
ET14
ET15
ET16
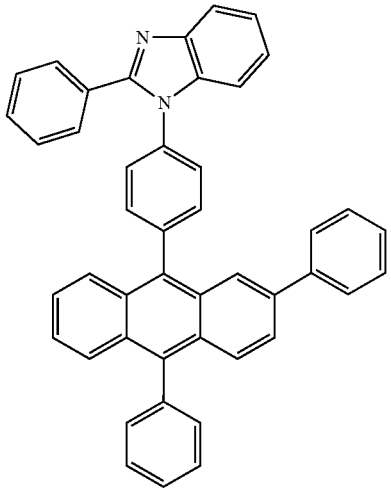
ET17
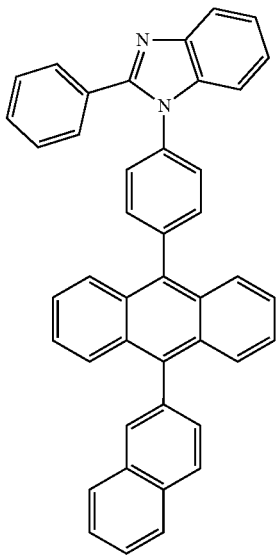
ET18
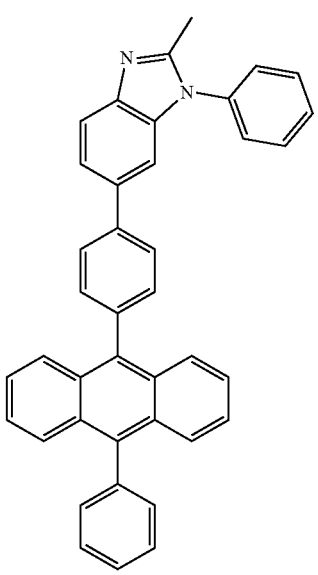

-continued
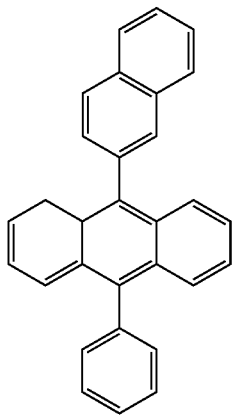
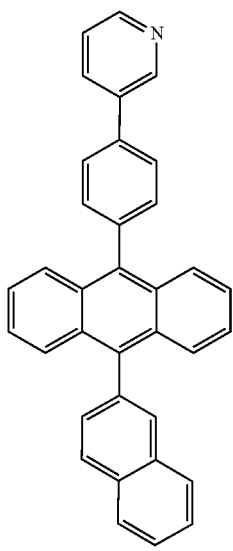
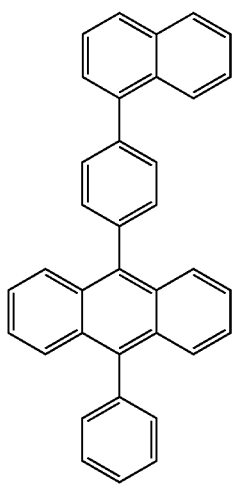
-continued
ET19
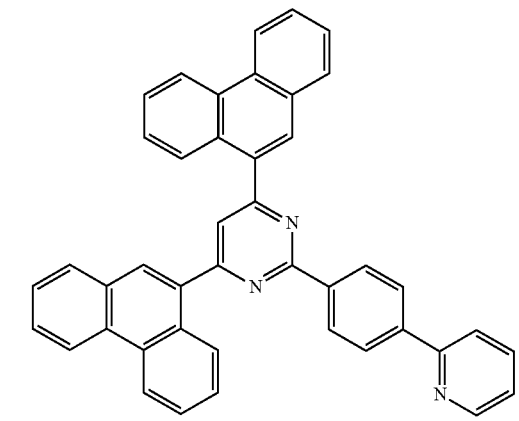
ET20
ET22
ET21
ET23
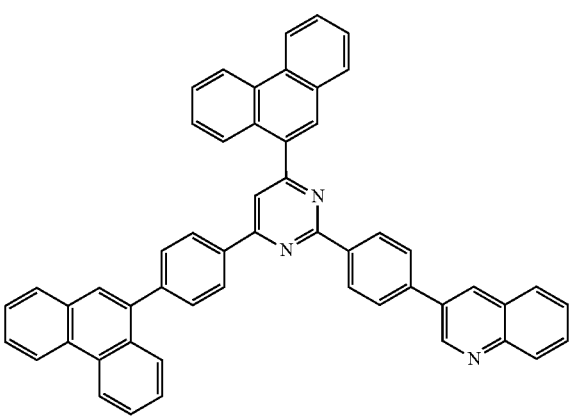
ET24
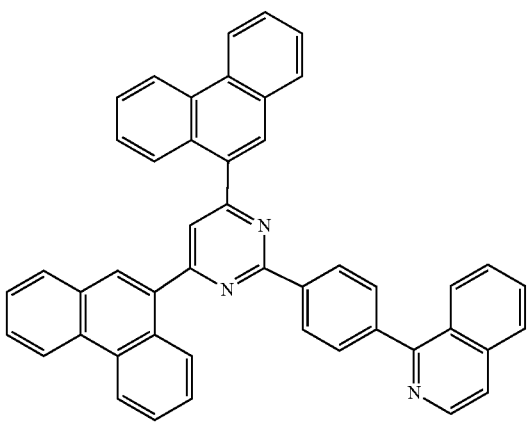

ET25
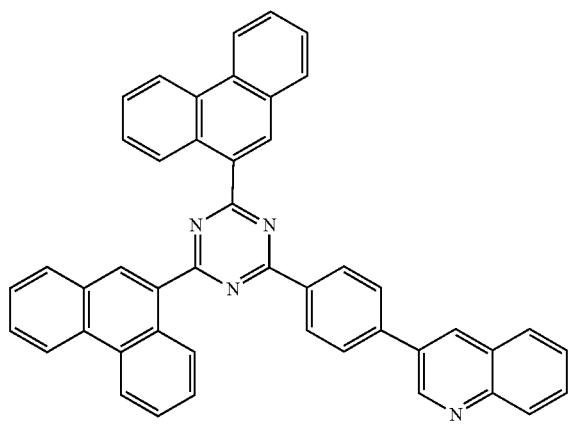
ET26
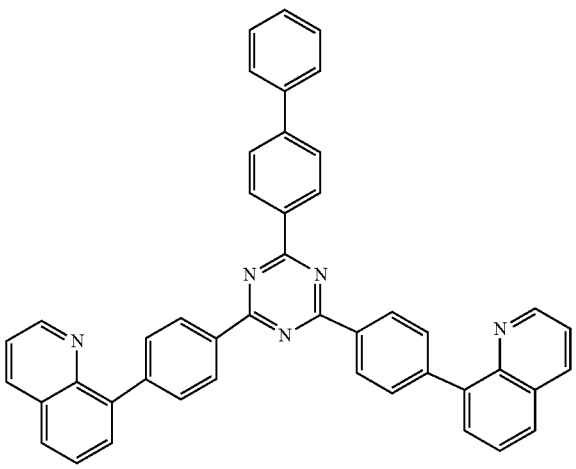
ET27
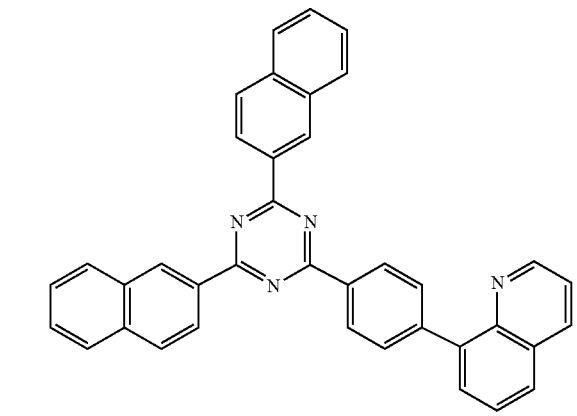
ET28
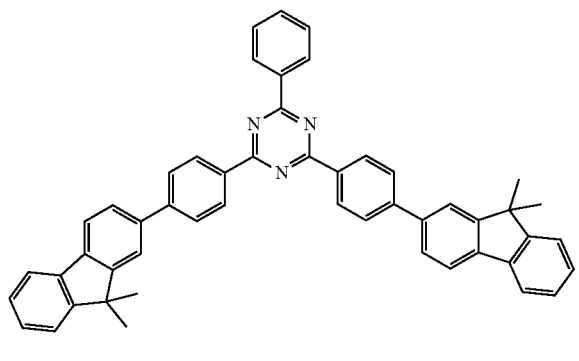
ET29
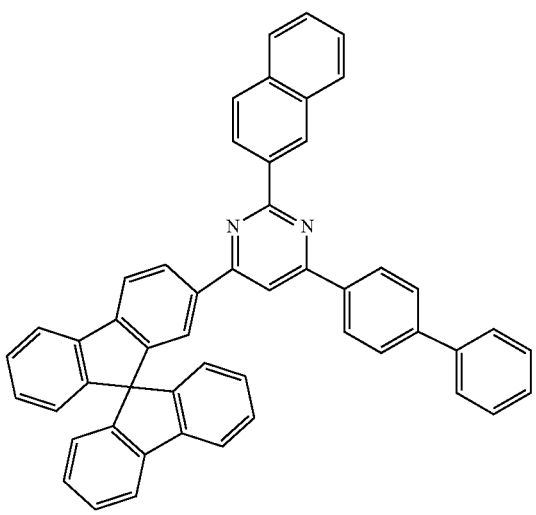
ET30
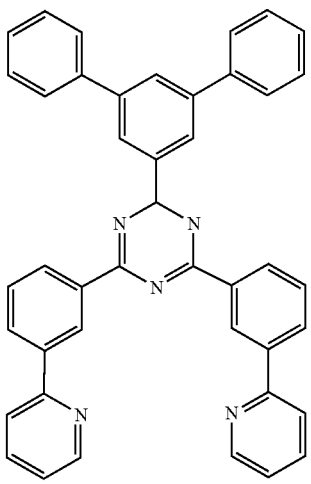

ET31
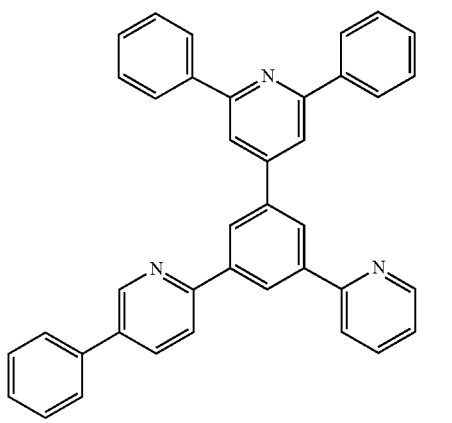
ET34
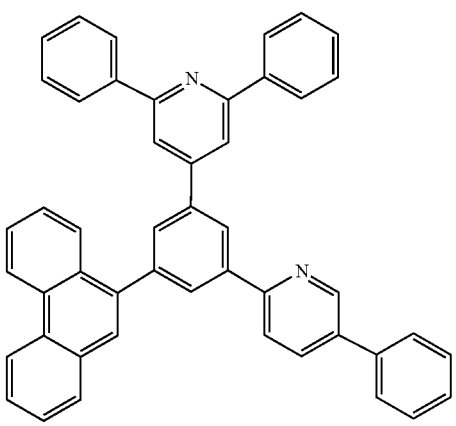
ET32
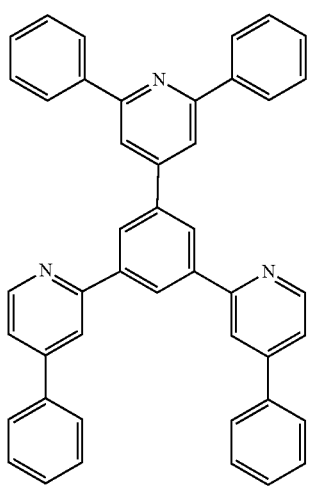
ET35
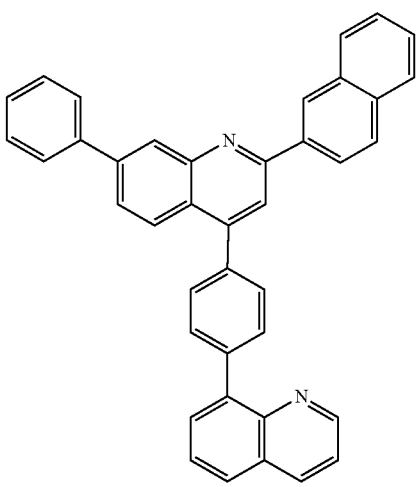
ET36
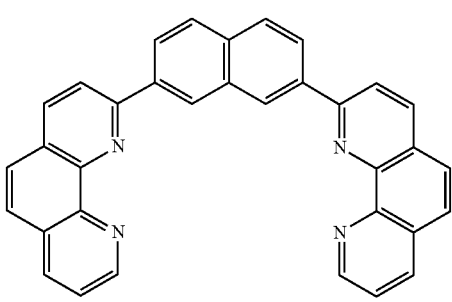
ET33
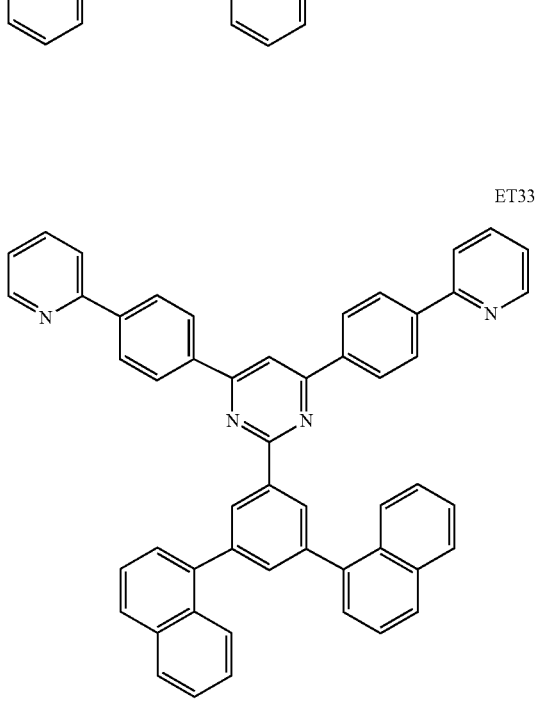
ET37
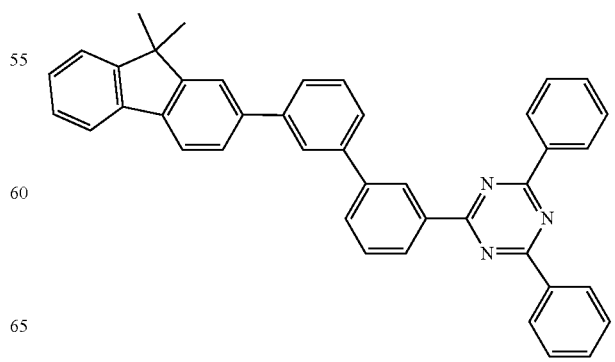

-continued
ET38
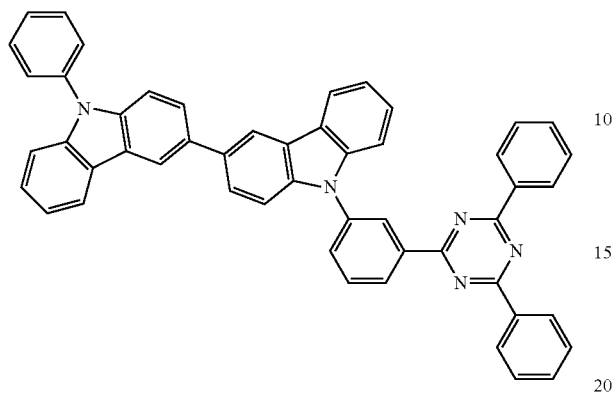
ET39
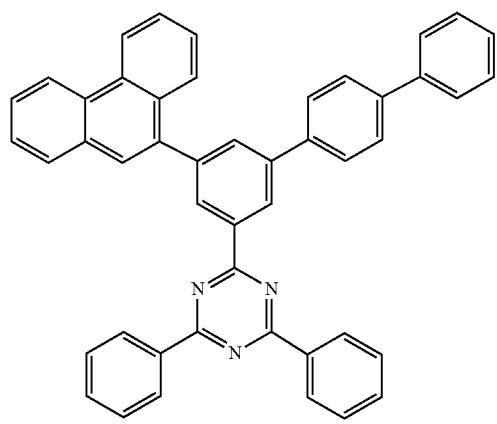
ET40
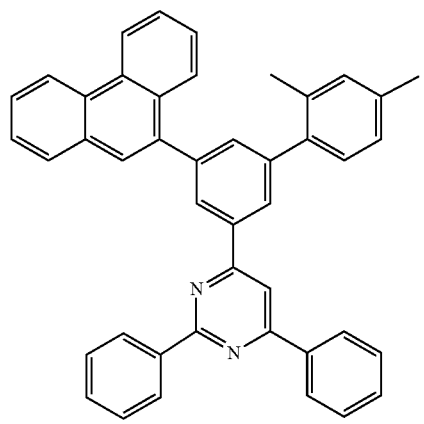
-continued
ET41
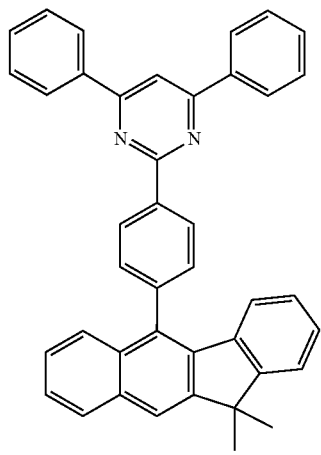
ET42
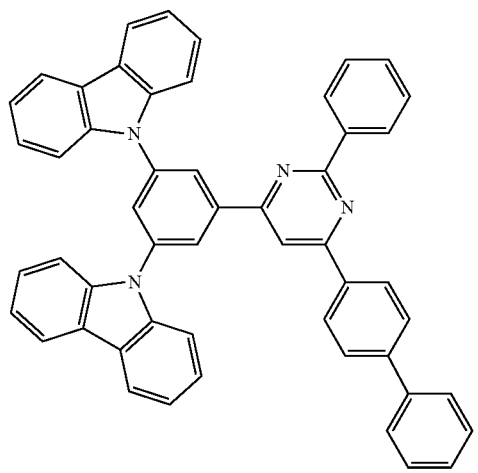
ET43
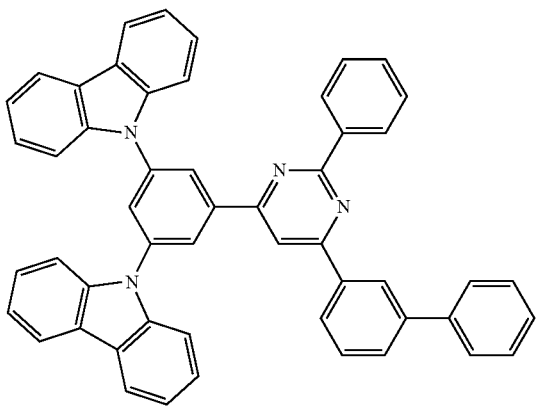

ET44
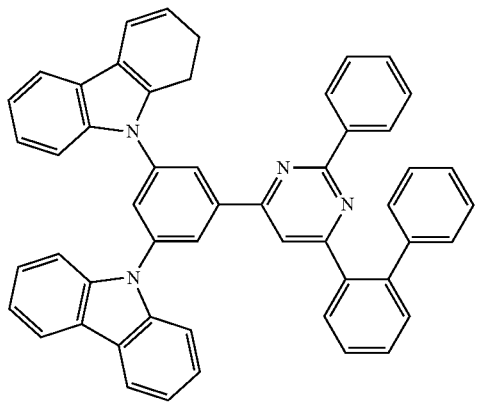

NTAZ
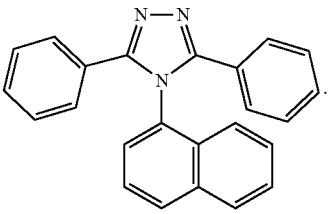

The thickness of the electron transport regions 153-1, 153-2, and 153-3 may each be about 100 Å to about 5,000 Å, and in some embodiments, about 160 Å to about 4,000 Å. When the electron transport regions 153-1, 153-2, and 153-3 each include a buffer layer, a hole blocking layer, an electron control layer, an electron transport layer, or any combination thereof, the thicknesses of the buffer layer, the hole blocking layer, and/or the electron control layer may each independently be about 20 Å to about 1,000 Å, for example, about 30 Å to about 300 Å, and the thickness of the electron transport layer may be about 100 Å to about 1,000 Å, for example, about 150 Å to about 500 Å. When the thicknesses of the buffer layer, the hole blocking layer, the electron control layer, the electron transport layer, and/or the electron transport region are each within these ranges, excellent electron transport characteristics may be obtained without a substantial increase in driving voltage.

The electron transport region (for example, the electron transport layer in the electron transport region) may further include, in addition to the materials described above, a metal-containing material.

ET45
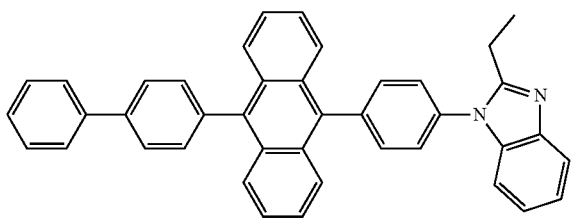

The metal-containing material may include an alkali metal complex, an alkaline earth metal complex, or any combination thereof. A metal ion of the alkali metal complex may be a lithium (Li) ion, a sodium (Na) ion, a potassium (K) ion, a rubidium (Rb) ion, or a cesium (Cs) ion. A metal ion of the alkaline earth metal complex may be a beryllium (Be) ion, a magnesium (Mg) ion, a calcium (Ca) ion, a strontium (Sr) ion, or a barium (Ba) ion. Each ligand coordinated with the metal ion of the alkali metal complex and/or the alkaline earth metal complex may independently be hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenylbenzimidazole, hydroxyphenylbenzothiazole, bipyridine, phenanthroline, cyclopentadiene, or any combination thereof.

Alq₃
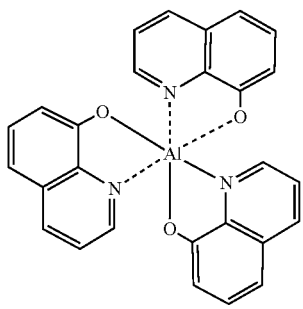

BAlq
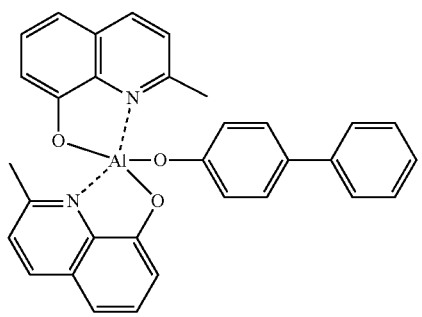

For example, the metal-containing material may include a Li complex. The Li complex may include, e.g., Compound ET-D1 (LiQ) or Compound ET-D2:

TAZ
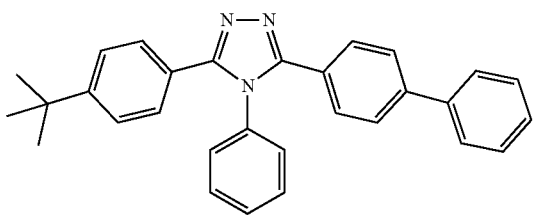

ET-D1
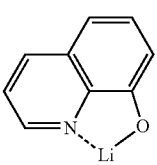

ET-D2

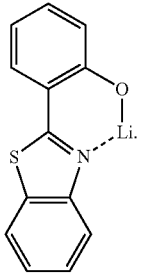

The electron transport regions 153-1, 153-2, and 153-3 may include an electron injection layer that facilitates injection of electrons from the second electrode 190. The electron injection layer may be in direct contact with the second electrode 190.

The electron injection layer may have i) a single-layered structure including (e.g., consisting of) a single material, ii) a single-layered structure including a plurality of different materials, or iii) a multi-layered structure having a plurality of layers including a plurality of different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may be Li, Na, K, Rb, Cs or any combination thereof. The alkaline earth metal may be Mg, Ca, Sr, Ba, or any combination thereof. The rare earth metal may be Sc, Y, Ce, Tb, Yb, Gd, or any combination thereof.

The alkali metal-containing compound, the alkaline earth metal-containing compound, and the rare earth metal-containing compound may respectively be oxides, halides (e.g., fluorides, chlorides, bromides, or iodides), tellurides, or any combination thereof of each of the alkali metal, the alkaline earth metal, and the rare earth metal.

The alkali metal-containing compound may be an alkali metal oxide (such as $Li_2O$, $Cs_2O$, and/or $K_2O$), an alkali metal halide (such as LiF, NaF, CsF, KF, LiI, NaI, CsI, and/or KI), or any combination thereof. The alkaline earth-metal-containing compound may include alkaline earth-metal compounds (such as BaO, SrO, CaO, $Ba_xSr_{1-x}O$ (wherein x is a real number that satisfying 0<x<1), and/or $Ba_xCa_{1-x}O$ (wherein x is a real number that satisfying 0<x<1)). The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In some embodiments, the rare earth metal-containing compound may include a lanthanide metal telluride. Non-limiting examples of the lanthanide metal telluride include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, $Lu_2Te_3$, and the like.

The alkali metal complex, the alkaline earth metal complex, and the rare earth metal complex may each include: i) an ion of the alkali metal, alkaline earth metal, or rare earth metal as described above and ii) a ligand bound to the metal ion, e.g., hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenylbenzimidazole, hydroxyphenylbenzothiazole, bipyridine, phenanthroline, cyclopentadiene, or any combination thereof.

The electron injection layer may include (e.g., consist of) an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In some embodiments, the electron injection layer may further include an organic material (e.g., a compound represented by Formula 601).

In some embodiments, the electron injection layer may include (e.g., consist of) i) an alkali metal-containing compound (e.g., alkali metal halide), or ii) a) an alkali metal-containing compound (e.g., alkali metal halide); and b) an alkali metal, an alkaline earth metal, a rare earth metal, or any combination thereof. In some embodiments, the electron injection layer may be a KI:Yb co-deposition layer, a RbI:Yb co-deposition layer, and/or the like.

When the electron injection layer further includes an organic material, the alkali metal, the alkaline earth metal, the rare earth metal, the alkali metal-containing compound, the alkaline earth metal-containing compound, the rare earth metal-containing compound, the alkali metal complex, the alkaline earth metal complex, the rare earth metal complex, or any combination thereof may be homogeneously or non-homogeneously dispersed in a matrix including the organic material.

The thickness of the electron injection layer may be about 1 Å to about 100 Å, and in some embodiments, about 3 Å to about 90 Å. When the thickness of the electron injection layer is within any of these ranges, excellent electron injection characteristics may be obtained without a substantial increase in driving voltage.

Second Electrode 190

The second electrode 190 may be on the interlayer 150. In an embodiment, the second electrode 190 may be a cathode that is an electron injection electrode. In this embodiment, a material for forming the second electrode 190 may be a material having a low work function, for example, a metal, an alloy, an electrically conductive compound, or any combination thereof.

The second electrode 190 may include lithium (Li), silver (Ag), magnesium (Mg), aluminum (Al), aluminum-lithium (Al—Li ), calcium (Ca), magnesium-indium (Mg—In), magnesium-silver (Mg—Ag), ytterbium (Yb), silver-ytterbium (Ag—Yb), ITO, IZO, or any combination thereof. The second electrode 190 may be a transmissive electrode, a semi-transmissive electrode, or a reflective electrode.

The second electrode 190 may have a single-layered structure, or a multi-layered structure including two or more layers.

Capping Layer

A first capping layer may be located outside the first electrode 110, and/or a second capping layer may be located outside the second electrode 190. In some embodiments, the light-emitting device 10 may have a structure in which the first capping layer, the first electrode 110, the interlayer 150, and the second electrode 190 are sequentially stacked in this stated order, a structure in which the first electrode 110, the interlayer 150, the second electrode 190, and the second capping layer are sequentially stacked in this stated order, or a structure in which the first capping layer, the first electrode 110, the interlayer 150, the second electrode 190, and the second capping layer are sequentially stacked in this stated order.

In some embodiments, in the light-emitting device 10, light emitted from the emission layer in the interlayer 150 may pass through the first electrode 110 (which may be a semi-transmissive electrode or a transmissive electrode) and through the first capping layer to the outside. In some embodiments, in the light-emitting device 10, light emitted from the emission layer in the interlayer 150 may pass through the second electrode 190 (which may be a semi-transmissive electrode or a transmissive electrode) and through the second capping layer to the outside.

The first capping layer and the second capping layer may improve the external luminescence efficiency of the device, based on the principle of constructive interference. Accordingly, the optical extraction efficiency of the light-emitting device 10 may be increased, thus improving luminescence efficiency of the light-emitting device 10.

The first capping layer and the second capping layer may each include a material having a refractive index of 1.6 or higher (at 589 nm).

The first capping layer and the second capping layer may each independently be a capping layer including an organic material, an inorganic capping layer including an inorganic material, or a composite capping layer including an organic material and an inorganic material.

At least one of the first capping layer or the second capping layer may each independently include carbocyclic compounds, heterocyclic compounds, amine group-containing compounds, porphyrin derivatives, phthalocyanine derivatives, naphthalocyanine derivatives, alkali metal complexes, alkaline earth metal complexes, or any combination thereof. The carbocyclic compound, the heterocyclic compound, and the amine group-containing compound may optionally be substituted with a substituent of O, N, S, Se, Si, F, Cl, Br, I, or any combination thereof. In some embodiments, at least one of the first capping layer or the second capping layer may each independently include an amine group-containing compound.

In some embodiments, at least one of the first capping layer or the second capping layer may each independently include the compound represented by Formula 201, the compound represented by Formula 202, or any combination thereof.

In one or more embodiments, at least one of the first capping layer or the second capping layer may each independently include one of Compounds HT28 to HT33, one of Compounds CP1 to CP6, β-NPB, or any combination thereof:

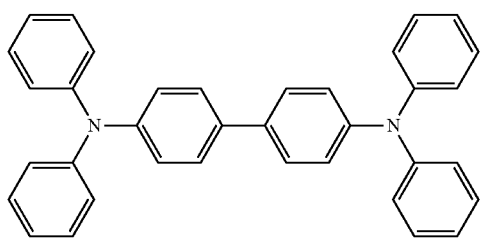

CP1

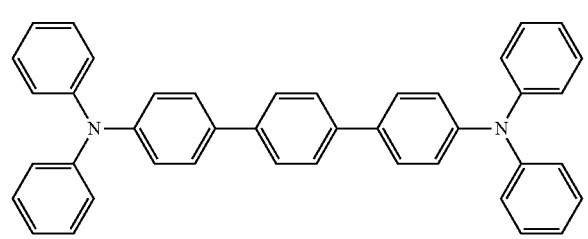

CP2

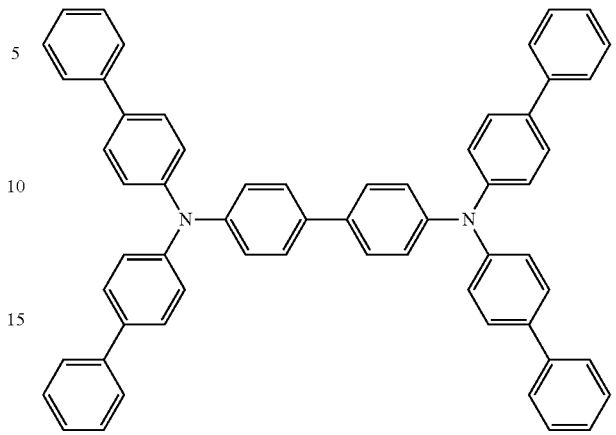

CP3

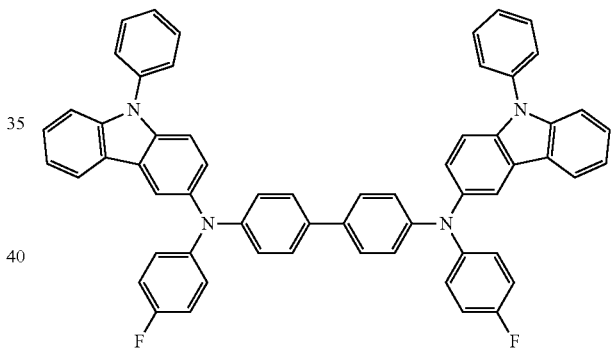

CP4

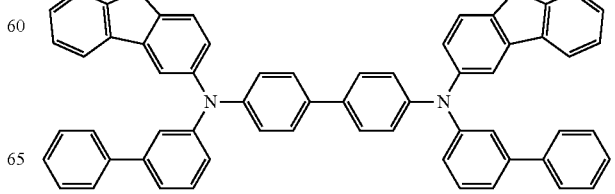

CP5

-continued

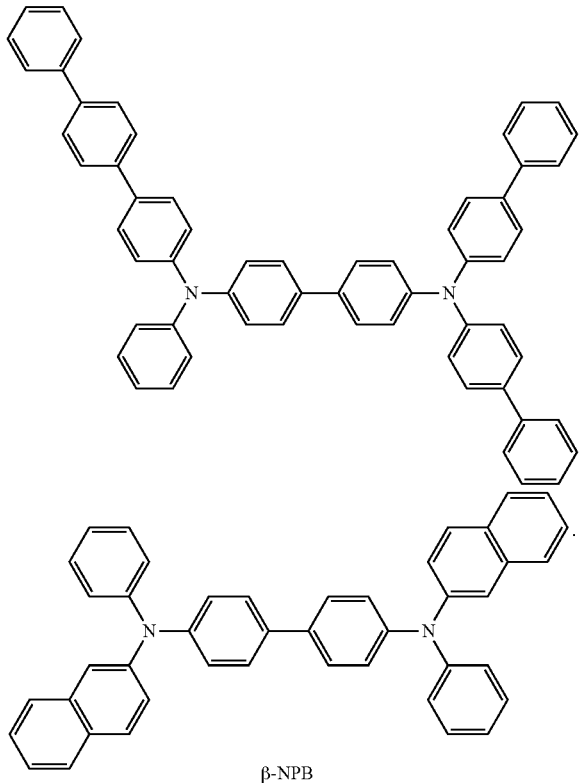

CP6

β-NPB

Electronic Apparatus

The light-emitting device may be included in various electronic apparatuses. In some embodiments, an electronic apparatus including the light-emitting device may be a light-emitting apparatus or an authentication apparatus.

The electronic apparatus (e.g., a light-emitting apparatus) may further include, in addition to the light-emitting device, i) a color filter, ii) a color-conversion layer, or iii) a color filter and a color-conversion layer. The color filter and/or the color-conversion layer may be disposed on (along) at least one traveling direction of light emitted from the light-emitting device. For example, light emitted from the light-emitting device may be blue light or white light. The light-emitting device may be understood by referring to the descriptions provided herein. In some embodiments, the color-conversion layer may include quantum dots. The quantum dot may be, for example, the quantum dot described herein.

The electronic apparatus may include a first substrate. The first substrate may include a plurality of sub-pixel areas, the color filter may include a plurality of color filter areas respectively corresponding to the plurality of sub-pixel areas, and the color-conversion layer may include a plurality of color-conversion areas respectively corresponding to the plurality of sub-pixel areas.

A pixel defining film may be located between the plurality of sub-pixel areas to define each sub-pixel area.

The color filter may further include a plurality of color filter areas and light-blocking patterns between the plurality of color filter areas, and the color-conversion layer may further include a plurality of color-conversion areas and light-blocking patterns between the plurality of color-conversion areas.

The plurality of color filter areas (or a plurality of color-conversion areas) may include: a first area emitting first color light; a second area emitting second color light; and/or a third area emitting third color light, and the first color light, the second color light, and/or the third color light may have different maximum emission wavelengths. In some embodiments, the first color light may be red light, the second color light may be green light, and the third color light may be blue light. In some embodiments, the plurality of color filter areas (or the plurality of color-conversion areas) may each include quantum dots. In some embodiments, the first area may include red quantum dots, the second area may include green quantum dots, and the third area may not include a quantum dot. The quantum dot may be understood by referring to the description of the quantum dot provided herein. The first area, the second area, and/or the third area may each further include an emitter.

In some embodiments, the light-emitting device may be to emit first light, the first area may be to absorb the first light to emit 1-1 color light, the second area may be to absorb the first light to emit 2-1 color light, and the third area may be to absorb the first light to emit 3-1 color light. In this embodiment, the 1-1 color light, the 2-1 color light, and the 3-1 color light may each have a different maximum emission wavelength. In some embodiments, the first light may be blue light, the 1-1 color light may be red light, the 2-1 color light may be green light, and the 3-1 light may be blue light.

The electronic apparatus may further include a thin-film transistor, in addition to the light-emitting device. The thin-film transistor may include a source electrode, a drain electrode, and an activation layer, wherein one of the source electrode or the drain electrode may be electrically connected to one of the first electrode or the second electrode of the light-emitting device.

In some embodiments, a Y color-coordinate measured at a front viewing angle of the electronic apparatus may be about 0.09 to about 0.15.

In some embodiments, when the front viewing angle of the electronic apparatus is 0 degree, the Y color-coordinate measured at a side viewing angle of 30 degrees to 45 degrees with respect to the front viewing angle may be about 0.45 to about 0.06.

The thin-film transistor may further include a gate electrode, a gate insulating film, and/or the like.

The activation layer may include a crystalline silicon, an amorphous silicon, an organic semiconductor, and/or an oxide semiconductor.

The electronic apparatus may further include an encapsulation unit for sealing the light-emitting device. The encapsulation unit may be located between the color filter and/or the color-conversion layer and the light-emitting device. The encapsulation unit may allow light to pass to the outside from the light-emitting device while preventing or reducing permeation of air and moisture into the light-emitting device. The encapsulation unit may be a sealing substrate including a transparent glass and/or a plastic substrate. The encapsulation unit may be a thin-film encapsulating layer including at least one of an organic layer or an inorganic layer. When the encapsulation unit is a thin film encapsulating layer, the electronic apparatus may be flexible.

In addition to the color filter and/or the color-conversion layer, various functional layers may be disposed on the encapsulation unit depending on the use case for the electronic apparatus. Non-limiting examples of the functional layer include a touch screen layer, a polarization layer, and the like. The touch screen layer may be a resistive touch screen layer, a capacitive touch screen layer, or an infrared beam touch screen layer. The authentication apparatus may be, for example, a biometric authentication apparatus that identifies an individual according biometric information (e.g., a fingertip, a pupil, and/or the like).

The authentication apparatus may further include a biometric information collecting unit, in addition to the light-emitting device described above.

The electronic apparatus may be applicable to various displays, optical sources, lighting, a personal computer (e.g., a mobile personal computer), a cellphone, a digital camera, an electronic note, an electronic dictionary, an electronic game console, a medical device (e.g., an electronic thermometer, a blood pressure meter, a glucometer, a pulse measuring device, a pulse wave measuring device, an electrocardiograph recorder, an ultrasonic diagnosis device, an endoscope display device), a fish finder, various measurement devices, gauges (e.g., gauges of an automobile, an airplane, a ship), a projector, etc.

Figure 2:
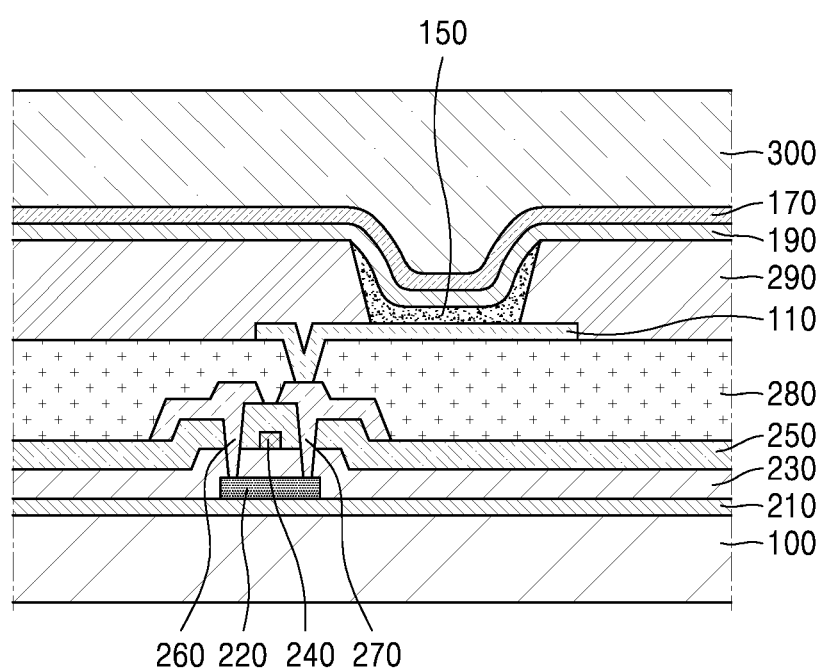
FIG. 2 is a schematic cross-sectional view of a light-emitting apparatus according to an embodiment.
Figure 3:
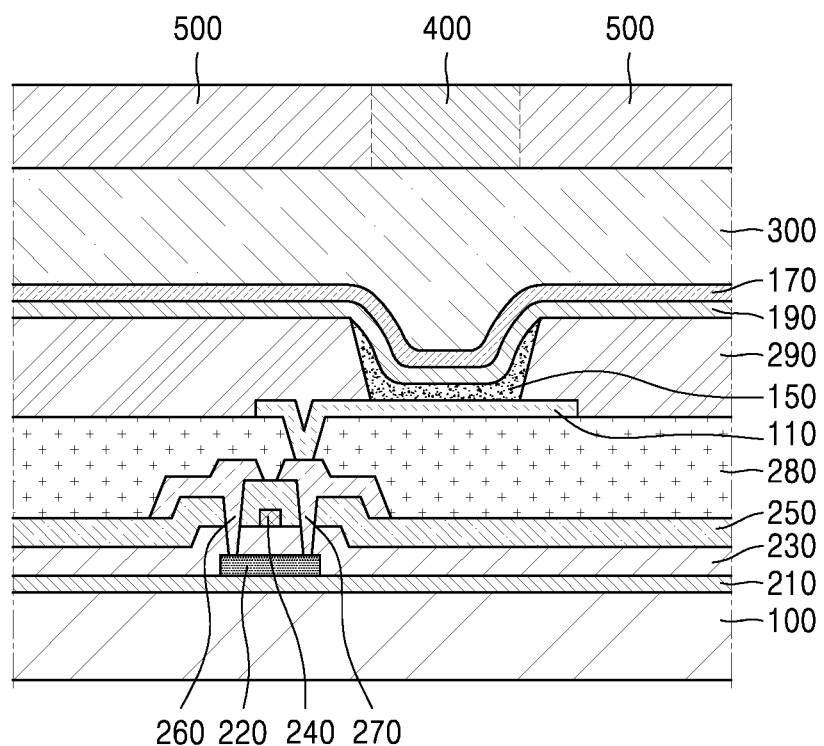
FIG. 3 is a schematic cross-sectional view of another light-emitting apparatus according to an embodiment.

Descriptions of FIGS. 2 and 3

FIG. 2 is a schematic cross-sectional view of a light-emitting apparatus according to an embodiment.

A light-emitting apparatus in FIG. 2 may include a substrate 100, a thin-film transistor, a light-emitting device, and an encapsulation unit 300 sealing the light-emitting device.

The substrate 100 may be a flexible substrate, a glass substrate, and/or a metal substrate. A buffer layer 210 may be on the substrate 100. The buffer layer 210 may prevent or reduce penetration of impurities through the substrate 100 and provide a flat surface on the substrate 100.

A thin-film transistor may be on the buffer layer 210. The thin-film transistor may include an active layer 220, a gate electrode 240, a source electrode 260, and a drain electrode 270.

The active layer 220 may include an inorganic semiconductor (such as silicon or polysilicon), an organic semiconductor, or an oxide semiconductor, and may include a source area, a drain area and a channel area.

A gate insulating film 230 for insulating the active layer 220 and the gate electrode 240 may be on the active layer 220, and the gate electrode 240 may be on the gate insulating film 230.

An interlayer insulating film 250 may be on the gate electrode 240. The interlayer insulating film 250 may be between the gate electrode 240 and the source electrode 260 and between the gate electrode 240 and the drain electrode 270 to provide insulation therebetween.

The source electrode 260 and the drain electrode 270 may be on the interlayer insulating film 250. The interlayer insulating film 250 and the gate insulating film 230 may be formed to expose the source area and the drain area of the active layer 220, and the source electrode 260 and the drain electrode 270 may be adjacent to the exposed source area and the exposed drain area of the active layer 220.

The thin-film transistor may be electrically connected to a light-emitting device to drive the light-emitting device, and may be protected by a passivation layer 280. The passivation layer 280 may include an inorganic insulating film, an organic insulating film, or a combination thereof. A light-emitting device may be on the passivation layer 280. The light-emitting device may include a first electrode 110, an interlayer 150, and a second electrode 190.

The first electrode 110 may be on the passivation layer 280. The passivation layer 280 may not fully cover the drain electrode 270 and may expose a specific area of the drain electrode 270, and the first electrode 110 may be disposed to connect to the exposed drain electrode 270.

A pixel-defining film 290 may be on the first electrode 110. The pixel-defining film 290 may expose a specific area of the first electrode 110, and the interlayer 150 may be formed in the exposed area. The pixel-defining film 290 may be a polyimide or polyacryl organic film. In some embodiments, some higher layers of the interlayer 150 may extend to the upper portion of the pixel-defining film 290 and may be disposed in the form of a common layer.

The second electrode 190 may be on the interlayer 150, and a capping layer 170 may be additionally formed on the second electrode 190. The capping layer 170 may be formed to cover the second electrode 190.

The encapsulation unit 300 may be on the capping layer 170. The encapsulation unit 300 may be on the light-emitting device to protect a light-emitting device from moisture and/or oxygen. The encapsulation unit 300 may include: an inorganic film including silicon nitride (SiNx), silicon oxide (SiOx), indium tin oxide, indium zinc oxide, or any combination thereof; an organic film including polyethylene terephthalate, polyethylene naphthalate, polycarbonate, polyimide, polyethylene sulfonate, polyoxymethylene, polyarylate, hexamethyl disiloxane, an acrylic resin (e.g., polymethyl methacrylate, polyacrylic acid, and/or the like), an epoxy resin (e.g., aliphatic glycidyl ether (AGE) and/or the like), or any combination thereof; or a combination of the inorganic film and the organic film.

FIG. 3 is a schematic cross-sectional view of another light-emitting apparatus according to an embodiment.

The light-emitting apparatus shown in FIG. 3 may be substantially identical to the light-emitting apparatus shown in FIG. 2, except that a light-shielding pattern 500 and a functional area 400 are additionally located on the encapsulation unit 300. The functional area 400 may be i) a color filter area, ii) a color-conversion area, or iii) a combination of a color filter area and a color-conversion area. In some embodiments, the light-emitting device shown in FIG. 3 included in the light-emitting apparatus may be a tandem light-emitting device.

Manufacturing Method

The layers constituting the hole transport region, the emission layer, and the layers constituting the electron transport region may each be formed in a set or predetermined region using one or more suitable methods (such as vacuum deposition, spin coating, casting, Langmuir-Blodgett (LB) deposition, ink-jet printing, laser printing, and/or laser-induced thermal imaging).

When the layers constituting the hole transport region, the emission layer, and the layers constituting the electron transport region are each formed by vacuum deposition, the vacuum deposition may be performed at a deposition temperature of about 100° C. to about 500° C., at a vacuum degree of about $10^{-8}$ torr to about $10^{-3}$ torr, and at a deposition rate of about 0.01 Angstroms per second (Å/sec) to about 100 Å/sec, depending on the material to be included in each layer and the structure of each layer to be formed.

General Definitions of Terms

The term "$C_3$-$C_{60}$ carbocyclic group" as used herein refers to a cyclic group consisting of carbon atoms only and having 3 to 60 carbon atoms. The term "$C_1$-$C_{60}$ heterocyclic group" as used herein refers to a cyclic group having 1 to 60 carbon atoms in addition to a heteroatom other than carbon atoms. The $C_3$-$C_{60}$ carbocyclic group and the $C_1$-$C_{60}$ heterocyclic group may each be a monocyclic group consisting of one ring or a polycyclic group in which at least two rings are condensed. For example, the number of ring-forming atoms in the $C_1$-$C_{60}$ heterocyclic group may be in a range of 3 to 61.

The term "cyclic group" as used herein may include the $C_3$-$C_{60}$ carbocyclic group and the $C_1$-$C_{60}$ heterocyclic group.

The term "π electron-rich $C_3$-$C_{60}$ cyclic group" refers to a cyclic group having 3 to 60 carbon atoms and not including *—N=*' as a ring-forming moiety. The term "π electron-deficient nitrogen-containing $C_1$-$C_{60}$ cyclic group" as used herein refers to a heterocyclic group having 1 to 60 carbon atoms and *—N=*' as a ring-forming moiety.

In some embodiments,

- the $C_3$-$C_{60}$ carbocyclic group may be i) a T1 group (as defined below) or ii) a group in which at least two T1 groups are condensed (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group),
- the $C_1$-$C_{60}$ heterocyclic group may be i) a T2 group (as defined below), ii) a group in which at least two T2 groups are condensed, or iii) a group in which at least one T2 group is condensed with at least one T1 group (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonapthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and/or the like),
- the π electron-rich $C_3$-$C_{60}$ cyclic group may be i) a T1 group, ii) a condensed group in which at least two T1 groups are condensed, iii) a T3 group (as defined below), iv) a condensed group in which at least two T3 groups are condensed, or v) a condensed group in which at least one T3 group is condensed with at least one T1 group (for example, a $C_3$-$C_{60}$ carbocyclic group, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonapthothiophene group, a benzonaphthosilole group, a benzofurodibenzofuran group, a benzofurodibenzothiophene group, a benzothienodibenzothiophene group, and/or the like), and
- the π electron-deficient nitrogen-containing $C_1$-$C_{60}$ cyclic group may be i) a T4 group (as defined below), ii) a group in which at least two T4 groups are condensed, iii) a group in which at least one T4 group is condensed with at least one T1 group, iv) a group in which at least one T4 group is condensed with at least one T3 group, or v) a group in which at least one T4 group, at least one T1 group, and at least one T3 group are condensed (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and the like),
- wherein the T1 group may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or bicyclo[2.2.1]heptane) group, a norbornene group, a bicyclo[1.1.1]pentane group, a bicyclo[2.1.1]hexane group, a bicyclo[2.2.2]octane group, or a benzene group,
- the T2 group may be a furan group, a thiophene group, a 1 H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group, the T3 group may be a furan group, a thiophene group, a 1H-pyrrole group, a silole group, or a borole group, and the T4 group may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The term "cyclic group", "$C_3$-$C_{60}$ carbocyclic group", "$C_1$-$C_{60}$ heterocyclic group", "π electron-rich $C_3$-$C_{60}$ cyclic group", or "π electron-deficient nitrogen-containing $C_1$-$C_{60}$ cyclic group" as used herein may be a group condensed with any suitable cyclic group, monovalent group, or polyvalent group (e.g., a divalent group, a trivalent group, a quadvalent group, and/or the like), depending on the structure of the formula to which the term is applied. For example, a "benzene group" may be a benzo group, a phenyl group, a phenylene group, and/or the like, and this may be understood by one of ordinary skill in the art, depending on the structure of the formula including the "benzene group".

Non-limiting examples of the monovalent $C_3$-$C_{60}$ carbocyclic group and the monovalent $C_1$-$C_{60}$ heterocyclic group include a $C_3$-$C_{10}$ cycloalkyl group, a $C_1$-$C_{10}$ heterocycloalkyl group, a $C_3$-$C_{10}$ cycloalkenyl group, a $C_1$-$C_{60}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group. Non-limiting examples of the divalent $C_3$-$C_{60}$ carbocyclic group and the divalent $C_1$-$C_{60}$ heterocyclic group include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a substituted or unsubstituted divalent non-aromatic condensed heteropolycyclic group.

The term "$C_1$-$C_6$ alkyl group" as used herein refers to a linear or branched aliphatic hydrocarbon monovalent group having 1 to 60 carbon atoms, and non-limiting examples thereof include a methyl group, an ethyl group, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, and a tert-decyl group. The term "$C_1$-$C_{60}$ alkylene group" as used herein refers to a divalent group having substantially the same structure as the $C_1$-$C_{60}$ alkyl group.

The term "$C_2$-$C_{60}$ alkenyl group" as used herein refers to a hydrocarbon group having at least one carbon-carbon double bond in the middle or at the terminus of the $C_2$-$C_{60}$ alkyl group. Non-limiting examples thereof include an ethenyl group, a propenyl group, and a butenyl group. The term "$C_2$-$C_{60}$ alkenylene group" as used herein refers to a divalent group having substantially the same structure as the $C_2$-$C_{60}$ alkenyl group.

The term "$C_2$-$C_{60}$ alkynyl group" as used herein refers to a monovalent hydrocarbon group having at least one carbon-carbon triple bond in the middle or at the terminus of the $C_2$-$C_{60}$ alkyl group. Non-limiting examples thereof include an ethynyl group and a propynyl group. The term "$C_2$-$C_{60}$ alkynylene group" as used herein refers to a divalent group having substantially the same structure as the $C_2$-$C_{60}$ alkynyl group.

The term "$C_1$-$C_{60}$ alkoxy group" as used herein refers to a monovalent group represented by —$OA_{101}$ (wherein $A_{101}$ is a $C_1$-$C_{60}$ alkyl group). Non-limiting examples thereof include a methoxy group, an ethoxy group, and an isopropyloxy group.

The term "$C_3$-$C_{10}$ cycloalkyl group" as used herein refers to a monovalent saturated hydrocarbon monocyclic group including 3 to 10 carbon atoms. Non-limiting examples of the $C_3$-$C_{10}$ cycloalkyl group as used herein include a cyclopropyl group, a cyclobutyl group, a cyclopentyl group, a cyclohexyl group, a cycloheptyl group, a cyclooctyl group, an adamantanyl group, a norbornanyl (bicyclo[2.2.1]heptyl) group, a bicyclo[1.1.1]pentyl group, a bicyclo[2.1.1]hexyl group, or a bicyclo[2.2.2]octyl group. The term "$C_3$-$C_{10}$ cycloalkylene group" as used herein refers to a divalent group having substantially the same structure as the $C_3$-$C_{10}$ cycloalkyl group.

The term "$C_1$-$C_{10}$ heterocycloalkyl group" as used herein refers to a monovalent cyclic group including at least one heteroatom other than carbon atoms as a ring-forming atom and having 1 to 10 carbon atoms. Non-limiting examples thereof include a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having substantially the same structure as the $C_1$-$C_{10}$ heterocycloalkyl group.

The term "$C_3$-$C_{10}$ cycloalkenyl group" as used herein refers to a monovalent cyclic group that has 3 to 10 carbon atoms and at least one carbon-carbon double bond in its ring, and is not aromatic. Non-limiting examples thereof include a cyclopentenyl group, a cyclohexenyl group, and a cycloheptenyl group. The term "$C_3$-$C_{10}$ cycloalkenylene group" as used herein refers to a divalent group having substantially the same structure as the $C_3$-$C_{10}$ cycloalkenyl group.

The term "$C_1$-$C_{10}$ heterocycloalkenyl group" as used herein refers to a monovalent cyclic group including at least one heteroatom other than carbon atoms as a ring-forming atom, 1 to 10 carbon atoms, and at least one double bond in its ring. Non-limiting examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein refers to a divalent group having substantially the same structure as the $C_1$-$C_{10}$ heterocycloalkyl group.

The term "$C_6$-$C_{60}$ aryl group" as used herein refers to a monovalent group having a carbocyclic aromatic system having 6 to 60 carbon atoms. The term "$C_6$-$C_{60}$ arylene group" as used herein refers to a divalent group having a carbocyclic aromatic system having 6 to 60 carbon atoms. Non-limiting examples of the $C_6$-$C_{60}$ aryl group include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each independently include two or more rings, the respective rings may be fused.

The term "$C_1$-$C_{60}$ heteroaryl group" as used herein refers to a monovalent group having a heterocyclic aromatic system further including at least one heteroatom other than carbon atoms as a ring-forming atom and 1 to 60 carbon atoms. The term "$C_1$-$C_{60}$ heteroarylene group" as used herein refers to a divalent group having a heterocyclic aromatic system further including at least one heteroatom other than carbon atoms as a ring-forming atom and 1 to 60 carbon atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each independently include two or more rings, the respective rings may be fused.

The term "monovalent non-aromatic condensed polycyclic group" as used herein refers to a monovalent group that has two or more rings condensed and only carbon atoms as ring forming atoms (e.g., 8 to 60 carbon atoms), wherein the entire molecular structure is non-aromatic (e.g., when considered as a whole it is not aromatic). Non-limiting examples of the monovalent non-aromatic condensed polycyclic group include an indenyl group, a fluorenyl group, a spirobifluorenyl group, a benzofluorenyl group, an indenophenanthrenyl group, and an indenoanthracenyl group. The term "divalent non-aromatic condensed polycyclic group" as used herein refers to a divalent group having substantially the same structure as the monovalent non-aromatic condensed polycyclic group.

The term "monovalent non-aromatic condensed heteropolycyclic group" as used herein refers to a monovalent group that has two or more condensed rings and at least one heteroatom other than carbon atoms (e.g., 1 to 60 carbon atoms), as a ring-forming atom, wherein the entire molecular structure is non-aromatic (e.g., when considered as a whole it is not aromatic). Examples of the monovalent non-aromatic condensed heteropolycyclic group include a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzooxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic condensed heteropolycyclic group" as used herein refers to a divalent group having substantially the same structure as the monovalent non-aromatic condensed heteropolycyclic group.

The term "$C_6$-$C_{60}$ aryloxy group" as used herein is represented by $-OA_{102}$ (wherein $A_{102}$ is a $C_6$-$C_{60}$ aryl group). The term "$C_6$-$C_{60}$ arylthio group" as used herein is represented by $-SA_{103}$ (wherein $A_{103}$ is a $C_6$-$C_{60}$ aryl group).

The term "$R_{10a}$" as used herein may be:
deuterium (-D), —F, —Cl, —Br, —I, a hydroxyl group, a cyano group, or a nitro group;
a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, $-Si(Q_{11})(Q_{12})(Q_{13})$, $-N(Q_{11})(Q_{12})$, $-B(Q_{11})(Q_{12})$, $-C(=O)(Q_{11})$, $-S(=O)_2(Q_{11})$, $-P(=O)(Q_{11})(Q_{12})$, or any combination thereof;
a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, $-Si(Q_{21})(Q_{22})(Q_{23})$, $-N(Q_{21})(Q_{22})$, $-B(Q_{21})(Q_{22})$, $-C(=O)(Q_{21})$, $-S(=O)_2(Q_{21})$, $-P(=O)(Q_{21})(Q_{22})$, or any combination thereof; or $-Si(Q_{31})(Q_{32})(Q_{33})$, $-N(Q_{31})(Q_{32})$, $-B(Q_{31})(Q_{32})$, $-C(=O)(Q_{31})$, $-S(=O)_2(Q_{31})$, or $-P(=O)(Q_{31})(Q_{32})$.

$Q_1$ to $Q_3$, $Q_{11}$ to $Q_{13}$, $Q_{21}$ to $Q_{23}$, and $Q_{31}$ to $Q_{33}$ may each independently be hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

The term "heteroatom" as used herein refers to any atom other than a carbon atom. Non-limiting examples of the heteroatom include O, S, N, P, Si, B, Ge, Se, or any combination thereof.

"Ph" used herein represents a phenyl group, "Me" used herein represents a methyl group, "Et" used herein represents an ethyl group, "ter-Bu" or "Bu$^t$" used herein represents a tert-butyl group, and "OMe" used herein represents a methoxy group.

The term "biphenyl group" as used herein refers to a phenyl group substituted with at least one phenyl group. The "biphenyl group" may be considered as "a substituted phenyl group" having a "$C_6$-$C_{60}$ aryl group" as a substituent.

The term "terphenyl group" as used herein refers to a phenyl group substituted with at least one biphenyl group. The "terphenyl group" may be considered as "a substituted phenyl group" having a "$C_6$-$C_{60}$ aryl group substituted with a $C_6$-$C_{60}$ aryl group" as a substituent.

The symbols * and *' as used herein, unless defined otherwise, refer to a binding site to an adjacent atom in a corresponding formula.

Hereinafter, a light-emitting device according to one or more embodiments will be described in more detail with reference to Examples.

EXAMPLES

Example 1

As a substrate and an anode, a first glass substrate of 15 Ohms per square centimeter ($\Omega/cm^2$) having ITO formed thereon (a Corning substrate with ITO formed thereon, 100 Å), a second glass substrate having Ag formed thereon (1,000 Å), and a third glass substrate of 15 $\Omega/cm^2$ having ITO formed thereon (a Corning substrate with ITO formed thereon, 100 Å) were each cut to a size of 50 millimeters (mm)×50 mm×0.7 mm, ultrasonically cleaned using isopropyl alcohol and pure water for 5 minutes each, and then irradiated with UV light for 30 minutes and exposed to ozone to clean. Subsequently, the first to third glass substrates were sequentially stacked on a vacuum-deposition apparatus.

Compound 1 was deposited on the anode to a thickness of 20 Å to form a hole transfer layer, and HT3 and HAT-CN were deposited on the hole transfer layer at a weight ratio of 9:1 to form a hole injection layer having a thickness of 100 Å.

TCTA (100 Å) and NPB (100 Å) were sequentially deposited on the hole injection layer to form a hole transport layer.

m-MTDATA (100 Å) was deposited on the hole transport layer as a first hole transporting (HT)-auxiliary layer, ADN and DPAVBi (a content of DPAVBi: 5 wt %) were co-deposited thereon as a first emission layer to a thickness of 200 Å, BAlq (50 Å) was deposited thereon as a first buffer layer, and ET1 was deposited thereon as a first electron transport layer to a thickness of 200 Å to form an electron transport region, thereby forming a first emission unit.

BCP and Li (a content of Li: 1 wt %) were co-deposited on the first emission unit to a thickness of 100 Å to form an n-type charge generation layer, and HT3 and HAT-CN were co-deposited on the n-type charge generation layer at a weight ratio of 9:1 to form a p-type charge generation layer having a thickness of 100 Å, thereby forming a first charge generation layer.

Here, a difference in LUMO energy level between the first electron transport layer and the n-type charge generation layer was 0.15 eV.

HT3 (190 Å) was deposited on the first charge generation layer as a second hole transporting (HT)-auxiliary layer, ADN and DPAVBi (a content of DPAVBi: 5 wt %) were co-deposited thereon as a second emission layer to a thickness of 200 Å, BAlq (50 Å) was deposited thereon as a second buffer layer, and ET1 was deposited thereon as a second electron transport layer to a thickness of 200 Å to form an electron transport region, thereby forming a second emission unit.

BCP and Li (a content of Li: 1 wt %) were co-deposited on the second emission unit to a thickness of 100 Å to form an n-type charge generation layer, and HT3 and HAT-CN at a weight ratio of 9:1 were co-deposited on the n-type charge generation layer to form a p-type charge generation layer having a thickness of 100 Å, thereby forming a second charge generation layer.

HT3 was deposited on the second charge generation layer as a third hole transporting (HT)-auxiliary layer to a thickness of 190 Å, ADN and DPAVBi (a content of DPAVBi: 5 wt %) were co-deposited thereon as a third emission layer to a thickness of 200 Å, and BAlq (50 Å) was deposited thereon as a third buffer layer, thereby forming a third emission unit.

ET1 was deposited on the third emission unit to form a third electron transport layer having a thickness of 50 Å, and Yb (13 Å) was deposited thereon as an electron injection layer, thereby forming an electron transport region.

AgMg (100 Å) was co-deposited on the electron transport region at a weight ratio of 10:1 to form a cathode, and CP1 (700 Å) was deposited on the cathode, thereby completing the manufacture of a light-emitting device.

Here, the triplet energy level of the third buffer layer was −2.8 eV, and the triplet energy level of ADN included in the third emission layer was −3.1 eV.

Also, the LUMO energy level of the third emission layer was −2.55 eV, and the LUMO energy level of the third electron transport layer was −2.77 eV.

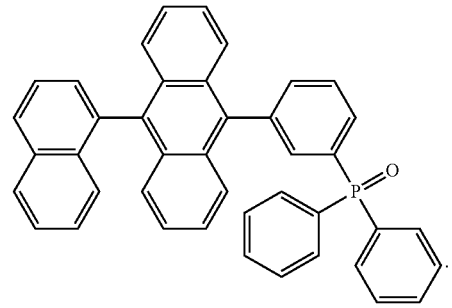

1

Comparative Example 1

A light-emitting device was manufactured in substantially the same manner as in Example 1, except that a hole injection layer was formed on an anode without forming a hole transfer layer on the anode.

Example 2

A light-emitting device was manufactured in substantially the same manner as in Example 1, except that Compound 49 was used instead of Compound 1.

Example 3

A light-emitting device was manufactured in substantially the same manner as in Example 1, except that Compound 37 was used instead of Compound 1.

Example 4

A light-emitting device was manufactured in substantially the same manner as in Example 1, except that Compound C1 was used instead of ADN.

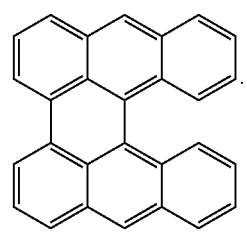

Compound C1

Comparative Example 2

A light-emitting device was manufactured in substantially the same manner as in Comparative Example 1, except that Compound C1 was used instead of ADN.

Example 5

A light-emitting device was manufactured in substantially the same manner as in Example 2, except that Compound C1 was used instead of ADN.

Example 6

A light-emitting device was manufactured in substantially the same manner as in Example 3, except that Compound C1 was used instead of ADN.

Comparative Example 3

A light-emitting device was manufactured in substantially the same manner as in Example 1, except that a hole transfer layer was not formed on an anode, a hole injection layer was formed on the anode, and Compound 1 was deposited to a thickness of 20 Å between the first charge generation layer and the second hole transporting (HT)-auxiliary layer to form a hole transfer layer.

Comparative Example 4

A light-emitting device was manufactured in substantially the same manner as in Comparative Example 3, except that Comparative Compound 49 was used instead of Compound 1.

Comparative Example 5

A light-emitting device was manufactured in substantially the same manner as in Comparative Example 3, except that Comparative Compound 37 was used instead of Compound 1.

Comparative Example 6

A light-emitting device was manufactured in substantially the same manner as in Comparative Example 3, except that Compound C1 was used instead of ADN.

Comparative Example 7

A light-emitting device was manufactured in substantially the same manner as in Comparative Example 4, except that Compound C1 was used instead of ADN.

Comparative Example 8

A light-emitting device was manufactured in substantially the same manner as in Comparative Example 5, except that Compound C1 was used instead of ADN.

Comparative Example 9

A light-emitting device was manufactured in substantially the same manner as in Example 1, except that a hole transfer layer was not formed on an anode, a hole injection layer was formed on the anode, and Compound 1 was deposited to a thickness of 20 Å between the second charge generation layer and the third hole transporting (HT)-auxiliary layer to form a hole transfer layer.

Comparative Example 10

A light-emitting device was manufactured in substantially the same manner as in Comparative Example 9, except that Comparative Compound 49 was used instead of Compound 1.

Comparative Example 11

A light-emitting device was manufactured in substantially the same manner as in Comparative Example 9, except that Comparative Compound 37 was used instead of Compound 1.

Comparative Example 12

A light-emitting device was manufactured in substantially the same manner as in Comparative Example 9, except that Compound C1 was used instead of ADN.

Comparative Example 13

A light-emitting device was manufactured in substantially the same manner as in Comparative Example 10, except that Compound C1 was used instead of ADN.

Comparative Example 14

A light-emitting device was manufactured in substantially the same manner as in Comparative Example 11, except that Compound C1 was used instead of ADN.

Evaluation Example 1

A color luminance meter and Keithley source-measure unit were used to measure the driving voltage (V) and efficiency (Cd/A) of the light-emitting devices manufactured in Examples 1 to 6 and Comparative Examples 1 to 14 at a luminance of 2,000 nit. The results are shown in Table 1.

TABLE 1

|  | Driving voltage (V) | Efficiency (cd/A) | Luminance (nit) |
| --- | --- | --- | --- |
| Example 1 | 10.5 | 27.4 | 2000 |
| Example 2 | 10.4 | 27.3 | 2000 |
| Example 3 | 10.6 | 27.5 | 2000 |
| Comparative Example 1 | 10.2 | 25.4 | 2000 |
| Example 4 | 10.8 | 27.1 | 2000 |
| Example 5 | 10.9 | 26.8 | 2000 |
| Example 6 | 10.7 | 27.8 | 2000 |
| Comparative Example 2 | 10.5 | 24.4 | 2000 |
| Comparative Example 3 | 12.3 | 23.2 | 900 |
| Comparative Example 4 | 13.4 | 22.1 | 1200 |
| Comparative Example 5 | 12.6 | 22.4 | 1300 |
| Comparative Example 6 | 11.9 | 23.1 | 1100 |
| Comparative Example 7 | 11.7 | 23.2 | 1300 |
| Comparative Example 8 | 12.7 | 22.4 | 1200 |

TABLE 1-continued

|  | Driving voltage (V) | Efficiency (cd/A) | Luminance (nit) |
|---|---|---|---|
| Comparative Example 9 | 12.5 | 23.1 | 900 |
| Comparative Example 10 | 13.1 | 23.8 | 1300 |
| Comparative Example 11 | 12.8 | 22.6 | 1200 |
| Comparative Example 12 | 12.0 | 22.5 | 1100 |
| Comparative Example 13 | 12.1 | 21.6 | 1500 |
| Comparative Example 14 | 12.5 | 22.9 | 1100 |

Referring to the results of Table 1, when a hole transfer layer including (e.g., consisting of) an electron transport material is adjacent to an anode, hole injection characteristics may be improved. Thus, a substantially equal level of driving voltage characteristics and excellent efficiency characteristics may be achieved, as compared with the Comparative Examples.

In contrast, when the hole transfer layer is not formed in the emission unit adjacent to an anode, but in an emission unit not adjacent to the anode, the driving voltage is not sufficiently lowered, and the efficiency is deteriorated, as compared with the device of the Examples.

Evaluation Example 2

The lifespan ($T_{97}$) of each of the light-emitting devices manufactured in Examples 1 to 6 and Comparative Examples 1 and 2 was measured at a luminance of 4,000 nit using a lifespan measuring apparatus at fixed current and room temperature. The results thereof are shown in Table 2. The lifespan of each of the light-emitting devices of Examples 1 to 3 and Comparative Example 1 was measured (normalized) with respect to 100% of the lifespan of Comparative Example 1 (e.g., as a baseline). The lifespan of each of the light-emitting devices of Examples 4 to 6 and Comparative Example 2 was measured (normalized) with respect to 100% lifespan of Comparative Example 2 (e.g., as a baseline).

TABLE 2

|  | Lifespan | Conditions (Lifespan measurement @ luminance) |
|---|---|---|
| Example 1 | 100% | T97@4,000 nit |
| Example 2 | 100% | T97@4,000 nit |
| Example 3 | 100% | T97@4,000 nit |
| Comparative Example 1 | 100% | T97@4,000 nit |
| Example 4 | 100% | T97@4,000 nit |
| Example 5 | 100% | T97@4,000 nit |
| Example 6 | 100% | T97@4,000 nit |
| Comparative Example 2 | 100% | T97@4,000 nit |

Referring to the results of Table 2, although the light-emitting device according to one or more embodiments further includes an additional hole transfer layer, the lifespan thereof may be substantially equal to that of the light-emitting device of the Comparative Examples. These results show that hole injection from the hole transport layer to the emission layer is stabilized.

Evaluation Example 3

The transient electroluminescences of the light-emitting device of Examples 1 to 6 and Comparative Examples 1 and 2 were measured using a Transient EL apparatus, a ratio of fluorescence to delayed fluorescence in a darkroom at room temperature was measured, and the results thereof are shown in Table 3.

TABLE 3

|  | Delayed fluorescence (DF, %) | Fluorescence (F, %) |
|---|---|---|
| Example 1 | 29.8 | 70.2 |
| Example 2 | 31.2 | 68.8 |
| Example 3 | 31.8 | 68.2 |
| Comparative Example 1 | 26.3 | 73.7 |
| Example 4 | 30.5 | 69.5 |
| Example 5 | 30.1 | 69.9 |
| Example 6 | 29.6 | 70.4 |
| Comparative Example 2 | 25.8 | 74.2 |

Referring to the results of Table 3, delayed fluorescence was effectively generated in the light-emitting devices of Examples 1 to 6. By using a single material in the hole transport layer, hole injection was increased, thereby increasing triplet-triplet annihilation (TTA) and thus resulting in improved efficiency.

As apparent from the foregoing description, the organic light-emitting device may have a low driving voltage, improved efficiency, and/or long lifespan.

As used herein, the terms "substantially," "about," and similar terms are used as terms of approximation and not as terms of degree, and are intended to account for the inherent deviations in measured or calculated values that would be recognized by those of ordinary skill in the art.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

It should be understood that the embodiments described herein should be considered in a descriptive sense only and not for purposes of limitation. Descriptions of features or aspects within each embodiment should typically be considered as being available for other similar features or aspects in other embodiments. While one or more embodiments have been described with reference to the drawings, it will be understood by those of ordinary skill in the art that various changes in form and details may be made therein without departing from the spirit and scope as defined by the following claims and equivalents thereof.

What is claimed is:
1. A light-emitting device comprising:
a first electrode;
a second electrode facing the first electrode;
m emission units located between the first electrode and the second electrode; and m−1 charge generation layer(s), each located between two adjacent emission units among the m emission units, and comprising m−1 n-type charge generation layer(s) and m−1 p-type charge generation layer(s), wherein m is an integer of 2 or greater, the m emission units each comprise a hole transport region, an emission layer, and an electron transport region, which are sequentially arranged, a first hole transport region in a first emission unit closest among the m emission units to the first electrode comprises a hole transfer layer and at least one of a hole injection layer or a hole transport layer, which are sequentially arranged between the first electrode and a first emission layer in the first emission unit, the hole transfer layer is a single layer consisting of an electron-transporting compound, the electron-transporting compound comprises a phosphine oxide group (P=O), a phosphine sulfide group (P=S), a π electron-deficient nitrogen-containing $C_1$-$C_{60}$ cyclic group, or any combination thereof, and a highest occupied molecular orbital (HOMO) energy level of the hole transfer layer is about −6.0 electron volts (eV) to about −5.3 eV.

2. The light-emitting device of claim 1, wherein m is an integer of 3 or greater.

3. The light-emitting device of claim 1, wherein the electron-transporting compound is represented by Formula 1 or Formula 2:

$$[Ar_1]_{a1}\text{-}[(L_1)_{b1}\text{-}R_1]_{c1} \qquad \text{Formula 1}$$

$$[Ar_2]_{a2}\text{-}[(L_2)_{b2}\text{-}R_2]_{c2}, \text{ and} \qquad \text{Formula 2}$$

wherein, in Formulae 1 and 2, $Ar_1$, $Ar_2$, $L_1$, and $L_2$ are each independently a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, a1 and a2 are each independently 1, 2, or 3, b1 and b2 are each independently 0, 1, 2, 3, 4, or 5, $R_1$ and $R_2$ are each independently a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_1$)($Q_2$)($Q_3$), —C(=O)($Q_1$), —S(=O)$_2$($Q_1$), —P(=O)($Q_1$)($Q_2$), or —P(=S)($Q_1$)($Q_2$), c1 and c2 are each independently 1, 2, 3, 4, or 5, at least one of $Ar_1$, $L_1$, or $R_1$ is independently a π electron-deficient nitrogen-containing $C_1$-$C_{60}$ cyclic group unsubstituted or substituted with at least one $R_{10a}$, and at least one $R_2$ group is —P(=O)($Q_1$)($Q_2$) or —P(=S)($Q_1$)($Q_2$), wherein $R_{10a}$ is deuterium (-D), —F, —$C_1$, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$)

$Q_1$ to $Q_3$, $Q_{11}$ to $Q_{13}$, $Q_{21}$ to $Q_{23}$, and $Q_{31}$ to $Q_{33}$ may each independently be hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

4. The light-emitting device of claim 3, wherein at least one of $Ar_1$, $L_1$, or $R_1$ is independently selected from:

a pyridine group, a pyrimidine group, a pyrazine group, a pyridazine group, and a triazine group; and a pyridine group, a pyrimidine group, a pyrazine group, a pyridazine group, and a triazine group, each substituted with at least one $R_{10a}$.

5. The light-emitting device of claim 3, wherein at least one of $Ar_2$, $L_2$, or $R_2$ is independently a π electron-rich $C_3$-$C_{60}$ cyclic group unsubstituted or substituted with at least one $R_{10a}$.

6. The light-emitting device of claim 1, wherein a difference between a HOMO energy level of the hole transfer layer and a HOMO energy level of the hole injection layer or hole transport layer adjacent to the hole transfer layer, is 0.15 eV or greater.

7. The light-emitting device of claim 1, wherein the first emission layer comprises a compound represented by Formula 3:

$$[Ar_3]_{a3}\text{-}[(L_3)_{b3}\text{-}R_3]_{c3}, \text{ and} \qquad \text{Formula 3}$$

wherein, in Formula 3, $Ar_3$ and $L_3$ are each independently a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, a3 is 1, 2, or 3, b3 is an integer from 0 to 5, $R_3$ is hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), wherein $Q_1$ to $Q_3$ are each independently hydrogen; deuterium; —F; —$C_1$; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group: or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof, c3 is an integer from 1 to 5, and at least one of $Ar_3$, $L_3$, or $R_3$ is independently a $C_3$-$C_{60}$ carbocyclic group unsubstituted or substituted with at least one $R_{10a}$, wherein $R_{10a}$ is:

deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_1$), —S(=O)$_2$($Q_{11}$), —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), and wherein $Q_{11}$ to $Q_{13}$, $Q_{21}$ to $Q_{23}$, and $Q_{31}$ to $Q_{33}$ may each independently be hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

8. The light-emitting device of claim 1, wherein the first emission unit further comprises an electron blocking layer between the hole injection layer or the hole transport layer and the first emission layer.

9. The light-emitting device of claim 8, wherein the electron blocking layer comprises a material having a higher triplet energy level than a triplet energy level of a compound comprised in the first emission layer.

10. The light-emitting device of claim 1, wherein m−1 hole transport region(s), excluding the first hole transport region in the first emission unit, do not comprise a hole transfer layer.

11. The light-emitting device of claim 1, wherein m−1 hole transport region(s), excluding the first hole transport region in the first emission unit, each independently comprise a hole injection layer, a hole transport layer, an electron blocking layer, or any combination thereof, and the m electron transport regions each independently comprise a hole blocking layer, an electron transport layer, an electron injection layer, a buffer layer, or any combination thereof.

12. The light-emitting device of claim 1, wherein the m emission units are to emit blue light having a maximum emission wavelength of about 440 nanometers (nm) to about 510 nm.

13. The light-emitting device of claim 1, wherein m emission layers comprised in the m emission units each independently comprise a phosphorescent dopant, a fluorescent dopant, a delayed fluorescence material, or any combination thereof.

14. The light-emitting device of claim 1, wherein a ratio of a delayed fluorescence component to a sum of a fluorescence component and a delayed fluorescence component from measurement of transient electroluminescence (EL) of the light-emitting device is 30 percent (%) or higher.

15. The light-emitting device of claim 1, wherein the first electrode has a work function of about −5.2 eV to about −4.8 eV.

16. The light-emitting device of claim 1, further comprising a first capping layer outside the first electrode and a second capping layer outside the second electrode, wherein at least one of the first capping layer or the second capping layer comprises a material having a refractive index of 1.6 or higher at a wavelength of 589 nm.

17. An electronic apparatus comprising the light-emitting device of claim 1.

18. The electronic apparatus of claim 17, wherein a color-coordinate measured at a front viewing angle of the electronic apparatus is about 0.09 to about 0.15.

19. The electronic apparatus of claim 17, further comprising: an encapsulation unit on the light-emitting device; and a functional layer on the encapsulation unit, wherein the functional layer comprises a touchscreen layer, a polarization layer, a color filter, a color-conversion layer, or any combination thereof.

20. The electronic apparatus of claim 17, comprising quantum dots or an optical member comprising the quantum dots, located on at least one traveling direction of light emitted from the light-emitting device.

* * * * *